(12) United States Patent
Send et al.

(10) Patent No.: US 9,865,823 B2
(45) Date of Patent: *Jan. 9, 2018

(54) QUINOLINIUM DYES WITH FLUORINATED COUNTER ANION FOR DYE SENSITIZED SOLAR CELLS

(71) Applicant: BASF SE, Ludwigshafen (DE)

(72) Inventors: Robert Send, Karlsruhe (DE); Ingmar Bruder, Mutterstadt (DE); Peter Erk, Frankenthal (DE); Ruediger Sens, Ludwigshafen (DE); Hiroshi Yamamoto, Takarazuka (JP); Hitoshi Yamato, Takarazuki (JP); Shinji Nakamichi, Osaka (JP); Ryuichi Takahashi, Kobe (JP)

(73) Assignee: BASF SE, Ludwigshafen (DE)

( * ) Notice: Subject to any disclaimer, the term of this patent is extended or adjusted under 35 U.S.C. 154(b) by 156 days.

This patent is subject to a terminal disclaimer.

(21) Appl. No.: 14/385,638

(22) PCT Filed: Mar. 27, 2013

(86) PCT No.: PCT/EP2013/056461

§ 371 (c)(1),
(2) Date: Sep. 16, 2014

(87) PCT Pub. No.: WO2013/144177

PCT Pub. Date: Oct. 3, 2013

(65) Prior Publication Data

US 2015/0108415 A1    Apr. 23, 2015

Related U.S. Application Data

(60) Provisional application No. 61/617,685, filed on Mar. 30, 2012.

(30) Foreign Application Priority Data

Mar. 30, 2012 (EP) .................................. 12162526

(51) Int. Cl.
| | | |
|---|---|---|
| *H01L 31/04* | (2014.01) | |
| *H01B 1/12* | (2006.01) | |
| *H01L 51/00* | (2006.01) | |
| *C09B 23/01* | (2006.01) | |
| *C09B 23/10* | (2006.01) | |
| *C09B 23/14* | (2006.01) | |
| *C09B 57/00* | (2006.01) | |
| *C09B 69/06* | (2006.01) | |
| *C09K 11/06* | (2006.01) | |
| *H01G 9/20* | (2006.01) | |

(52) U.S. Cl.
CPC ...... *H01L 51/0072* (2013.01); *C09B 23/0091* (2013.01); *C09B 23/105* (2013.01); *C09B 23/148* (2013.01); *C09B 57/008* (2013.01); *C09B 69/06* (2013.01); *C09K 11/06* (2013.01); *H01G 9/2059* (2013.01); *H01L 51/0059* (2013.01); *H01L 51/0064* (2013.01); *C09K 2211/1014* (2013.01); *C09K 2211/1018* (2013.01); *H01G 9/2031* (2013.01); *Y02E 10/542* (2013.01); *Y02E 10/549* (2013.01)

(58) Field of Classification Search
CPC ........... H01B 1/00–1/04; H01M 14/00; H01M 4/386; H01M 4/625; H01M 4/134; H01M 4/366; H01L 51/0064; H01L 51/0059; H01L 51/0067; Y02E 10/542; Y02E 10/549; Y02E 10/52
USPC .......... 252/500–518.1; 136/252, 263; 257/40
See application file for complete search history.

(56) References Cited

U.S. PATENT DOCUMENTS

| 8,723,017 | B2 * | 5/2014 | Kunimoto | ............ | H01G 9/2059 |
|---|---|---|---|---|---|
| | | | | | 136/252 |
| 2010/0263139 | A1 * | 10/2010 | Daubresse | ............ | A61K 8/4926 |
| | | | | | 8/426 |
| 2011/0061723 | A1 * | 3/2011 | Kunimoto | ............ | H01G 9/2059 |
| | | | | | 136/252 |
| 2012/0145238 | A1 | 6/2012 | Tanabe et al. | | |

FOREIGN PATENT DOCUMENTS

| CN | 1534021 | A | | 10/2004 | | |
|---|---|---|---|---|---|---|
| EP | 1 990 373 | A1 | | 11/2008 | | |
| JP | 1089305 | A2 | * | 4/2001 | ........... | H01G 9/2013 |
| JP | 2004-22222 | A | | 1/2004 | | |
| JP | 2005-82678 | A | | 3/2005 | | |
| JP | 2006-294360 | A | | 10/2006 | | |
| JP | 2006294360 | | * | 10/2006 | ............ | H01M 14/00 |
| WO | WO 2009/109499 | A1 | | 9/2009 | | |
| WO | WO 2011/026797 | A | | 3/2011 | | |
| WO | WO 2011/120908 | A1 | | 10/2011 | | |

OTHER PUBLICATIONS

Wonneberger, et al. Send, et al.
International Search Report dated Jun. 6, 2013 in PCT/EP2013/056461.
Daibin Kuang et al., "High-Efficiency and Stable Mesoscopic Dye-Sensitized Solar Cells Based on a High Molar Extinction Coefficient Ruthenium Sensitizer and Nonvolatile Electrolyte", Advanced Materials, 2007, 19, pp. 1133-1137.
D. R. Bragg et al., "Condensation of Ethyl 2- and 4-Pyridylacetate with Aromatic Carbonyl Compounds", J. Chem. Soc. Part IV, 1961, pp. 5074-5077 and cover page.
S. K. Chatterji et al., "Agents Acting on the Central Nervous System: Part XI—Synthesis of Methyl 3-Phenyl-2-(2- & 4-pyridyl & piperidyl)-propionates & Propanols", Indian J. Chem., 6, 1968, pp. 235-238.
Amaresh Mishra et al., "Synthesis, Spectroscopic and Electrochemical Investigation of Some new Stilbazolium dyes", Dyes and Pigments, 58, 2003, pp. 227-237.

* cited by examiner

*Primary Examiner* — Tri V Nguyen
(74) *Attorney, Agent, or Firm* — Oblon, McClelland, Maier & Neustadt, L.L.P.

(57) ABSTRACT

The present invention relates to an electrode layer comprising a porous film made of oxide semiconductor fine particles sensitized with a quinolinium dye having a fluorinated counteranion. Moreover the present invention relates to a photoelectric conversion device comprising said electrode layer, a dye sensitized solar cell comprising said photoelectric conversion device and to novel quinolinium dyes having a fluorinated counteranion.

23 Claims, No Drawings

QUINOLINIUM DYES WITH FLUORINATED COUNTER ANION FOR DYE SENSITIZED SOLAR CELLS

The present invention relates to an electrode layer comprising a porous film made of oxide semiconductor fine particles sensitized with a quinolinium dye having a fluorinated counter anion. Moreover the present invention relates to a photoelectric conversion device comprising said electrode layer, a dye sensitized solar cell comprising said photoelectric conversion device and to novel quinolinium dyes having a fluorinated counter anion.

Dye-sensitized photoelectric conversion elements (dye sensitized solar cells, DSC) have attracted much attention in recent years. They have several advantages compared to silicon-based solar cells such as lower production and material costs because an inexpensive metal oxide semiconductor such as titanium dioxide can be used therefore without purification to a high purity. Other advantages include their flexibility, transparency and light weight. The overall performance of a photoelectric conversion device is characterized by several parameters such as the open circuit voltage ($V_{oc}$), the short circuit current ($I_{sc}$), the fill factor (FF) and the energy conversion efficiency ($\eta$) resulting therefrom. Thus, one approach to improve the energy conversion efficiency is to enhance the open circuit voltage and/or the short circuit current of the photoelectric conversion device by optimizing the dye used in the DSC.

The dyes have to meet several requirements among these are the stability, production costs and absorption properties, for example, the dye should absorb incident light of longer wavelength with a high absorption coefficient. Promising organic dyes used as sensitizers in DSCs are donor-π-acceptor systems, composed of donor, π-conjugated spacer, and acceptor/anchoring groups. However, the performance of these dyes is not always satisfactory.

CN 1534021 discloses photoelectric conversion devices comprising some methine dyes.

WO 2011/026797 and WO 2011/120908 relate to a dye sensitised solar cells (DSC) wherein the dye is a methine dye with a pyridinium acceptor group.

WO 2009/109499 relates to a photoelectric conversion element where the dye is a methine dye with a pyridinium, quinolium or isoquinolinium acceptor group, the spacer connecting the donor and the acceptor group being an ethylene group carrying an electron withdrawing group.

JP 2006-294360 relates to a photoelectric conversion element where the dye is a methine dye of the formula (1)

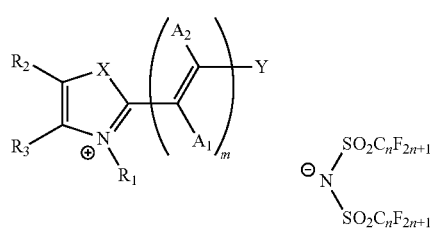

(1)

where m and n represent integers, $R_1$ represents an aromatic residual group, aliphatic hydrocarbon residual group or acyl group, $R_2$, $R_3$, $A_1$ and $A_2$ represent an aromatic residual group, aliphatic hydrocarbon residual group, hydroxyl group, phosphoric acid group, cyano group, hydrogen atom, halogen atom, nitro group, carboxyl group, carbamoyl group, alkoxycarbonyl group, arylcarbonyl group, or acyl group. $R_2$ and $R_3$ may be joined together to form ring. X represents O, S, Se, $CH_2$, N—$R_4$, $CR_5R_6$ or —$CR_7$=$CR_8$—, $R_4$ represents an aromatic residual group, aliphatic hydrocarbon residual group or acyl group, $R_5$, $R_6$, $R_7$ and $R_8$ represent an aromatic residual group, aliphatic hydrocarbon residual group, hydroxyl group or the like, and Y represents an aromatic residual group or an organometallic complex residual group.

EP 1 990 373 relates to a photoelectric conversion device comprising a methine dye, in which a quinolinium acceptor group can be bonded to an ethylene group and the donor group is a di(optionally substituted fluorenyl)aminophenyl. The anionic counterion is i.a. bistrifluoromethylsulfonimide, $C(SO_2CF_3)_3^-$, $SbF_6^-$, $BF_4^-$ or $PF_6^-$.

There is still an ongoing need to further improve the performance of dye-sensitized photoelectric conversion devices, in particular their energy conversion efficiency $\eta$.

It is therefore the object of the present invention to provide an electrode layer sensitized with a dye, a photoelectric conversion device having an enhanced energy conversion efficiency $\eta$, a solar cell comprising the device and new dyes.

Surprisingly, methine dyes with a quinolinium or isoquinolinium acceptor group and a fluorinated counter anion are particularly advantageous. They have excellent overall properties; in particular they have a particularly good dye absorption property on the electrode, giving high long-term DSC stability, high long-term performance and high energy conversion efficiency.

Therefore, in a first aspect, the present invention relates to an electrode layer comprising a porous film made of oxide semiconductor fine particles sensitized with a dye of formula (I),

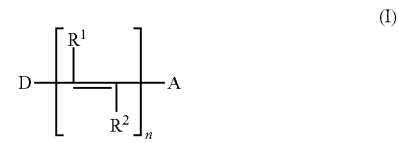

(I)

where n is 1, 2, 3, 4, 5 or 6;

$R^1$ and $R^2$ are independently of each other selected from hydrogen, $C_1$-$C_{20}$-alkyl wherein alkyl is uninterrupted or interrupted by O, S, CO, $NR^{14}$ or combinations thereof, $C_6$-$C_{20}$-aryl, heteroaryl and $C_6$-$C_{20}$-aryl which carries 1, 2 or 3 substituents selected from $C_1$-$C_8$-alkyl; or $R^1$ can additionally be a radical of formula D;

each D is independently selected from a radical of formulae D.1 and D.2

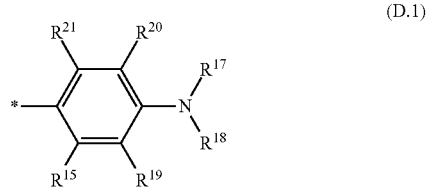

(D.1)

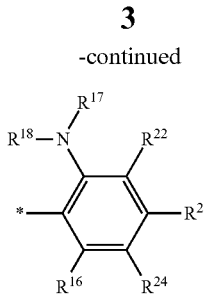

where
* denotes the bond to the remaining compound of formula I
$R^{17}$ and $R^{18}$ are independently of each other selected from unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof, where
$R^{14}$ is hydrogen, $C_1$-$C_{20}$-alkyl or $C_6$-$C_{10}$-aryl;
or
$R^{17}$ and $R^{18}$ form together with the nitrogen atom to which they are attached an unsubstituted or substituted 5-, 6- or 7-membered ring,
or
$R^{17}$ and $R^{20}$ form together with the nitrogen atom to which $R^{17}$ is attached and the carbon atoms of the benzene ring to which $R^{20}$ and N—$R^{17}$ are attached an unsubstituted or substituted 5-, 6- or 7-membered ring;
or
$R^{17}$ and $R^{22}$ form together with the nitrogen atom to which $R^{17}$ is attached and the carbon atoms of the benzene ring to which $R^{22}$ and N—$R^{17}$ are attached an unsubstituted or substituted 5-, 6- or 7-membered ring;
and/or $R^{18}$ and $R^{19}$ form with the nitrogen atom to which $R^{18}$ is attached and the carbon atoms of the benzene ring to which $R^{19}$ and N—$R^{18}$ are attached an unsubstituted or substituted 5-, 6- or 7-membered ring;
$R^{15}$, $R^{16}$, $R^{19}$, $R^{20}$, $R^{21}$, $R^{22}$, $R^{23}$ and $R^{24}$ are independently of each other selected from the group consisting of hydrogen, $NR^{25}R^{26}$, $OR^{25}$, $SR^{25}$, $NR^{25}$—$NR^{26}R^{27}$, $NR^{25}$—$OR^{26}$, O—CO—$R^{25}$, O—CO—$OR^{25}$, O—CO—$NR^{25}R^{26}$, $NR^{25}$—CO—$R^{26}$, $NR^{25}$—CO—$OR^{26}$, $NR^{25}$—CO—$NR^{26}R^{27}$, CO—$R^{25}$, CO—$OR^{25}$, CO—$NR^{25}R^{26}$, S—CO—$R^{25}$, CO—$SR^{25}$, CO—$NR^{25}$—$NR^{26}R^{27}$, CO—$NR^{25}$—$OR^{26}$, CO—O—CO—$R^{25}$, CO—O—CO—$OR^{25}$, CO—O—CO—$NR^{25}R^{26}$, CO—$NR^{25}$—CO—$R^{26}$, CO—$NR^{25}$—CO—$OR^{26}$, unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

$R^{25}$, $R^{26}$ and $R^{27}$ are independently of each other selected from hydrogen, unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

A is a radical of formulae A.1, A.2, A.3, A.4 or A.5

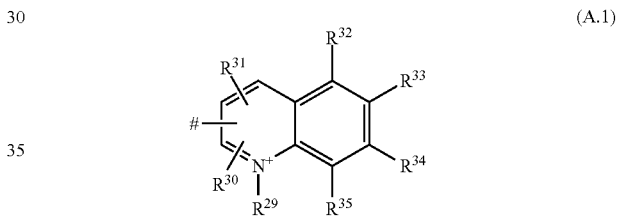

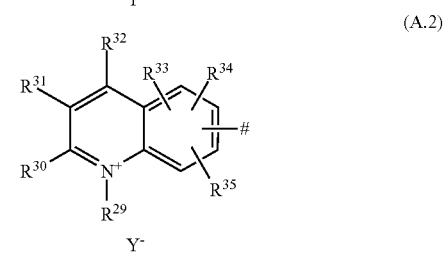

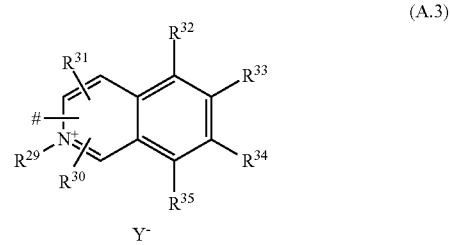

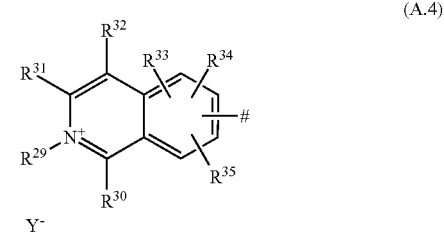

-continued (A.5)

where
\# denotes the bond to the remaining compound of formula I $R^{29}$, $R^{30}$, $R^{31}$, $R^{32}$, $R^{33}$, $R^{34}$ and $R^{35}$ are independently of each other selected from a radical G, hydrogen, halogen, $OR^{36}$, unsubstituted or substituted unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_5$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

with the proviso that at least one of the radicals $R^{29}$, $R^{30}$, $R^{31}$, $R^{32}$, $R^{33}$, $R^{34}$ and $R^{35}$ is a radical G, where $R^{36}$ is unsubstituted or substituted $C_1$-$C_{20}$-alkyl, unsubstituted or substituted $C_6$-$C_{20}$-aryl, unsubstituted or substituted heteroaryl, wherein alkyl is uninterrupted or interrupted by O, S, CO, $NR^{14}$ or combinations thereof;

G is selected from —$R^{28}$—COOH, —$R^{28}$—COO$^-$Z$^+$, —$R^{28}$—CO(C=O)OH, —$R^{28}$—CO(C=O)O$^-$Z$^+$, —$R^{28}$—S(=O)$_2$OH, —$R^{28}$—S(=O)$_2$O$^-$Z$^+$, —$R^2$—O—S(=O)$_2$OH, —$R^{28}$—O—S(=O)$_2$O$^-$Z$^+$, —$R^{28}$—P(=O)(OH)$_2$, —$R^{28}$—P(=O)(O$^-$Z$^+$)$_2$, —$R^{28}$—P(=O)(OH)(O$^-$Z$^+$), —$R^{28}$—O—P(=O)(OH)$_2$, —$R^{28}$—O—P(=O)(O$^-$Z$^+$)$_2$, —$R^{28}$—O—P(=O)(OH)(O$^-$Z$^+$), —$R^{28}$—CO—NH—OH, —$R^{28}$—S(=O)$_2$NH—OH, —$R^{28}$—$NR^{14}$—S(=O)$_2$OH and —$R^{28}$—$NR^{14}$—S(=O)$_2$O$^-$Z$^+$;

where $R^{28}$ is a direct bond, $C_1$-$C_{20}$-alkylene, $C_2$-$C_4$-alkenylene or $C_6$-$C_{10}$-arylene;

Z$^+$ is an organic or inorganic cation equivalent;

Y$^-$ is $BF_4^-$, $PF_6^-$, $SbF_6^-$, $AsF_6^-$ or a fluorinated organic anion selected from the groups Y.1, Y.2, Y.3, Y.4, Y.5 and Y.6;

(Y.1)

(Y.2)

(Y.3)

(Y.4)

(Y.5)

(Y.6)

wherein
X$^-$ is S(=O)$_2$O—, O—S(=O)$_2$O—, COO—, $$-\overset{O}{\underset{Rg}{\overset{\|}{P}}}-O^- \quad \text{or} \quad -O-\overset{O}{\underset{Rg}{\overset{\|}{P}}}-O^-;$$

Rf$^1$ is halogen, unsubstituted or substituted $C_1$-$C_{20}$-alkyl, unsubstituted or substituted haloalkyl, unsubstituted or substituted $C_2$-$C_{20}$-alkenyl, unsubstituted or substituted haloalkenyl, unsubstituted or substituted $C_2$-$C_{20}$-alkynyl, unsubstituted or substituted haloalkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, haloalkyl, alkenyl, haloalkenyl, alkynyl, haloalkynyl or the aliphatic moieties in aralkyl, aralkenyl or aralkynyl are uninterrupted or interrupted by O, S, CO, $NR^{14}$ or combinations thereof, Rf$^2$, Rf$^3$, Rf$^4$, Rf$^5$ and Rf$^6$ are independently selected from halogen, hydrogen, NR$^{25}$R$^{26}$, OR$^{25}$, SR$^{25}$, NR$^{25}$—NR$^{26}$R$^{27}$, NR$^{25}$—OR$^{26}$, O—CO—R$^{25}$, O—CO—OR$^{25}$, O—CO—NR$^{25}$R$^{26}$, NR$^{25}$—CO—R$^{26}$, NR$^{25}$—CO—OR$^{26}$, NR$^{25}$—CO—NR$^{26}$R$^{27}$, CO—R$^{25}$, CO—OR$^{25}$, CO—NR$^{25}$R$^{26}$, S—CO—R$^{25}$, CO—SR$^{25}$, CO—NR$^{25}$—NR$^{26}$R$^{27}$, CO—NR$^{25}$—OR$^{26}$, CO—O—CO—R$^{25}$, CO—O—CO—OR$^{25}$, CO—O—CO—NR$^{25}$R$^{26}$, CO—NR$^{25}$—CO—R$^{26}$, CO—NR$^{25}$13 CO—NR$^{25}$—CO—OR$^{26}$, unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_6$-$C_{20}$ aryl, unsubstituted or substituted heteroaryl, unsubstituted or substituted heterocyclyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

with the proviso that at least one of the radicals $Rf^2$, $Rf^3$, $Rf^4$, $Rf^5$ and $Rf^6$ is fluorine or $C_1$-$C_{20}$-fluoroalkyl, wherein fluoroalkyl is uninterrupted or interrupted by O, S, $NR^{14}$, CO, or combinations thereof;

$X^1$, $X^2$ and $X^3$ are independently of each other selected from $S(=O)_2$ and CO;

$Rf^7$, $Rf^{7*}$, $Rf^8$, $Rf^{8*}$ and $Rf^9$ are independently of each other selected from unsubstituted or substituted $C_1$-$C_{20}$-fluoroalkyl, $C_6$-$C_{20}$-fluoroaryl, wherein fluoroalkyl is uninterrupted or interrupted by O, S, $NR^{14}$, CO, or combinations thereof; or $Rf^7$ and $Rf^8$ together are $C_3$-$C_6$-fluoroalkyl;

$Rf^{10}$, $Rf^{11}$, $Rf^{12}$ and $Rf^{13}$ are independently of each other selected from fluorine, $C_1$-$C_{20}$-fluoroalkyl and $C_6$-$C_{20}$-fluoroaryl;

$Rf^{14}$ and $Rf^{15}$ together are $C_3$-$C_7$-fluoroalkyl which is unsubstituted or substituted by $C_1$-$C_6$-fluoroalkyl;

Rg is unsubstituted or substituted $C_1$-$C_{20}$-alkyl, unsubstituted or substituted $C_1$-$C_{20}$-alkoxy, unsubstituted or substituted $C_6$-$C_{20}$-aryl or unsubstituted or substituted $C_6$-$C_{20}$aryl-O—, wherein alkyl and the alkyl moiety in alkoxy is uninterrupted or interrupted by O, S, $NR^{14}$, CO, or combinations thereof;

with the proviso that if $R^{17}$ and $R^{18}$ are both unsubstituted or substituted fluorene, $Y^-$ is not bistrifluoromethylsulfonimide, $C(SO_2CF_3)_3^-$, hexafluoride antimonate, $BF_4^-$ or $PF_6^-$; and with the proviso that if A is a radical of the formula A.1.1c

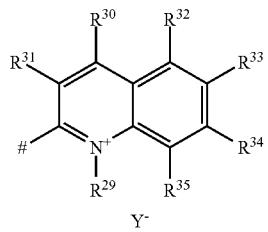

(A.1.1c)

$Y^-$ is not $(C_nF_{2n+1}SO_2)_2N^-$, where n is an integer from 1 to 18.

The invention moreover relates to a photoelectric conversion device comprising the electrode layer as defined above. A further aspect of the present invention is the methine dye of the formula I, except for compounds, if $R^{17}$ and $R^{18}$ are both unsubstituted or substituted fluorene, $Y^-$ is not bistrifluoromethylsulfonimide, $C(SO_2CF_3)_3^-$, hexafluoride antimonate, $BF_4^-$ or $PF_6^-$; and except for compounds, if A is a radical of the formula A.1.1c

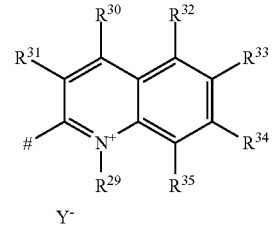

(A.1.1c)

$Y^-$ is not $(C_nF_{2n+1}SO_2)_2N^-$, where n is an integer from 1 to 18 as defined above.

The invention also relates to the use of compounds of formula I in a photoelectric conversion device.

The electrode layer and the devices of the present invention are associated with several advantages. For instance, the quinolinium dyes with fluorinated counter anion allow for high $V_{OC}$, $J_{SC}$ and high FF that feature excellent energy conversion efficiencies η and are highly suitable for being used in solar cells.

When a denotation (e.g. D or G) occurs more than once (e.g. twice) in a compound, this denotation may be different groups or the same group unless otherwise stated.

The term "halogen" designates in each case, fluorine, bromine, chlorine or iodine, specifically fluorine.

The prefix $C_n$-$C_m$— indicates the respective number of carbons in the hydrocarbon unit.

In the context of the present invention, the term "alkyl" comprises straight-chain or branched alkyl groups having usually 1 to 20 carbon atoms. Examples of alkyl groups are especially methyl, ethyl, n-propyl, isopropyl, n-butyl, isobutyl, sec-butyl, tert-butyl, n-pentyl, neo-pentyl, n-hexyl, n-heptyl, n-octyl, n-nonyl, n-decyl, n-undecyl, n-dodecyl, n-tridecyl, n-tetradecyl, n-hexadecyl, n-octadecyl and n-eicosyl. The expression alkyl also comprises alkyl radicals whose carbon chains may be interrupted by one or more, e.g. 1, 2, 3, 4, 5 or 6 groups which are selected from —O—, —S—, —$NR^{14}$— and/or —C(=O)—, unless otherwise stated. $R^{14}$ preferably is hydrogen or $C_1$-$C_{20}$-alkyl. It is to be understood that alkyl interrupted by —O—, —S—, —$NR^{14}$— and/or —C(=O)— or combinations thereof comprises at least 2 carbon atoms.

Substituted alkyl groups may, depending on the length of the alkyl chain, have one or more (e.g. 1, 2, 3, 4, 5 or more than 5) identical or different substituents. Suitable substituents are e.g. $C_4$-$C_{20}$-cycloalkyl, $C_5$-$C_{20}$-cycloalkenyl, $C_6$-$C_{20}$-cycloalkynyl, heterocyclyl, halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$ and $S(=O)_2O^-Z^+$, where $R^{25}$, $R^{26}$, $Z^+$ are as defined above.

The above remarks regarding alkyl also apply to the alkyl moiety in alkoxy. The term "$C_1$-$C_{20}$-haloalkyl" as used herein, which is also expressed as "$C_1$-$C_{20}$-alkyl which is halogenated", refers to straight-chain or branched alkyl groups having 1 to 2 ("$C_1$-$C_2$-haloalkyl"), 1 to 4("$C_1$-$C_4$-haloalkyl"), 1 to 6 ("$C_1$-$C_6$-haloalkyl"), 1 to 8 ("$C_1$-$C_8$-haloalkyl"), 1 to 10 ("$C_1$-$C_{10}$-haloalkyl"), 1 to 12 ("$C_1$-$C_{12}$-haloalkyl"), 1 to 20 carbon atoms ("$C_1$-$C_{20}$-haloalkyl") (as mentioned above), where some or all of the hydrogen atoms in these groups are replaced by halogen atoms as mentioned above: in particular $C_1$-$C_2$-haloalkyl, such as chloromethyl, bromomethyl, dichloromethyl, trichloromethyl, fluoromethyl, difluoromethyl, trifluoromethyl, chlorofluoromethyl, dichlorofluoromethyl, chlorodifluoromethyl, 1-chloroethyl, 1-bromoethyl, 1-fluoroethyl, 2-fluoroethyl, 2,2-difluoroethyl, 2,2,2-trifluoroethyl, 2-chloro-2-fluoroethyl, 2-chloro-2,2-difluoroethyl, 2,2-dichloro-2-fluoroethyl, 2,2,2-trichloroethyl, pentafluoroethyl or 1,1,1-trifluoroprop-2-yl.

Substituted haloalkyl groups may have one or more (e.g. 1, 2, 3, 4, 5 or more than 5) substituents different from halogen, specially one or two substituents different from halogen. Suitable substituents are e.g. $C_4$-$C_{20}$-cycloalkyl, $C_5$-$C_{20}$-cycloalkenyl, $C_6$-$C_{20}$-cycloalkynyl, heterocyclyl, S—$R^{25}$, O—$R^{25}$, CO—O$R^{25}$, O—CO—$R^{25}$, N$R^{25}R^{26}$, CON$R^{25}R^{26}$, N$R^{25}$—CO—$R^{26}$, S(=O)$_2$O$R^{25}$ and S(=O)$_2$O$^-Z^+$, where $R^{25}$, $R^{26}$, $Z^+$ are as defined above.

The term "$C_1$-$C_{20}$-fluoroalkyl" is an alkyl radical having ordinarily 1 to 4, 1 to 6, 1 to 8, 1 to 10, 1 to 12, or 1 to 20 carbon atoms as mentioned above, whose hydrogen atoms are partly or completely replaced by fluorine. Examples are fluoromethyl, difluoromethyl, trifluoromethyl, 2-fluoroethyl, 2,2-difluoroethyl, 2,2,2,-trifluoroethyl, pentafluoroethyl, 2-fluoropropyl, 3-fluoropropyl, 2,2-difluoropropyl, 2,3-difluoropropyl, 3,3,3-trifluoropropyl, 2,2,3,3,3-pentafluoropropyl, heptafluoropropyl, 1-(fluoromethyl)-2-fluoroethyl, 4-fluorobutyl, nonafluorobutyl, 2-(fluoromethyl)-hexyl, 2,3-difluorononyl, 2,3,6-trifluoroundecyl and the like. Substituted fluoroalkyl groups may have one or more (e.g. 1, 2, 3, 4, 5 or more than 5) substituents different from fluorine, specially one or two substituents different from fluorine. Suitable substituents are e.g. $C_4$-$C_{20}$-cycloalkyl, $C_5$-$C_{20}$-cycloalkenyl, $C_6$-$C_{20}$-cycloalkynyl, heterocyclyl, S—$R^{25}$, O—$R^{25}$, CO—O$R^{25}$, O—CO—$R^{25}$, N$R^{25}R^{26}$, CON$R^{25}R^{26}$, N$R^{25}$—CO—$R^{26}$, S(=O)$_2$O$R^{25}$ and S(=O)$_2$O$^-Z^+$, where $R^{25}$, $R^{26}$, $Z^+$ are as defined above.

The term "alkenyl" comprises straight-chain or branched hydrocarbon radicals having two or more C atoms, e.g. 2 to 4, 2 to 6 or 2 to 12 or 2 to 20 carbon atoms and having at least one double bond, e.g. one or two, preferably having one double bond in any position. Examples are $C_2$-$C_6$-alkenyl such as ethenyl (vinyl), 1-propenyl, 2-propenyl, 1-methylethenyl, 1-butenyl, 2-butenyl, 3-butenyl, 1-methyl-1-propenyl, 2-methyl-1-propenyl, 1-methyl-2-propenyl, 2-methyl-2-propenyl, 1-pentenyl, 2-pentenyl, 3-pentenyl, 4-pentenyl, 1-methyl-1-butenyl, 2-methyl-1-butenyl, 3-methyl-1-butenyl, 1-methyl-2-butenyl, 2-methyl-2-butenyl, 3-methyl-2-butenyl, 1-methyl-3-butenyl, 2-methyl-3-butenyl, 3-methyl-3-butenyl, 1,1-dimethyl-2-propenyl, 1,2-dimethyl-1-propenyl, 1,2-dimethyl-2-propenyl, 1-ethyl-1-propenyl, 1-ethyl-2-propenyl, 1-hexenyl, 2-hexenyl, 3-hexenyl, 4-hexenyl, 5-hexenyl, 1-methyl-1-pentenyl, 2-methyl-1-pentenyl, 3-methyl-1-pentenyl, 4-methyl-1-pentenyl, 1-methyl-2-pentenyl, 2-methyl-2-pentenyl, 3-methyl-2-pentenyl, 4-methyl-2-pentenyl, 1-methyl-3-pentenyl, 2-methyl-3-pentenyl, 3-methyl-3-pentenyl, 4-methyl-3-pentenyl, 1-methyl-4-pentenyl, 2-methyl-4-pentenyl, 3-methyl-4-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1,3-dimethyl-1-butenyl, 1,3-dimethyl-2-butenyl, 1,3-dimethyl-3-butenyl, 2,2-dimethyl-3-butenyl, 2,3-dimethyl-1-butenyl, 2,3-dimethyl-2-butenyl, 2,3-dimethyl-3-butenyl, 3,3-dimethyl-1-butenyl, 3,3-dimethyl-2-butenyl, 1-ethyl-1-butenyl, 1-ethyl-2-butenyl, 1-ethyl-3-butenyl, 2-ethyl-1-butenyl, 2-ethyl-2-butenyl, 2-ethyl-3-butenyl, 1,1,2-trimethyl-2-propenyl, 1-ethyl-1-methyl-2-propenyl, 1-ethyl-2-methyl-1-propenyl, 1-ethyl-2-methyl-2-propenyl. The expression alkenyl also comprises alkenyl radicals whose carbon chains may be interrupted by one or more, e.g. 1, 2, 3, 4, 5 or 6 groups which are selected from —O—, —S—, —N$R^{14}$— and/or —C(=O)—, unless otherwise stated. $R^{14}$ preferably is hydrogen or $C_1$-$C_{20}$-alkyl. It is to be understood that alkenyl interrupted by —O—, —S—, —N$R^{14}$— and/or —C(=O)— or combinations thereof comprises at least 3 carbon atoms. Substituted alkenyl groups may, depending on the length of the alkenyl chain, have one or more (e.g. 1, 2, 3, 4, 5 or more than 5) identical or different substituents. Suitable substituents are e.g. $C_4$-$C_{20}$-cycloalkyl, $C_5$-$C_{20}$-cycloalkenyl, $C_6$-$C_{20}$-cycloalkynyl, heterocyclyl, halogen, S—$R^{25}$, O—$R^{25}$, CO—O$R^{25}$, O—CO—$R^{25}$, N$R^{25}R^{26}$, CON$R^{25}R^{26}$, N$R^{25}$—CO—$R^{26}$, S(=O)$_2$O$R^{25}$ and S(=O)$_2$O$^-Z^+$, where $R^{25}$, $R^{26}$, $Z^+$ are as defined above.

The term "alkynyl" comprises straight-chain or branched hydrocarbon radicals having two or more C atoms, e.g. 2 to 4, 2 to 6 or 2 to 12 or 2 to 20 carbon atoms and having at least one triple bond, e.g. one or two, preferably having one triple bond in any position, e.g. $C_2$-$C_6$-alkynyl such as ethynyl, 1-propynyl, 2-propynyl, 1-butynyl, 2-butynyl, 3-butynyl, 1-methyl-2-propynyl, 1-pentynyl, 2-pentynyl, 3-pentynyl, 4-pentynyl, 1-methyl-2-butynyl, 1-methyl-3-butynyl, 2-methyl-3-butynyl, 3-methyl-1-butynyl, 1,1-dimethyl-2-propynyl, 1-ethyl-2-propynyl, 1-hexynyl, 2-hexynyl, 3-hexynyl, 4-hexynyl, 5-hexynyl, 1-methyl-2-pentynyl, 1-methyl-3-pentynyl, 1-methyl-4-pentynyl, 2-methyl-3-pentynyl, 2-methyl-4-pentynyl, 3-methyl-1-pentynyl, 3-methyl-4-pentynyl, 4-methyl-1-pentynyl, 4-methyl-2-pentynyl, 1,1-dimethyl-2-butynyl, 1,1-dimethyl-3-butynyl, 1,2-dimethyl-3-butynyl, 2,2-dimethyl-3-butynyl, 3,3-dimethyl-1-butynyl, 1-ethyl-2-butynyl, 1-ethyl-3-butynyl, 2-ethyl-3-butynyl, 1-ethyl-1-methyl-2-propynyl. The expression alkynyl also comprises alkynyl radicals whose carbon chains may be interrupted by one or more, e.g. 1, 2, 3, 4, 5 or 6 groups which are selected from —O—, —S—, —N$R^{14}$— and/or —C(=O)—, unless otherwise stated. $R^{14}$ preferably is hydrogen or $C_1$-$C_{20}$-alkyl. It is to be understood that alkynyl interrupted by —O—, —S—, —N$R^{14}$— and/or —C(=O)— or combinations thereof comprises at least 3 carbon atoms. Substituted alkynyl groups may, depending on the length of the alkynyl chain, have one or more (e.g. 1, 2, 3, 4, 5 or more than 5) identical or different substituents. Suitable substituents are e.g. $C_4$-$C_{20}$-cycloalkyl, $C_5$-$C_{20}$-cycloalkenyl, $C_6$-$C_{20}$-cycloalkynyl, heterocyclyl, halogen, S—$R^{25}$, O—$R^{25}$, CO—O$R^{25}$, O—CO—$R^{25}$, N$R^{25}R^{26}$, CON$R^{25}R^{26}$, N$R^{25}$—CO—$R^{26}$, S(=O)$_2$O$R^{25}$ and S(=O)$_2$O$^-Z^+$, where $R^{25}$, $R^{26}$, $Z^+$ are as defined above.

The term "$C_1$-$C_{20}$-alkylene" (or alkanediyl) refers to an alkyl radical having 1 to 20 carbon atoms as defined above, wherein one hydrogen atom of the alkyl radical is replaced by one further binding site, thus forming a bivalent radical. The hydrogen atom is not removed from the carbon atom carrying a binding site. Examples include methylene, ethylene, propylene (trimethylene), isopropylene, n-butylene (tetramethylene), sec-butylene, isobutylene, tert-butylene, 2-ethylbutylene, n-pentylene (pentamethylene), isopentylene, 1-methylpentylene, 1,3-dimethylbutylene, n-hexylene, 1-methylhexylene, n-heptylene, 2-methylheptylene, 1,1,3,3-tetramethylbutylene, 1-methylheptylene, 3-methylheptylene, n-octylene, 2-ethylhexylene, 1,1,3-trimethylhexylene, 1,1,3,3-tetramethylpentylene, nonylene, decylene, undecylene, 1-methylundecylene or dodecylene.

The term "$C_1$-$C_{20}$-alkylidene" refers to an alkyl radical having 1 to 20 carbon atoms as defined above, wherein one hydrogen atom of the alkyl radical is replaced by one further binding site, thus forming a bivalent radical. The hydrogen atom is removed from the carbon atom carrying a binding site. Accordingly, the free valences are part of a double bond.

The term "$C_2$-$C_4$-alkenylene" (or alkenediyl) as used herein in each case denotes a straight-chain or branched alkenyl radical having 2 to 4 carbon atoms as defined above, wherein one hydrogen atom at any position of the carbon backbone is replaced by one further binding site, thus forming a bivalent moiety. Examples include vinylene, propenylene, but-1-enylene or but-2-enylene.

The term "$C_6$-$C_{10}$-arylene" refers to an aryl group as defined below, wherein one hydrogen atom at any position of the aryl group is replaced by one further binding site, thus forming a bivalent radical. In case of polycyclic arylene, the bonding sites are either situated in the same ring or in different rings. Examples of arylene are phenylene such as 1,2-phenylene, 1,3-phenylene or 1,4-phenylene or naphthylene.

The term "$C_7$-$C_{20}$-aralkyl" refers to aryl-substituted alkyl. The aralkyl group has 7 to 20 carbon atoms, wherein aryl is as defined below, preferably phenyl or naphthyl, the alkyl moiety preferably is $C_1$-$C_4$-alkyl as defined above. Examples are 1-naphthylmethyl, 2-naphthylmethyl, benzyl, diphenylmethyl, 1-phenylethyl, 2-phenylethyl, 1-phenylpropyl, 2-phenyl-propyl, 3-phenylpropyl, 1-methyl-1-phenylethyl, 4-phenylbutyl, 2,2-dimethyl-2-phenylethyl, especially benzyl.

The term "$C_8$-$C_{20}$-aralkenyl" refers to aryl-substituted alkenyl. The aralkenyl group has 8 to 20 carbon atoms, wherein aryl is as defined below, preferably phenyl or naphthyl, the alkenyl moiety preferably is $C_2$-$C_4$-alkenyl. Examples are styryl(2-phenylvinyl), 2,2-diphenylvinyl, triphenylvinyl, cinnamyl, 1-naphthylvinyl, 2-naphthylvinyl and fluoren-9-ylidenmethyl, especially 2,2-diphenylvinyl and triphenylvinyl.

The term "fluoren-9-ylidenemethyl" is

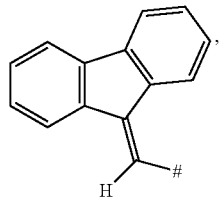

where # means the point of attachment tot he remainder of the molecule.

The term "$C_8$-$C_{20}$-aralkynyl" refers to aryl-substituted alkynyl moieties. The aralkynyl group has 8 to 20 carbon atoms, wherein aryl preferably is phenyl or naphthyl, the alkynyl moiety preferably is C2-C4-alkynyl, e.g. 2-phenylethynyl.

The term "cycloalkyl" refers to a mono- or polycyclic, e.g. moncyclic, bicyclic or tricyclic, aliphatic radical having usually from 5 to 20, preferably 5 to 16, more preferably 3 to 12, or 3 to 8 carbon atoms. Examples of monocyclic rings are cyclopentyl, cyclohexyl, cycloheptyl or cyclooctyl, especially cyclopentyl and cyclohexyl. Examples of polycyclic rings are perhydroanthracyl, perhydronaphthyl, perhydrofluorenyl, perhydrochrysenyl, perhydropicenyl, adamantyl, bicyclo[1.1.1]pentyl, bicyclo[2.2.1]heptyl, bicyclo[4.2.2]decyl, bicyclo[2.2.2]octyl, bicyclo[3.3.0]octyl bicyclo[3.3.2]decyl, bicyclo[4.4.0]decyl, bicyclo[4.3.2] undecyl, bicyclo[4.3.3]dodecyl, bicyclo[3.3.3]undecyl, bicyclo[4.3.1]decyl, bicyclo[4.2.1]nonyl, bicyclo [3.3.1]nonyl, bicyclo[3.2.1]oc-tyl and the like. Cycloalkyl may be interrupted by one or more CO groups, usually one or two groups. An example for cycloalkyl interrupted by 1 CO group is 3-oxobicyclo[2.2.1] heptyl. Substituted cycloalkyl groups may have one or more (e.g. 1, 2, 3, 4, 5 or more than 5) identical or different substituents. Suitable substituents are e.g. halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$, $S(=O)_2O^-Z^+$, $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, heterocyclyl, $C_6$-$C_{20}$-aryl, substituted $C_6$-$C_{20}$-aryl, unsubstituted or substituted maleic anhydridyl and unsubstituted or substituted maleimidyl, where $R^{25}$, $R^{26}$ and $Z^+$ are as defined above.

The term "cycloalkenyl" refers to a mono- or polycyclic, e.g. monocyclic, bicyclic or tricyclic, aliphatic radical having usually from 5 to 20, preferably 5 to 16, more preferably 3 to 12, or 3 to 8 carbon atoms and at least one double bond, preferably one double bond at any position. Examples include cyclopentenyl, cyclohexenyl or the like. Cycloalkenyl may be interrupted by one or more CO groups, e.g. one or two CO groups. Substituted cycloalkenyl groups may have one or more (e.g. 1, 2, 3, 4, 5 or more than 5) identical or different substituents. Suitable substituents are e.g. halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$, $S(=O)_2O^-Z^+$, $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, heterocyclyl, $C_6$-$C_{20}$-aryl, substituted $C_6$-$C_{20}$-aryl, unsubstituted or substituted maleic anhydridyl and unsubstituted or substituted maleimidyl, where $R^{25}$, $R^{26}$ and $Z^+$ are as defined above.

The term "heterocyclyl" (also referred to as heterocycloalkyl) as used herein includes in general 3-, 4-, 5-, 6-, 7- or 8- membered, in particular 5-, 6-, 7- or 8-membered mono-cyclic heterocyclic non-aromatic radicals and 8-, 9- or 10-membered bicyclic heterocyclic non-aromatic radicals, the mono- and bicyclic non-aromatic radicals may be saturated or unsaturated. The mono- and bicyclic heterocyclic non-aromatic radicals usually comprise besides carbon atom ring members 1, 2, 3 or 4 heteroatoms, in particular 1 or 2 heteroatoms selected from N, O and S as ring members, where S-atoms as ring members may be present as S, SO or $SO_2$. Heterocycloalkyl may be interrupted by one or more CO groups, e.g. one or two CO groups. When heterocyclyl is substituted by one or more identical or different radicals, it is for example mono-, di-, tri-, tetra- or penta-substituted. Suitable substituents are e.g. halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$, $S(=O)_2O^-Z^+$, $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, heterocyclyl, $C_6$-$C_{20}$-aryl, substituted $C_6$-$C_{20}$-aryl, unsubstituted or substituted maleic anhydridyl and unsubstituted or substituted maleimidyl, where $R^{25}$, $R^{26}$ and $Z^+$ are as defined above.

Examples of saturated or unsaturated 3-, 4-, 5-, 6-, 7- or 8-membered heterocyclic radicals include saturated or unsaturated, non-aromatic heterocyclic rings, such as oxiranyl, oxetanyl, thietanyl, thietanyl-S-oxid (S oxothietanyl), thietanyl-S-dioxid (S-dioxothiethanyl), pyrrolidinyl, pyrazolinyl, imidazolinyl, pyrrolinyl, pyrazolinyl, imidazolinyl, tetrahydrofuranyl, dihydrofuranyl, 1,3-dioxolanyl, dioxolenyl, thiolanyl, S-oxothiolanyl, S-dioxothiolanyl, dihydrothienyl, S-oxodihydrothienyl, S-dioxodihydrothienyl, oxazolidinyl, isoxazolidinyl, oxazolinyl, isoxazolinyl, thiazolinyl, isothiazolinyl, thiazolidinyl, isothiazolidinyl, oxathiolanyl, piperidinyl, piperazinyl, pyranyl, dihydropyranyl, tetrahydropyranyl, 1,3- and 1,4-dioxanyl, thiopyranyl, S-oxothiopyranyl, S-dioxothiopyranyl, dihydrothiopyranyl, S-oxodihydrothiopyranyl, S-dioxodihydrothiopyranyl, tetrahydrothiopyranyl, S-oxotetrahydrothiopyranyl, S-dioxotetrahydrothiopyranyl, morpholinyl, thiomorpholinyl, S-oxothiomorpholinyl, S-dioxothiomorpholinyl, thiazinyl and the like. Examples of 5- to 6-membered heterocyclic radicals comprising a fused benzene ring include dihydroindolyl, dihydroindolizynyl, dihydroisoindolyl, dihydroquinolinyl, dihydroisoquinolinyl, chromenyl and chromanyl. Examples for heterocyclic radicals also comprising 1 or 2 carbonyl groups as ring members comprise pyrrolidin-2-onyl, pyrrolidin-2,5-dionyl, imidazolidin-2-onyl, oxazolidin-2-onyl, thiazolidin-2-onyl, 3-oxo-2-oxa-bicyclo[2.2.1] heptanyl and the like.

The term "$C_6$-$C_{20}$-aryl" refers to a mono-, bi- or tricyclic aromatic hydrocarbon radical having 6 to 20 carbon ring members such as phenyl, naphthyl, anthracenyl, phenanthrenyl, fluorenyl, pyrenyl, indenyl and the like, especially phenyl. Likewise preferably, $C_6$-$C_{20}$-aryl is naphthyl or pyrenyl. Substituted phenyl is substituted once, twice, three times, four times or five times. The substituents may be identical or different. Bi- or tricyclic aryl is usually substituted by 1, 2, 3, 4, 5, 6, 7 or 8 identical or different substituents, preferably 1, 2, 3 or 4. Suitable substituents include $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, halogen, S—$R^{14}$, O—$R^{14}$, CO—$OR^{14}$, O—CO—$R^{14}$, O—CO—$R^{14''}$, $NR^{14}R^{14'}$, $CONR^{14}R^{14'}$, $NR^{14}$—CO—$R^{14'}$, S(=O)$_2$$OR^{14}$ and S(=O)$_2$$O^-Z^+$, where $R^{14'}$ has one of the meanings given for $R^{14}$ and where $R^{14}$ is as defined above; and where $R^{14''}$ is $C_2$-$C_{20}$-alkyl which is interrupted by one or more, e.g., 2, 3, 4, 5, 6, 7, 8, 9, 10 or more than 10 oxygen atoms. If $C_2$-$C_{20}$ alkyl is interrupted by oxygen atom(s), the total sum of the chain members of $C_2$-$C_{20}$ alkyl interrupted by oxygen atom(s) equal the numbers of carbon and oxygen atoms present in the chain.

The term "$C_6$-$C_{20}$-fluoroaryl" refers to a mono-, bi- or tricyclic aromatic hydrocarbon radical having 6 to 20 carbon ring members such as phenyl, naphthyl, anthracenyl, phenanthrenyl, fluorenyl, pyrenyl, indenyl and the like, especially phenyl, wherein some or all of the hydrogen atoms in these groups are replaced by fluorine.

The term "heteroaryl" (also referred to as hetaryl) includes in general 5- or 6-membered unsaturated monocyclic heterocyclic radicals and 8-, 9- or 10-membered unsaturated bicyclic heterocyclic radicals which are aromatic, i.e. they comply with Hückel's rule (4n+2 rule). Hetaryl usually comprise besides carbon atom(s) as ring member(s) 1, 2, 3 or 4 heteroatoms selected from N, O and S as ring members. Examples of 5- or 6-membered heteroaromatic radicals include: 2-furyl, 3-furyl, 2-thienyl, 3-thienyl, 1-pyrrolyl, 2-pyrrolyl, 3-pyrrolyl, 1-pyrazolyl, 3-pyrazolyl, 4-pyrazolyl, 5-pyrazolyl, 2-oxazolyl, 4-oxazolyl, 5-oxazolyl, 2-thiazolyl, 4-thiazolyl, 5-thiazolyl, 3-isoxazolyl, 4-isoxazolyl or 5-isoxazolyl, 3-isothiazolyl, 4-isothiazolyl or 5-isothiazolyl, 1-imidazolyl, 2-imidazolyl, 4-imidazolyl, 2- or 5-[1,3,4] oxadiazolyl, 4- or 5-(1,2,3-oxadiazol)yl, 3- or 5-(1,2,4-oxadiazol)yl, 2- or 5-(1,3,4-thiadiazol)yl, 2- or 5-(1,3,4-thiadiazol)yl, 4- or 5-(1,2,3-thiadiazol)yl, 3- or 5-(1,2,4-thiadiazol)yl, 1H-, 2H- or 3H-1,2,3-triazol-4-yl, 1,3,4-triazol-2-yl,2H-triazol-3-yl, 1H-, 2H-, or 4H-1,2,4-triazolyl, 1H- or 2H-tetrazolyl 2-pyridinyl, 3-pyridinyl, 4-pyridinyl, 3-pyridazinyl, 4-pyridazinyl, 2-pyrimidinyl, 4-pyrimidinyl, 5-pyrimidinyl and 2-pyrazinyl. When heteroaryl is substituted by one or more identical or different radicals, it is for example mono-, di-, tri-, tetra- or penta-substituted.

The term "heteroaryl" also includes bicyclic 8- to 10-membered heteroaromatic radicals comprising as ring members 1, 2 or 3 heteroatoms selected from N, O and S, wherein a 5- or 6-membered heteroaromatic ring is fused to a phenyl ring or to a 5- or 6-membered heteroaromatic radical. Examples of a 5- or 6-membered heteroaromatic ring fused to a phenyl ring or to a 5- or 6-membered heteroaromatic radical include benzofuranyl, benzothienyl, indolyl, indazolyl, benzimidazolyl, benzoxathiazolyl, benzoxadiazolyl, benzothiadiazolyl, benzoxazinyl, chinolinyl, isochinolinyl, purinyl, 1,8-naphthyridyl, pteridyl, pyrido[3,2-d]pyrimidyl or pyridoimidazolyl and the like. These fused hetaryl radicals may be bonded to the remainder of the molecule via any ring atom of 5- or 6-membered heteroaromatic ring or via a carbon atom of the fused phenyl moiety.

The term "organic or inorganic cation equivalent" refers to a monovalent cation or that part of a polyvalent cation which corresponds to a single positive charge. The cation $Z^+$ serves merely as counter cation for balancing negatively charged substituent groups of the sulfonate group, and can in principle be chosen at will. Preference is therefore given to using alkali metal ions, in particular $Na^+$, $K^+$, or $Li^+$ ions, an equivalent of an earth alkaline metal cation, in particular magnesium ion equivalent (½ $Mg^{2+}$) or calcium ion equivalent (½ $Ca^{2+}$) or onium ions, e.g. ammonium, monoalkylammonium, dialkylammonium, trialkylammonium, tetraalkylammonium, phosphonium, tetraalkylphosphonium or tetraarylphosphonium ions.

The term "and/or" or "or/and" are meant to express that not only one of the defined alternatives (substituents) may be present, but also several of the defined alternatives (substituents) together, namely mixtures of different alternatives (substituents).

The term "at least" is meant to define one or more than one, for example one, two, three, preferably one to two.

The term "one or more identical or different radicals" is meant to define one, two, three, four, five, six, seven, eight or more than eight identical or different radicals.

The remarks made below as to preferred embodiments of the variables (substituents) and indices of the compounds of formula I are valid on their own as well as preferably in combination with each other.

The remarks made below concerning preferred embodiments of the variables (substituents) and indices further are valid concerning the electrode layer, devices and the use of the compound of the formula I according to the present invention.

A specific embodiment of the invention relates to an electrode layer sensitized with a compound of the formula I, photoelectric conversion elements comprising said electrode layer, compounds of the formula I and the use, where $R^{17}$ and $R^{18}$ are independently of each other selected from unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, NR$^{14}$ or combinations thereof, where R$^{14}$ is hydrogen, C$_1$-C$_{20}$-alkyl or C$_6$-C$_{10}$-aryl;

or

R$^{17}$ and R$^{18}$, R$^{17}$ and R$^{22}$, R$^{17}$ and R$^{20}$ and/or R$^{18}$ and R$^{19}$ form together an unsubstituted or substituted 5-, 6- or 7-membered ring.

A preferred embodiment of the invention relates to an electrode layer sensitized with a compound of the formula I, photoelectric conversion elements comprising said electrode layer, compounds of the formula I and the use, where in the compound of the formula I, D is the radical of the formulae D.1 and D.2,

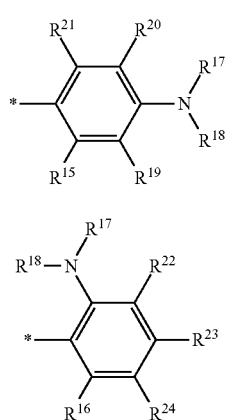

where

* denotes the point of attachment to the remainder of the molecule,

R$^{17}$ and R$^{18}$ are independently selected from C$_1$-C$_{20}$-alkyl, C$_2$-C$_{20}$-alkenyl, C$_2$-C$_{20}$-alkynyl, C$_6$-C$_{20}$-aryl, heteroaryl, heterocyclyl, C$_7$-C$_{20}$-aralkyl, C$_8$-C$_{20}$-aralkenyl, C$_8$-C$_{20}$-aralkynyl, C$_4$-C$_{20}$-cycloalkyl, C$_5$-C$_{20}$-cycloalkenyl, C$_6$-C$_{20}$-cycloalkynyl, wherein alkyl, alkenyl, alkynyl or the aliphatic moieties in aralkyl, aralkenyl or aralkynyl are uninterrupted or interrupted by O, S, NR$^{14}$ or combinations thereof and/or may carry one or more substituents selected from C$_4$-C$_{20}$-cycloalkyl, C$_5$-C$_{20}$-cycloalkenyl, C$_6$-C$_{20}$-cycloalkynyl, heterocyclyl, halogen, S—R$^{25}$, O—R$^{25}$, CO—OR$^{25}$, O—CO—R$^{25}$, NR$^{25}$R$^{26}$, CONR$^{25}$R$^{26}$, NR$^{25}$—CO—R$^{26}$, S(=O)$_2$OR$^{25}$ and S(=O)$_2$O$^-$Z$^+$ and wherein aryl, the aryl moiety of aralkyl, aralkenyl, or aralkynyl, heteroaryl, heterocyclyl, cycloalkyl, cycloalkenyl or cycloalkynyl are unsubstituted or may carry one or more substituents selected from halogen, S—R$^{25}$, O—R$^{25}$, CO—OR$^{25}$, O—CO—R$^{25}$, NR$^{25}$R$^{26}$, CONR$^{25}$R$^{26}$, NR$^{25}$—CO—R$^{26}$, S(=O)$_2$OR$^{25}$, S(=O)$_2$ O$^-$Z$^+$, C$_1$-C$_{20}$-alkyl, C$_2$-C$_{20}$-alkenyl, C$_2$-C$_{20}$-alkynyl, C$_7$-C$_{20}$-aralkyl, C$_8$-C$_{20}$-aralkenyl, C$_8$-C$_{20}$-aralkynyl, C$_4$-C$_{20}$-cycloalkyl, C$_5$-C$_{20}$-cycloalkenyl, C$_6$-C$_{20}$-cycloalkynyl, heterocyclyl, C$_6$-C$_{20}$-aryl, C$_6$-C$_{20}$-aryl which carries one or more substituents selected from C$_1$-C$_{20}$-alkyl and OR$^{25}$, maleic anhydridyl and maleimidyl, wherein the 2 last mentioned radicals are unsubstituted or may carry substituents selected from C$_1$-C$_{20}$-alkyl, C$_6$-C$_{20}$-aryl and phenyl-NR$^{25}$R$^{26}$;

or

R$^{17}$ and R$^{18}$ may form together with the nitrogen atom to which they are attached a 5-, 6- or 7-membered, saturated or unsaturated heterocycle which may have 1 or 2 further heteroatoms selected from O, S and N as ring members and wherein the heterocycle is unsubstituted or may carry one or more substituents R$^{x1}$, where each R$^{x1}$ is selected from C$_1$-C$_{20}$-alkyl which is unsubstituted or may carry one or more substituents R$^{x2}$ and phenyl, which is unsubstituted or may carry one or more substituents R$^{x3}$, in addition two radicals R$^{x1}$ bonded to adjacent carbon atoms may form together with the carbon atoms to which they are bonded a 4-, 5-, 6- or 7-membered saturated or unsaturated carbocyclic ring or an aromatic ring selected from benzene, naphthalene, anthracene and 9H-fluorene, where the carbocyclic and the aromatic ring are unsubstituted or carry one or more substituents R$^{x3}$, and/or two radicals Rx$^1$ present on the same carbon atom may be C$_1$-C$_{20}$-alkylidene which is unsubstituted or carry one or more substituents R$^{x2}$, where R$^{x2}$ is selected from halogen, S—R$^{25}$, O—R$^{25}$, CO—OR$^{25}$, O—CO—R$^{25}$, NR$^{25}$R$^{26}$, CONR$^{25}$R$^{26}$, NR$^{25}$—CO—R$^{26}$, S(=O)$_2$OR$^{25}$ and S(=O)$_2$O$^-$Z$^+$, R$^{x3}$ is selected from C$_1$-C$_{10}$-alkyl, fluoren-9-ylidenemethyl, halogen, S—R$^{25}$, O—R$^{25}$, CO—OR$^{25}$, O—CO—R$^{25}$, NR$^{25}$R$^{26}$, CONR$^{25}$R$^{26}$, NR$^{25}$—CO—R$^{26}$, S(=O)$_2$OR$^{25}$ and S(=O)$_2$O$^-$Z$^+$;

or

R$^{17}$ and R$^{20}$ may form together with the nitrogen atom to which R$^{17}$ is attached and the carbon atoms of the benzene ring to which R$^{20}$ and N—R$^{17}$ are attached an unsubstituted or substituted 5-, 6- or 7-membered ring which may have 1 or 2 further heteroatoms selected from O, S and N as ring members and wherein the heterocycle is unsubstituted or may carry one or more substituents R$^{x4}$;

or,

R$^{17}$ and R$^{22}$ may form together with the nitrogen atom to which R$^{17}$ is attached and the carbon atoms of the benzene ring to which R$^{22}$ and N—R$^{17}$ are attached an unsubstituted or substituted 5-, 6- or 7-membered ring, which may have 1 or 2 further heteroatoms selected from O, S and N as ring members and wherein the heterocycle is unsubstituted or may carry one or more substituents R$^{x4}$;

and/or

R$^{18}$ and R$^{19}$ may form with the nitrogen atom to which R$^{18}$ is attached and the carbon atoms of the benzene ring to which R$^{19}$ and N—R$^{18}$ are attached an unsubstituted or substituted 5-, 6- or 7-membered ring which may have 1 or 2 further heteroatoms selected from O, S and N as ring members and wherein the heterocycle is unsubstituted or may carry one or more substituents R$^{x4}$;

where each R$^{x4}$ is selected from C$_1$-C$_{20}$-alkyl which is unsubstituted or may carry one or more substituents R$^{x6}$ and phenyl, which is unsubstituted or carry one or more substituents R$^{x6}$, in addition two radicals $R^{x4}$ bonded to adjacent carbon atoms may form together with the carbon atoms to which they are bonded a 4-, 5-, 6- or 7-membered saturated or unsaturated carbocyclic ring or an aromatic ring selected from benzene, naphthalene, anthracene and 9H-fluorene, where the carbocyclic or the aromatic ring are unsubstituted or may carry one or more substituents $R^{x6}$, and/or two radicals $R^{x4}$ present on the same C atom may be $C_1$-$C_{20}$-alkylidene which is unsubstituted or carry one or more substituents $R^{x5}$;

where each $R^{x5}$ has one of the meanings given for $R^{x2}$, and
each $R^{x6}$ has one of the meaning given for $R^{x3}$ and where in addition two radicals $R^{x6}$ bonded to adjacent carbon atoms may form together with the carbon atoms to which they are bonded a benzene or naphthalene ring;

$R^{15}$, $R^{16}$, $R^{19}$, $R^{20}$, $R^{21}$, $R^{22}$, $R^{23}$ and $R^{24}$ are independently selected from hydrogen, $NR^{25}R^{26}$, $OR^{25}$, $SR^{25}$, $NR^{25}$—$NR^{26}R^{27}$, $NR^{25}$—$OR^{26}$, O—CO—$R^{25}$, O—CO—$OR^{25}$, O—CO—$NR^{25}R^{26}$, $NR^{25}$—CO—$R^{26}$, $NR^{26}$—CO—$OR^{26}$, $NR^{25}$—CO—$NR^{26}R^{27}$, CO—$R^{25}$, CO—$OR^{25}$, CO—$NR^{25}R^{26}$, CO—$SR^{25}$, CO—$NR^{25}$—$NR^{26}R^{27}$, CO—$NR^{25}$—$OR^{26}$, CO—O—CO—$R^{25}$, CO—O—CO—$OR^{25}$, CO—O—CO—$NR^{25}R^{26}$, CO—$NR^{25}$—CO—$R^{26}$, CO—$NR^{25}$—CO—$OR^{26}$, $C_1$-$C_{20}$-alkyl, $C_2$-$C_{20}$-alkenyl, $C_2$-$C_{20}$-alkynyl, $C_6$-$C_{20}$-aryl, heteroaryl, heterocyclyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl and $C_6$-$C_{20}$cycloalkynyl, wherein alkyl is uninterrupted or interrupted by O, S, $NR^{14}$ or combinations thereof, and wherein alkyl, the alkyl moiety of aralkyl, alkenyl, the alkenyl moiety of aralkenyl, alkynyl and the alkynyl moiety of aralkynyl may carry substituents selected from $C_4$-$C_{20}$-cycloalkyl, halogen, S—$R^{14}$, O—$R^{14}$, CO—$OR^{14}$, O—CO—$R^{14}$, $NR^{14}R^{14'}$, $CONR^{14}R^{14'}$, $NR^{14}$—CO—$R^{14'}$, $S(=O)_2OR^{14}$ and $S(=O)_2O^-Z^+$, where aryl, the aryl moiety of aralkyl, aralkenyl and aralkynyl, heteroaryl, heterocyclyl, cycloalkyl, cycloalkenyl and cycloalkynyl may carry substituents selected from $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $Cs$-$C_{20}$-cycloalkenyl, $C_6$-$C_{20}$-cycloalkynyl, halogen, S—$R^{14}$, O—$R^{14}$, CO—$OR^{14}$, O—CO—$R^{14}$, $NR^{14}R^{14'}$, $CONR^{14}R^{14'}$, $NR^{14}$—CO—$R^{14'}$, $S(=O)_2OR^{14}$ and $S(=O)_2O^-Z^+$, where $R^{14'}$ has one of the meanings given for $R^{14}$ and where $R^{14}$, $R^{25}$, $R^{26}$, $R^{27}$ and Z are as defined above.

According to a specific aspect of this embodiment, D is a radical selected from the radicals of the formulas D.1 and D.2, where $R^{17}$ and $R^{18}$ are independently selected from $C_1$-$C_{20}$-alkyl, $C_2$-$C_{20}$-alkenyl, $C_2$-$C_{20}$-alkynyl, $C_6$-$C_{20}$-aryl, heteroaryl, heterocyclyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, wherein alkyl, alkenyl, alkynyl or the aliphatic moieties in aralkyl, aralkenyl or aralkynyl are uninterrupted or interrupted by O, S, $NR^{14}$ or combinations thereof and/or may carry one or more substituents selected from $C_4$-$C_{20}$-cycloalkyl, $C_5$-$C_{20}$-cycloalkenyl, $C_6$-$C_{20}$-cycloalkynyl, heterocyclyl, halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$ and $S(=O)_2O^-Z^+$ and wherein aryl, the aryl moiety of aralkyl, aralkenyl, or aralkynyl, heteroaryl, heterocyclyl, cycloalkyl, cycloalkenyl or cycloalkynyl are unsubstituted or may carry one or more substituents selected from halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$, $S(=O)_2$ $O^-Z^+$, $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, heterocyclyl, $C_6$-$C_{20}$-aryl, $C_6$-$C_{20}$-aryl which carries one or more substituents selected from $C_1$-$C_{20}$-alkyl and $OR^{25}$, maleic anhydridyl and maleimidyl, wherein the 2 last mentioned radicals are unsubstituted or may carry substituents selected from $C_1$-$C_{20}$-alkyl, $C_6$-$C_{20}$-aryl and phenyl-$NR^{25}R^{26}$;

or $R^{17}$ and $R^{18}$ may form together with the nitrogen atom to which they are attached a 5-, 6- or 7-membered, saturated or unsaturated heterocycle which may have 1 or 2 further heteroatoms selected from O, S and N as ring members and wherein the heterocycle is unsubstituted or may carry one or more substituents $R^{x1}$, where each $R^{x1}$ is selected from $C_1$-$C_{20}$-alkyl which is unsubstituted or may carry one or more substituents $R^{x2}$ and phenyl, which is unsubstituted or may carry one or more substituents $R^{x3}$, in addition two radicals $R^{x1}$ bonded to adjacent carbon atoms may form together with the carbon atoms to which they are bonded a 4-, 5-, 6- or 7-membered saturated or unsaturated carbocyclic ring or an aromatic ring selected from benzene, naphthalene, anthracene and 9H-fluorene, where the carbocyclic and the aromatic ring are unsubstituted or carry one or more substituents $R^{x3}$, and/or two radicals $R^{x1}$ present on the same carbon atom may be $C_1$-$C_{20}$-alkylidene which is unsubstituted or carry one or more substituents $R^{x2}$, where $R^{x2}$ is selected from halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$ and $S(=O)_2O^-Z^+$, $R^{x3}$ is selected from $C_1$-$C_{10}$-alkyl, halogen, fluoren-9-ylidenemethyl, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$ and $S(=O)_2O^-Z^+$;

or $R^{17}$ and $R^{22}$, $R^{17}$ and $R^{20}$ and/or $R^{18}$ and $R^{19}$ may form together with the nitrogen atom to which they are attached a 5-, 6- or 7-membered, saturated or unsaturated heterocycle which may have 1 or 2 further heteroatoms selected from O, S and N as ring members and wherein the heterocycle may be unsubstituted or may carry one or more substituents $R^{x4}$, where each $R^{x4}$ is selected from $C_1$-$C_{20}$-alkyl which is unsubstituted or may carry one or more substituents $R^{x5}$ and phenyl, which is unsubstituted or carry one or more substituents $R^{x6}$, in addition two radicals $R^{x4}$ bonded to adjacent carbon atoms may form together with the carbon atoms to which they are bonded a 4-, 5-, 6- or 7-membered saturated or unsaturated carbocyclic ring or an aromatic ring selected from benzene, naphthalene, anthracene and 9H-fluorene, where the carbocyclic or the aromatic ring are unsubstituted or may carry one or more substituents $R^{x6}$, and/or two radicals $R^{x4}$ present on the same C atom may be $C_1$-$C_{20}$-alkylidene which is unsubstituted or carry one or more substituents $R^{x5}$;

where
each $R^{x5}$ has one of the meanings given for $R^{x2}$, and
each $R^{x6}$ has one of the meaning given for $R^{x3}$.
According to a specific aspect of this embodiment, D.1 is selected from radicals of the formulae D.1-a, D.1-b, D.1-c, D.1-c, D.1-d, D.1-e, D.1-f, D.1-g, D.1-h, D.1-i, D.1-k, D.1-l, D.1-m, D.1-n, D.1-o, D.1-p, D.1-q, D.1-r and D.1-s, preferably D.1-a
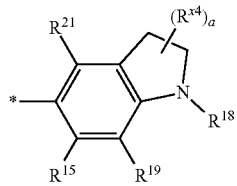
(D.1-a)
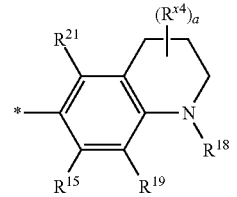
(D.1-b)
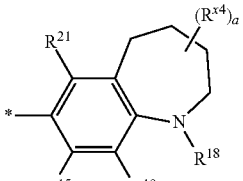
(D.1-c)
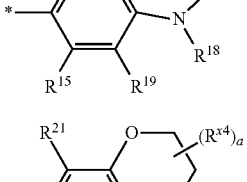
(D.1-d)
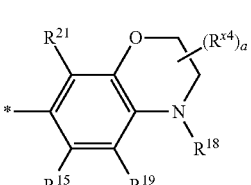
(D.1-e)
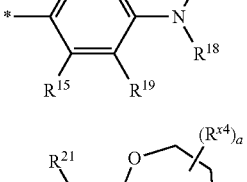
(D.1-f)
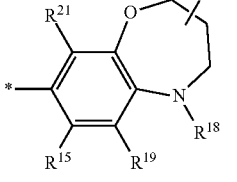
(D.1-g)
-continued
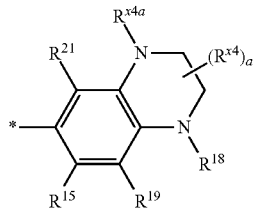
(D.1-h)
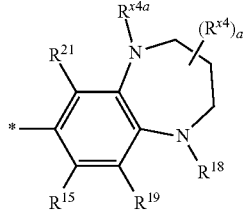
(D.1-i)
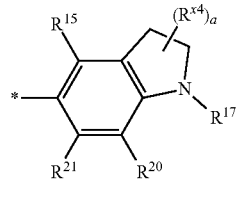
(D.1-k)
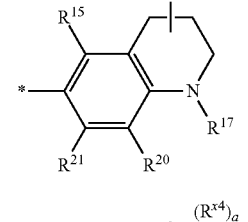
(D.1-l)
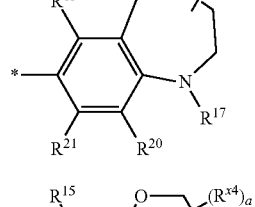
(D.1-m)
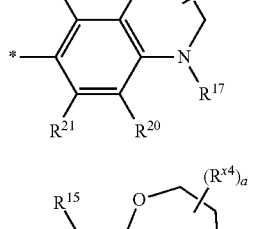
(D.1-n)
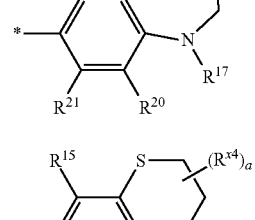
(D.1-o)
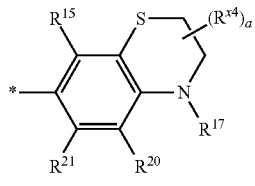
(D.1-p)

(D.1-q) 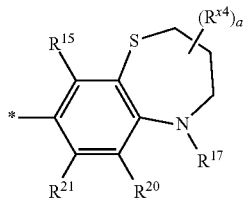

(D.1-r) 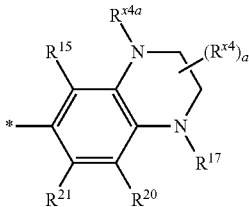

(D.1-s) 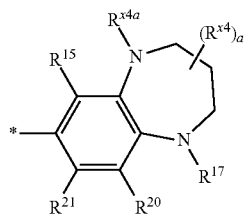

wherein
* is the point of attachment to the remainder of the molecule,
$R^{15}$ and $R^{21}$ have one of the meanings given above, especially a preferred one;
$R^{17}$, $R^{18}$, $R^{19}$ and $R^{20}$, if present, have one of the meanings given above, especially a preferred one;
$R^{x4}$ is as defined above;
$R^{x4a}$ is hydrogen or has one of the meanings given for $R^{x4}$; and
a is 0, 1, 2, 3, 4, 5, 6, 7 or 8.

According to a further specific aspect of this embodiment D1 is selected from radicals of the formulae D.1-t, D.1-u, D.1-v, D.1-w, D.1-x, D.1-y and D.1-z (D.1-t) 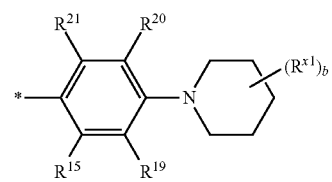

(D.1-u) 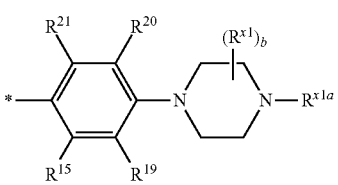

(D.1-v) 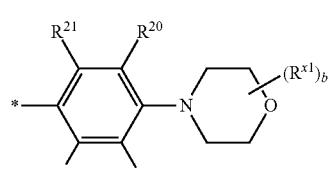

(D.1-w) 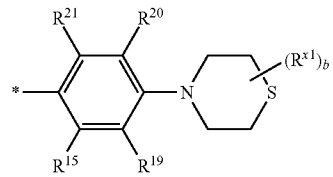

(D.1-x) 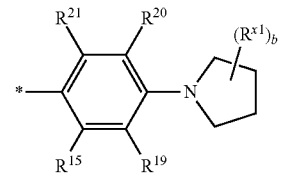

(D.1-y) 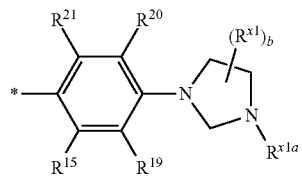

(D.1-z) 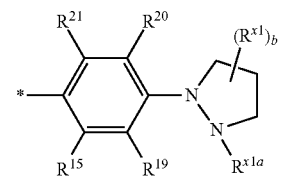

where
* is the point of attachment to the remainder of the molecule,
$R^{15}$, $R^{19}$, $R^{20}$ and $R^{21}$ have one of the meanings given above, especially a preferred one;
$R^{x1}$ is as defined above;
$R^{x1a}$ is hydrogen or has one of the meanings given for $R^{x1}$; and
b is 0, 1, 2, 3, 4, 5, 6, 7, 8, 9 or 10.

According to a specific aspect of this embodiment, D.2 is selected from radicals of the formulae D.2-a, D.2-b, D.2-c, D.2-d, D.2-e, D.2-f, D.2-g, D.2-h, D.2-i, (D.2-a) 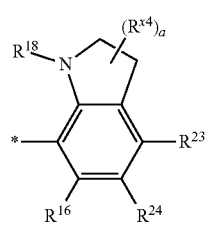

(D.2-b) 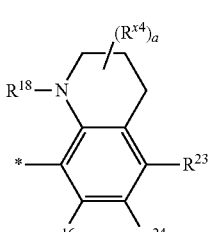

-continued

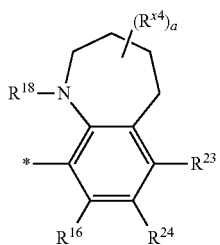 (D.2-c)

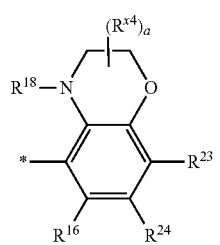 (D.2-d)

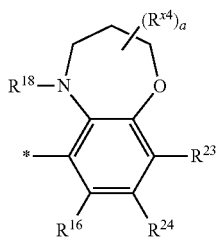 (D.2-e)

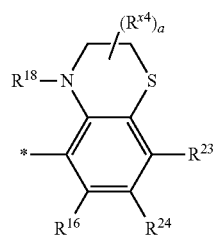 (D.2-f)

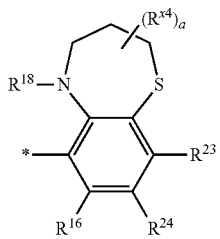 (D.2-g)

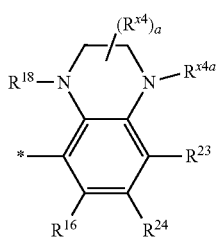 (D.2-h)

-continued

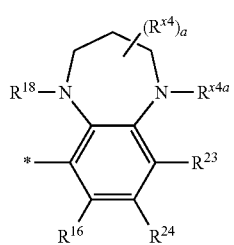 (D.2-i)

wherein
$R^{16}$, $R^{18}$, $R^{23}$ and $R^{24}$ have one of the meanings given above, especially a preferred one;

$R^{x4}$ is as defined above;

$R^{x4a}$ is hydrogen or has one of the meanings given for $R^{x4}$; and a is 0, 1, 2, 3, 4, 5 or 6.

According to a further specific aspect of this embodiment, D.2 is selected from radicals of the formulae D.2-a, D.2-b, D.2-c, D.2-d, D.2-e, D.2-f, D.2-g, D.2-h, D.2-i, D.2-k, D.2-l, D.2-m, D.2-n, D.2-o, D.2-p and D.2-q,

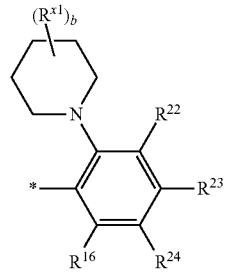 (D.2-k)

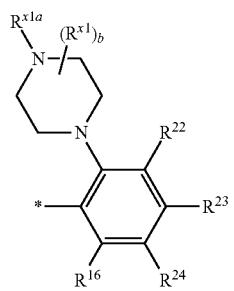 (D.2-l)

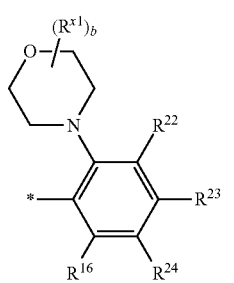 (D.2-m)

-continued

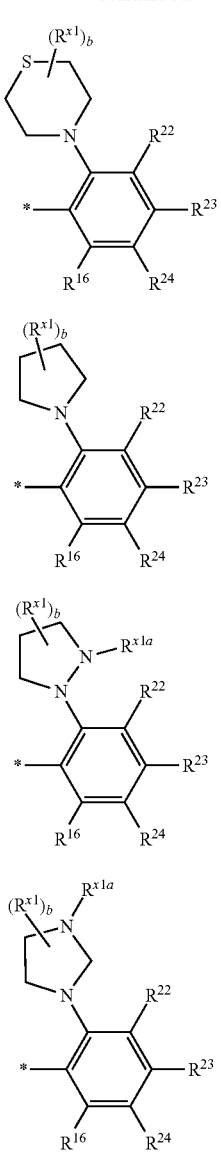

(D.2-n)

(D.2-o)

(D.2-p)

(D.2-q)

wherein
$R^{16}, R^{22}, R^{23}$ and $R^{24}$ have one of the meanings given above, especially a preferred one;
$R^{x1}$ is as defined above;
$R^{x1a}$ is hydrogen or has one of the meanings given for $R^{x1}$; and
b is 0, 1, 2, 3, 4, 5, 6, 7, 8, 9 or 10.

According to a particular aspect of this embodiment $R^{17}$ and $R^{18}$ are independently of each other selected from $C_1$-$C_8$-alkyl, $C_2$-$C_8$-alkenyl, $C_6$-$C_{20}$-aryl, heteroaryl, $C_7$-$C_{20}$-aralkyl, $C_8$-$C_{20}$-aralkenyl, $C_8$-$C_{10}$-aralkynyl and $C_5$-$C12$-cycloalkyl, where alkyl or alkenyl may be unsubstituted or may carry 1, 2 or 3 substituents selected from tetrahydrofuranyl, halogen, S—$R^{14}$, O—$R^{14}$, CO—$OR^{14}$, O—CO—$R^{14}$, $NR^{14}R^{14'}$, $CONR^{14}R^{14'}$ and $NR^{14}$—CO—$R^{14'}$, where aryl, heteroaryl, the aryl moiety of aralkyl, aralkenyl and aralkynyl and cycloalkyl are unsubstituted or may carry substituents selected from $C_1$-$C_8$-alkyl, $C_2$-$C_8$-alkenyl and $C_8$-$C_{20}$-aralkenyl; or
$R^{17}$ and $R^{20}$ may form together with the nitrogen atom to which $R^{17}$ is attached and the carbon atoms of the benzene ring to which $R^{20}$ and N—$R^{17}$ are attached a 5-, 6- or 7-membered, saturated or unsaturated heterocycle which may have 1 further heteroatom selected from O, S and N as ring member and wherein the heterocycle may be unsubstituted or may carry one or more substituents $R^{x4}$ selected from $C_1$-$C_{20}$-alkyl and phenyl,
in addition two radicals $R^{x4}$ bonded to adjacent carbon atoms may form together with the carbon atoms to which they are bonded a 4-, 5-, 6- or 7-membered saturated or unsaturated carbocyclic ring or an aromatic ring selected from benzene and 9H-fluorene where the carbocyclic and the aromatic ring are unsubstituted or carry one or more substituents selected from $C_1$-$C_6$-alkyl and fluoren-9-ylidenemethyl, and/or two radicals $R^{x4}$ present on the same carbon atom may be $C_1$-$C_{20}$-alkylidene;
$R^{15}$ is selected from hydrogen, $NR^{25}R^{26}$, $OR^{25}$, $SR^{25}$, O—CO—$R^{25}$ and $NR^{25}$—CO—$R^{26}$; and $R^{19}$, $R^{20}$ and $R^{21}$ are hydrogen, wherein $R^{14'}$ has one of the meanings given for $R^{14}$ and $R^{14}$, $R^{25}$, $R^{26}$, $R^{27}$ and Z are as defined above.

According to a more particular aspect of this embodiment, D is a radical of the formula D.1. In particular D is a radical D.1, where
$R^{17}$ and $R^{18}$ are independently of each other selected from $C_1$-$C_8$-alkyl,
phenyl which is unsubstituted or carries 1 or 2 substituents selected from $C_1$-$C_6$-alkyl, $C_1$-$C_4$-alkoxy, 2-phenylvinyl, 2,2-diphenyl-vinyl and triphenylvinyl, 9H-fluoren-2-yl, which is unsubstituted or carries 1, 2 or 3 substituents selected from $C_1$-$C_6$-alkyl, and
pyrenyl, which is unsubstituted or carries 1 or 2 substituents selected from $C_1$-$C_6$-alkyl;
or
$R^{17}$ and $R^{18}$ together with the nitrogen atom to which they are attached are morpholinyl;
or
$R^{17}$ and $R^{20}$ form together with the nitrogen atom to which $R^{17}$ is attached and the carbon atoms of the benzene ring to which $R^{20}$ and N—$R^{17}$ are attached a 5- or 6-membered, nitrogen heterocycle which is unsubstituted or carries 2 radicals $R^{x4}$, where two radicals $R^{x4}$ on two adjacent carbon atoms form together with the carbon atoms they are bonded to a 4-, 5-, 6-, or 7-membered saturated ring or a benzene ring,
$R^{15}$ is hydrogen, $C_1$-$C_{20}$-alkyl or $OR^{25}$ where $R^{25}$ is as defined above, preferably $R^{25}$ is $C_1$-$C_{14}$-alkyl; and
$R^{19}$, $R^{20}$ and $R^{21}$ are each hydrogen.

According to a further more particular aspect of this embodiment, D is a radical of the formula D.1, where $R^{17}$ and $R^{18}$ together with the nitrogen atom to which they are attached are thiomorpholinyl, piperidinyl, piperazinyl, pyrrolidinyl, pyrazolidinnyl or imidazolidinyl.

According to an even more preferred aspect of this embodiment D is a radical of the formula D.1, where $R^{15}$, $R^{19}$, $R^{20}$ and $R^{21}$ are each hydrogen and $R^{17}$ and $R^{18}$ are independently of each other selected from $C_1$-$C_6$-alkyl.

According to a further more preferred aspect of this embodiment D is a radical of the formula D.1 selected from radicals of the formulae D.1-1 and D.1-2

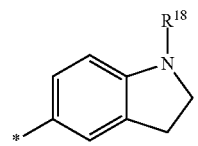

(D.1-1)

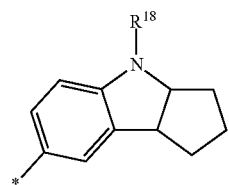
(D.1-2)

wherein
* denotes the point of attachment to the remainder of the molecule and
R[18] is phenyl which is substituted by 2-phenylvinyl or 2,2-diphenylvinyl, 9H-fluoren-2-yl or 9,9-di($C_1$-$C_8$-alkyl)-9H-fluoren-2-yl.

In particular, R[18] is phenyl which carries in the 4-position one radical selected from 2-phenylvinyl and 2,2-diphenylvinyl, or R[18] is 9H-fluoren-2-yl, 9,9-dimethyl-9H-fluoren-2-yl, 9,9-diethyl-9H-fluoren-2-yl, 9,9-di(n-propyl)-9H-fluoren-2-yl or 9,9-di(n-butyl)-9H-fluoren-2-yl.

Examples of suitable donors D are:

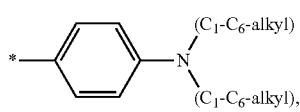

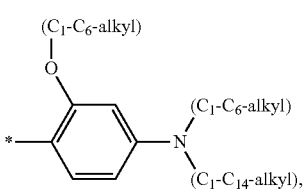

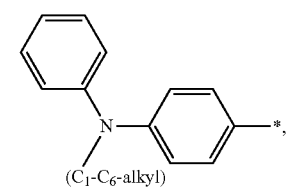

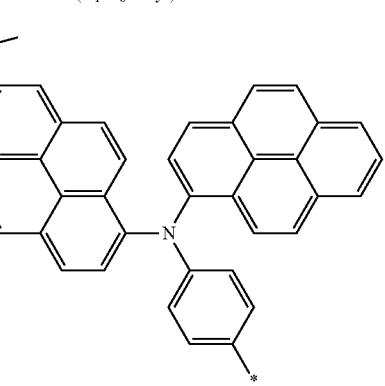

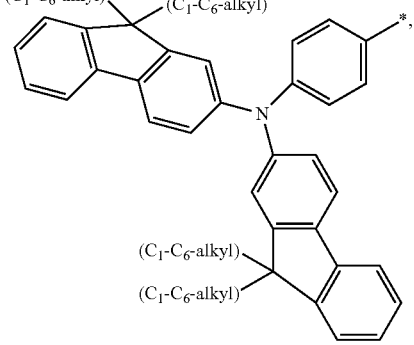

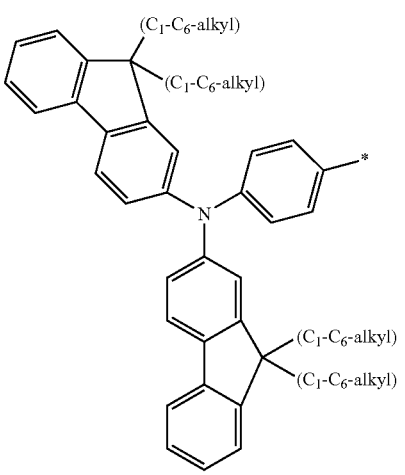

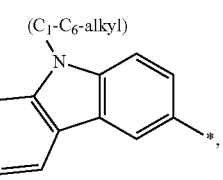

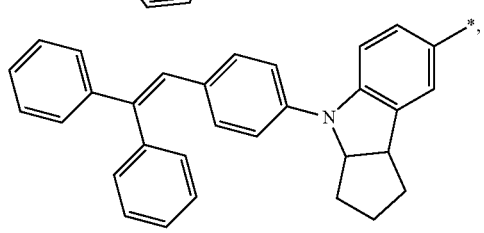

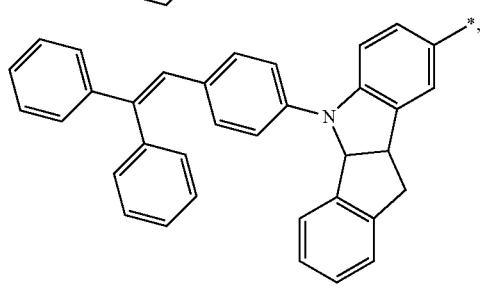

-continued

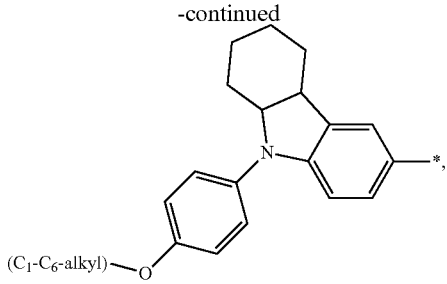

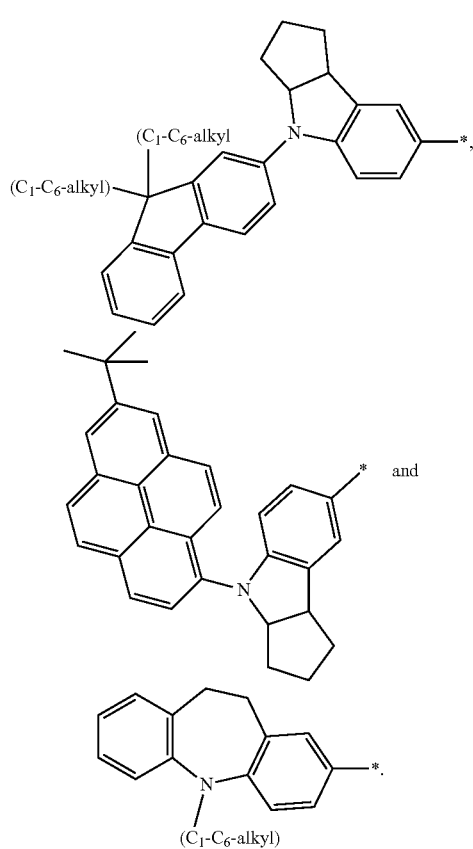

A further suitable donor D is

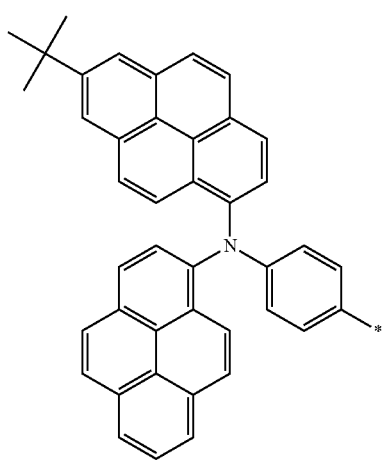

Especially preferred donors D are

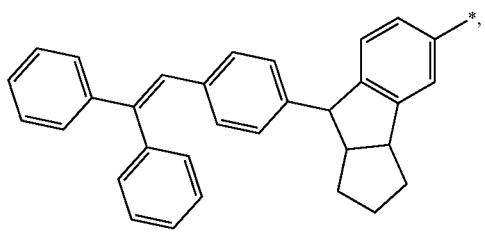

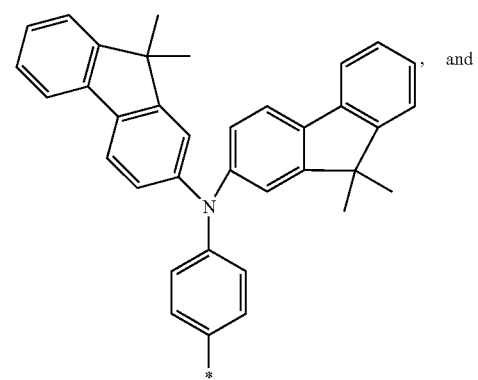, and

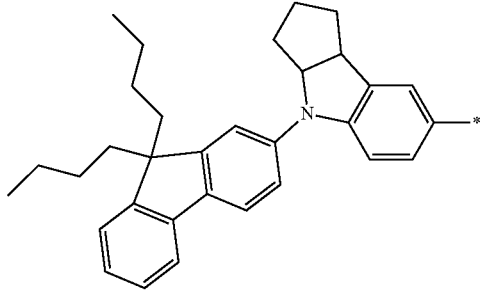

A preferred embodiment of the invention relates to an electrode layer sensitized with a compound of the formula I, photoelectric conversion elements comprising said electrode layer, compounds of the formula I and the use, where in the compound of the formula I, A is selected from the radicals of the formulae A.1.1a, A.1.1b, A.2, A.3, A.4 and A.5

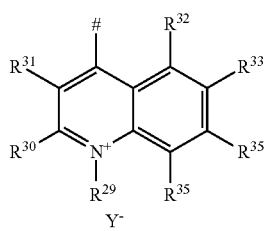

(A.1.1a)

-continued

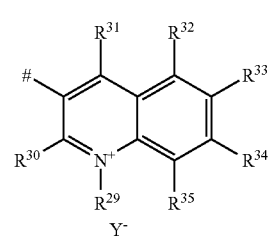
(A.1.b)

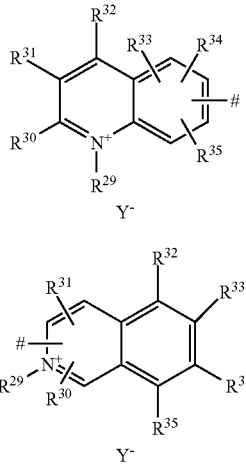
(A.2)

(A.3)

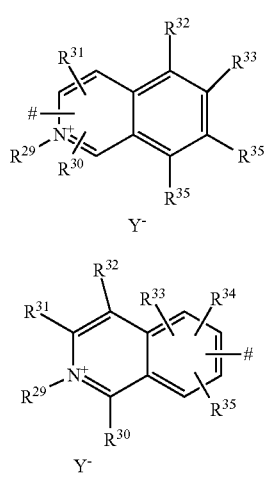
(A.4)

(A.5)

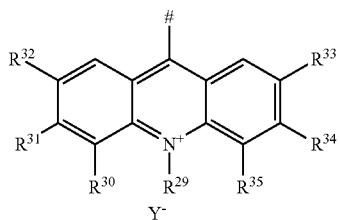

where # denotes the bond to the remaining compound of formula I $Y^-$, $R^{29}$, $R^{30}$, $R^{31}$, $R^{32}$, $R^{33}$, $R^{34}$ and $R^{35}$ are as defined above.

According to a specific aspect of this embodiment, A is a radical of the formulae A.1.1a, A.1.1b, A.2, A.3 or A.4, where $R^{29}$ is selected from a radical G, $C_1$-$C_{20}$-alkyl which is uninterrupted or interrupted by O, S, CO, $NR^{14}$ or combinations thereof, $C_6$-$C_{20}$-aryl, heteroaryl, $C_7$-$C_{20}$-aralkyl, $C_6$-$C_{20}$-aryl substituted by 1, 2 or 3 $C_1$-$C_8$-alkyl, and $C_7$-$C_{20}$-aralkyl wherein the aryl moiety of aralkyl is substituted by 1, 2 or 3 $C_1$-$C_8$-alkyl;

$R^{30}$ is selected from a radical G, hydrogen, $C_1$-$C_{20}$-alkyl wherein alkyl is uninterrupted or interrupted by O, S, CO, $NR^{14}$ or combinations thereof, $C_6$-$C_{20}$-aryl, heteroaryl, and $C_6$-$C_{20}$-aryl wherein the aryl moiety of aralkyl is substituted by 1, 2 or 3 $C_1$-$C_8$-alkyl;

$R^{31}$ is selected from hydrogen and a radical of the formula D*

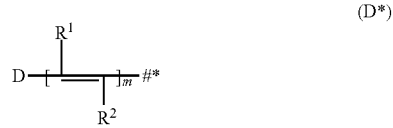
(D*)

where #* denotes the point of attachment to the remainder of the molecule, m is 1, 2, 3, 4, 5 or 6, and D, $R^1$ and $R^2$ are as defined above;

$R^{32}$, $R^{33}$, $R^{34}$ and $R^{35}$ are independently selected from hydrogen or $C_1$-$C_{20}$-alkyl wherein alkyl is uninterrupted or interrupted by O, S, $NR^{14}$ or combinations thereof, $C_6$-$C_{20}$-aryl, heteroaryl, and $C_6$-$C_{20}$-aryl wherein the aryl moiety of aralkyl is substituted by 1, 2 or 3 $C_1$-$C_8$-alkyl; and G is selected from $-R^{28}-COOH$, $-R^{28}-COO^-Z^+$; $-R^{28}-SO_3H$, $-R^{28}-SO_3.Z^+$; $-R^{28}-OP(O)(O^-Z^+)_2$, $-R^{28}-OP(O)(OH)_2$ and $-R^{28}-OP(O)(OH)O^-Z^+$, where $R^{28}$ is a direct bond, $C_1$-$C_{20}$-alkylene, $C_2$-$C_4$-alkenylene or $C_6$-$C_{10}$-arylene and $Z^+$ is $N(R^{14})_4^+$, or an alkali metal cation, where $R^{14}$ is as defined above; and $Y^-$ is as defined above.

According to a preferred aspect of this embodiment, $R^{29}$ is a radical G, $C_1$-$C_8$-alkyl or $C_1$-$C_8$-alkyl which is interrupted by one or two heteroatoms or heteroatomic groups selected from O, S, CO and $NR^{14}$; in particular a radical G;

$R^{30}$ is hydrogen, a radical G, $C_1$-$C_8$-alkyl or $C_1$-$C_8$-alkyl which is interrupted by one or two heteroatoms or heteroatomic groups selected from O, S, CO and $NR^{14}$;

$R^{31}$ is hydrogen;

$R^{32}$, $R^{33}$, $R^{34}$ and $R^{35}$ are independently of each other selected from hydrogen, $C_1$-$C_8$-alkyl and $C_1$-$C_8$-alkyl which is interrupted by one or two heteroatoms selected from O, S and $NR^{14}$;

G is $-R^{28}-COOH$ or $-R^{28}-COO^-Z^+$; where $R^{28}$ is a direct bond, $C_1$-$C_{10}$-alkylene, $C_2$-$C_4$-alkenylene or $C_6$-$C_{10}$-arylene and $Z^+$ is an alkali metal cation such as $Na^+$, $K^+$, $Li^+$ or $Rb^+$ or $N(R^{14})_4^+$, with each $R^{14}$ being independently of each other selected form hydrogen, phenyl, and $C_1$-$C_{20}$-alkyl; and $Y^-$ is as defined above or has one of the preferred meanings given below.

According to a more preferred aspect of this embodiment, A is a radical of the formula A.1.1a. According to an even more preferred aspect of this embodiment, A is a radical of the formula A.1.1a, in which $R^{30}$, $R^{31}$, $R^{32}$, $R^{33}$, $R^{34}$ and $R^{35}$ are each hydrogen and $R^{29}$ is a radical G.

According to a particularly preferred aspect of this embodiment, A is a radical of the formula A.1.1a,

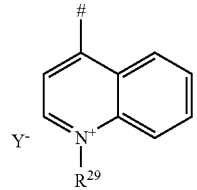
(A.1.1a)

where
denotes the point of attachment to the remainder of the molecule,
$R^{29}$ is $-R^{28}-CONH-OH$, where $R^{28}$ is a direct bond, $C_1$-$C_4$-alkylene, $C_2$-$C_4$-alkenylene or phenylene;
$Y^-$ is as defined above and has preferable one of the preferred meanings.

According to a further particularly preferred aspect of this embodiment, A is a radical of the formula A.1.1a,

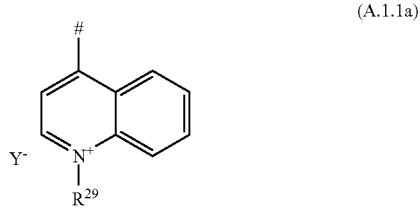

(A.1.1a)

where
denotes the point of attachment to the remainder of the molecule,
$R^{29}$ is $-R^{28}-COOH$ or $-R^{28}-COO^-Z^+$, where $R^{28}$ is a direct bond, $C_1$-$C_4$-alkylene, $C_2$-$C_4$-alkenylene or phenylene; and $Z^+$ is $N(R^{14})_4^+$, $Li^+$, $Na^+$ or $K^+$;
$R^{14}$ is hydrogen or $C_1$-$C_{20}$-alkyl; and
$Y^-$ is as defined above and has preferable one of the preferred meanings.

Examples of preferred acceptors are:

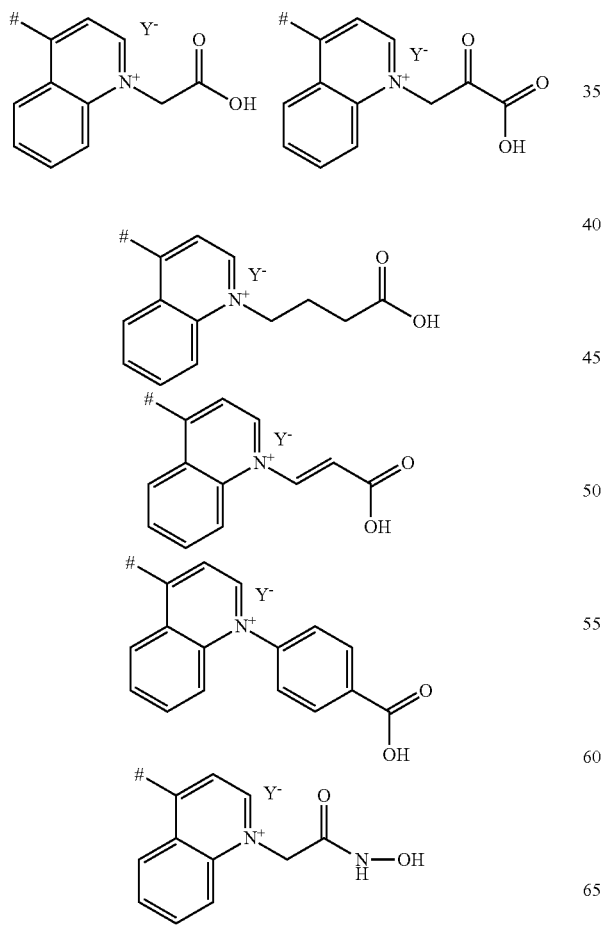

where # denotes the point of attachment to the remainder of the molecule and $Y^-$ is as defined above and has preferably one of the preferred meanings.

In particular, in the radical of the formula A.1.1a, $R^{28}$ is $C_1$-$C_4$-alkylene, especially $-CH_2-$ or $-CH_2-CH_2-$. $R^{29}$ is in particular $R^{28}-COOH$ with $R^{28}$ being $C_1$-$C_2$-alkylene and $Y^-$ is as defined above and has preferably one of the preferred meanings.

A further preferred embodiment of the invention relates to an electrode layer sensitized with a compound of the formula I, photoelectric conversion elements comprising said electrode layer, compounds of the formula I and the use, where $Y^-$ is $BF_4^-$, $PF_6^-$, $SbF_6^-$, $AsF_6^-$, preferably $PF_6^-$.

A further preferred embodiment of the invention relates to an electrode layer sensitized with a compound of the formula I, photoelectric conversion elements comprising said electrode layer, compounds of the formula I and the use, where $Y^-$ is a fluorinated organic anion selected from the groups Y.1, Y.2, Y.3, Y.4, Y.5 and Y.6,

(Y.1)

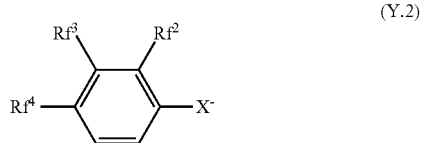

(Y.2)

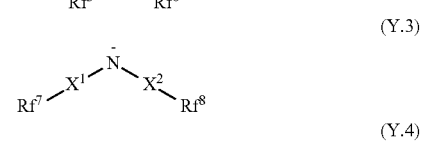

(Y.3)

(Y.4)

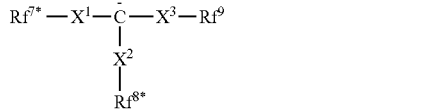

(Y.5)

(Y.6)

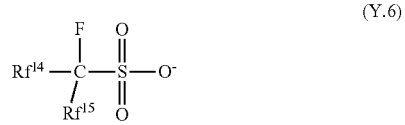

where
$X^-$ is $S(=O)_2O^-$, $O-S(=O)_2O^-$, $COO^-$;
$Rf^1$ is fluorine, $C_1$-$C_{20}$-alkyl, $C_1$-$C_{20}$-haloalkyl, where the two last-mentioned radicals are uninterrupted or interrupted by O, S, $NR^{14}$, CO or combinations thereof and/or are unsubstituted or substituted by one or more radicals selected from halogen, $OR^{25}$, $O-CO-R^{25}$, $O-CO-OR^{25}$, $O-CO-NR^{25}R^{26}$, $CO-OR^{25}$ and $CO-NR^{25}R^{26}$,
$Rf^2$, $Rf^3$, $Rf^4$, $Rf^5$ and $Rf^6$ are independently selected from fluorine, hydrogen, $OR^{25}$, $O-CO-R^{25}$, $O-CO-OR^{25}$, $O-CO-NR^{25}R^{26}$, $C_1$-$C_{20}$-fluoroalkyl;

$X^1$, $X^2$ and $X^3$ are independently selected from $S(=O)_2$ and CO;

$Rf^7$, $Rf^{7*}$, $Rf^8$, $Rf^{8*}$ and $Rf^9$ are independently selected from $C_6$-$C_{20}$-fluoroaryl, $C_1$-$C_{20}$-fluoroalkyl and $C_1$-$C_{20}$-fluoroalkyl which is interrupted by O, S, $NR^{14}$, CO or combinations thereof, wherein $C_1$-$C_{20}$-fluoroalkyl and interrupted $C_1$-$C_{20}$-fluoroalkyl are unsubstituted or substituted by one or more radicals selected from $OR^{25}$, O—CO—$R^{25}$, O—CO—$OR^{25}$, O—CO—$NR^{25}R^{26}$, CO—$OR^{25}$ and CO—$NR^{25}R^{26}$, or $Rf^7$ and $Rf^8$ together are $C_3$-$C_6$-fluoroalkyl, $Rf^{10}$, $Rf^{11}$, $Rf^{12}$ and $Rf^{13}$ are independently selected from fluorine, $C_1$-$C_{20}$-fluoroalkyl and $C_6$-$C_{20}$-fluoroaryl, $R^{f14}$ and $R^{f15}$ are together $C_3$-$C_5$-perfluoroalkyl where the fluorine atoms of the last mentioned group may be replaced by $C_1$-$C_{10}$-fluoroalkyl;

where $R^{14}$, $R^{25}$, $R^{26}$ and $R^{27}$ are as defined above.

For example, $Y^-$ is a radical Y.2, where $Rf^2$, $Rf^3$, $Rf^5$ and $Rf^6$ are each fluorine and $Rf^4$ is O—CO—$R^{25}$ where $R^{25}$ is $C_1$-$C_{10}$-alkyl or $C_1$-$C_{10}$-alkyl which carries one or two substituents selected from $C_1$-$C_8$-alkylcarbonylamino.

According to a preferred aspect of this embodiment, $Y^-$ is a radical of the formula Y.1.

More preferably, $Y^-$ is a radical of the formulae

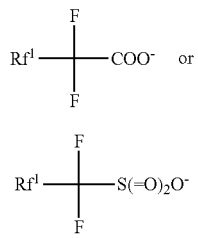

(Y.1a)

(Y.1b)

where $Rf^1$ is fluorine, $C_1$-$C_{10}$-fluoroalkyl or $C_1$-$C_{10}$-fluoroalkyl which is substituted by OC(=O)—$R^{25}$, where $R^{25}$ is as defined above. Preferably, $R^{25}$ is $C_1$-$C_{20}$-alkyl, phenyl which is unsubstituted or substituted by one or more, e.g. one, two or three $C_1$-$C_{20}$-alkoxy groups, where the alkyl moiety of alkoxy may be interrupted by 1, 2, 3, 4, 5, 6, 7, 8, 9 or 10 oxygen atoms, or $R^{25}$ is 6-, 7-, 8- or 9-membered saturated heterocyclyl containing 1 or 2 heteroatoms or heteroatom groups selected from N, O, C(O), S, SO and $SO_2$, as ring members, where heterocyclyl is unsubstituted or may carry 1, 2, 3, 4, 5 or 6 $C_1$-$C_4$-alkyl groups. More preferably, $R^{25}$ is $C_1$-$C_{20}$-alkyl, phenyl which is unsubstituted or carries one or two $C_1$-$C_{20}$-alkoxy groups, where the alkyl moiety of alkoxy may be interrupted by 1, 2, 3, 4, 5, 6, 7, 8, 9 or 10 oxygen atoms, or, $R^{25}$ is 6-, 7-, 8- or 9-membered saturated heterocyclyl containing 1 or 2 heteroatoms or heteroatom groups selected from O and CO as ring members, which is substituted by 1, 2, 3 or 4 $C_1$-$C_4$-alkyl, preferably 6-, 7-, 8- or 9-membered saturated heterocyclyl containing 1 or 2 heteroatoms or heteroatom groups selected from O and CO as ring members, which is substituted by 1, 2, 3 or 4 $C_1$-$C_4$-alkyl. Even more preferably, $R^{25}$ is 4,7,7-trimethyl-3-oxo-2-oxa-bicyclo[2.2.1]hept-1-yl. Likewise, even more preferably, $R^{25}$ is $C_1$-$C_{10}$-alkyl. Likewise, even more preferably, $R^{25}$ is phenyl or phenyl which is substituted by 1 or 2 $C_1$-$C_{20}$-alkoxy groups, where the alkyl moiety of alkoxy is interrupted by 1, 2, 3, 4, 5, 6, 7, 8, 9 or 10 oxygen atoms.

Examples are $CF_3C(=O)O^-$, $CF_3CF_2C(O)O^-$, $CF_3(CF_2)_2C(O)O^-$, $CF_3S(O)_2O^-$, $CF_3CF_2S(O)_2O^-$, $CF_3(CF_2)_2S(O)_2O^-$, $CF_3(CF_2)_3S(O)_2O^-$, $CF_3(CF_2)_3S(O)_2O^-$, $CF_3(CF_2)_4S(O)_2O^-$, $CF_3(CF_2)_5S(O)_2O^-$, $CF_3(CF_2)_6S(O)_2O^-$, $CF_3(CF_2)_7S(O)_2O^-$, and

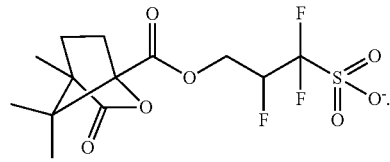

Further examples are $C_1$-$C_{10}$-alkyl-C(O)—O—$CH_2$—CHF—$CF_2$—$S(O)_2O^-$, such as

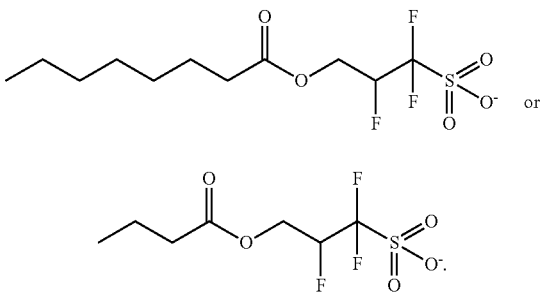

Further examples are phenyl-C(O)—O—$CH_2$—CHF—$CF_2$—$SO_2O^-$, where phenyl is unsubstituted or carries one or two $C_1$-$C_8$-alkoxy groups or $C_2$-$C_{20}$ alkoxy groups, where the alkyl moiety of alkoxy is interrupted by 1, 2, 3, 4, 5, 6, 7, 8, 9 or 10 oxygen atoms such as

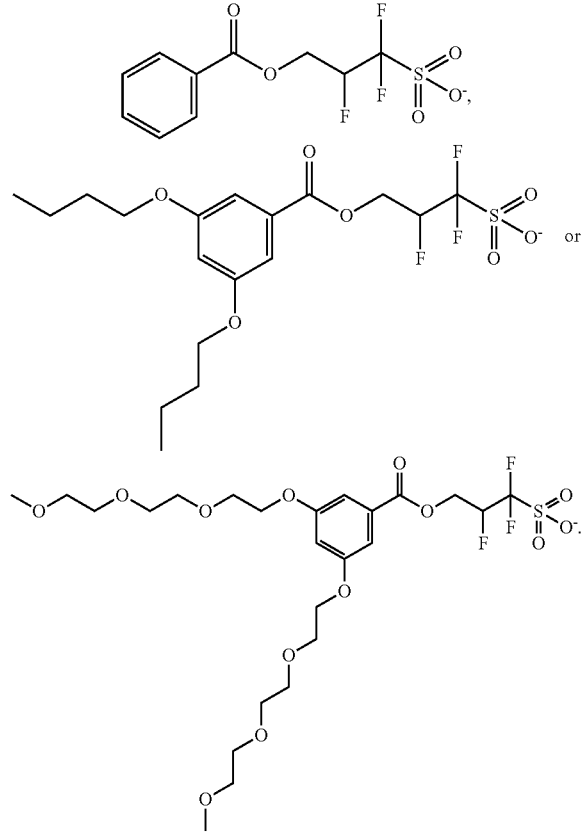

According to a further preferred aspect of this embodiment, $Y^-$ is a radical of the formula Y.2. More preferably, $Y^-$ is a radical of the formula Y.2a,

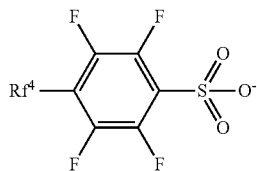
(Y.2a)

where $Rf^4$ is $OC(O)R^{25}$. $R^{25}$ is as defined above. Preferably, $R^{25}$ is $C_1$-$C_{10}$-alkyl.

According to a further preferred aspect of this embodiment, $Y^-$ is a radical of the formula Y.3. More preferably, $Y^-$ is a radical of the formula Y.3a

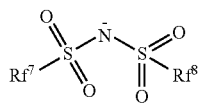
(Y.3a)

where $Rf^7$ and $Rf^8$ are independently of each other selected from $C_1$-$C_6$-fluroroalkyl or $R^{f7}$ and $R^{f8}$ taken together are $C_3$-$C_8$-fluoroalkyl, preferably $CF_2$—$CF_2$—$CF_2$.

Examples are

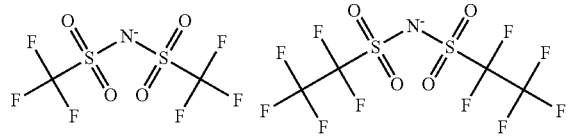

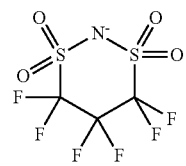

According to a further preferred aspect of this embodiment, $Y^-$ is a radical of the formula Y.4. More preferably, $Y^-$ is a radical of the formula Y.4a

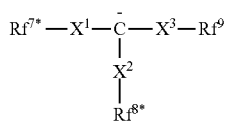
(Y.4a)

where $Rf^{7*}$, $Rf^{8*}$, and $R^{f9}$ are independently of each other selected from $C_1$-$C_6$-fluoroalkyl, preferably $C_1$-$C_3$-fluoroalkyl; and $X^1$, $X^2$ and $X^3$ are each $SO_2$.

Examples are $[(CF_3SO_2)_3C^-$ and $[(CF_3CF_2SO_2)]_3C^-$.

According to a further preferred aspect of this embodiment, $Y^-$ is a radical of the formula Y.5. More preferably, $Y^-$ is a radical of the formula Y.5a

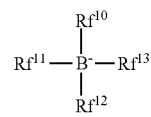
(Y.5a)

where $Rf^{10}$, $Rf^{11}$, $Rf^{12}$ and $Rf^{13}$ are each pentafluorophenyl.

According to a further preferred aspect of this embodiment, $Y^-$ is a radical of the formula Y.6. More preferably, $Y^-$ is a radical of the formula Y.6a

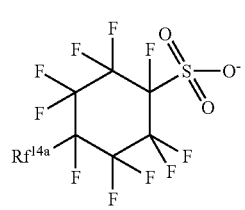
(Y.6a)

where $Rf^{14a}$ is $C_1$-$C_6$-fluoroalkyl. Especially, $Rf^{14}$ is $CF_3$, $CF_3CF_2$ or $CF_3CF_2CF_2$.

Specific examples of $Y^-$ are: $PF_6^-$,

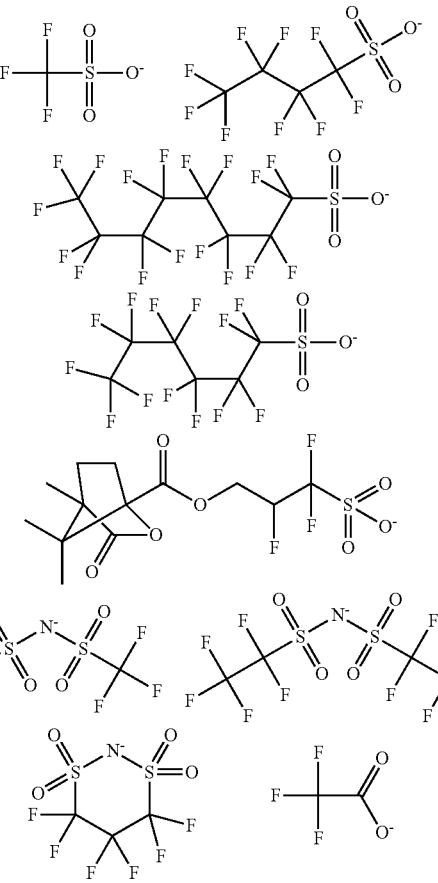

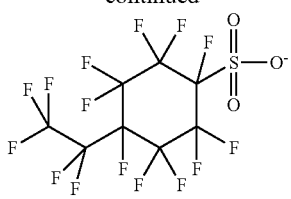

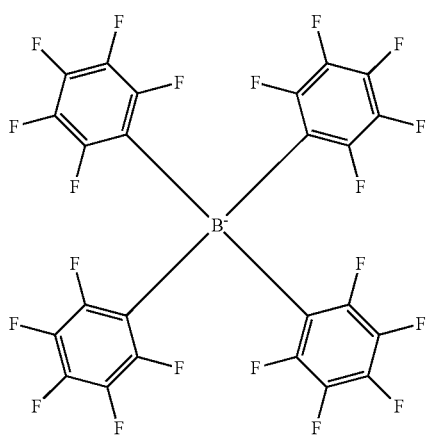 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F]

Further specific examples of Y⁻ are

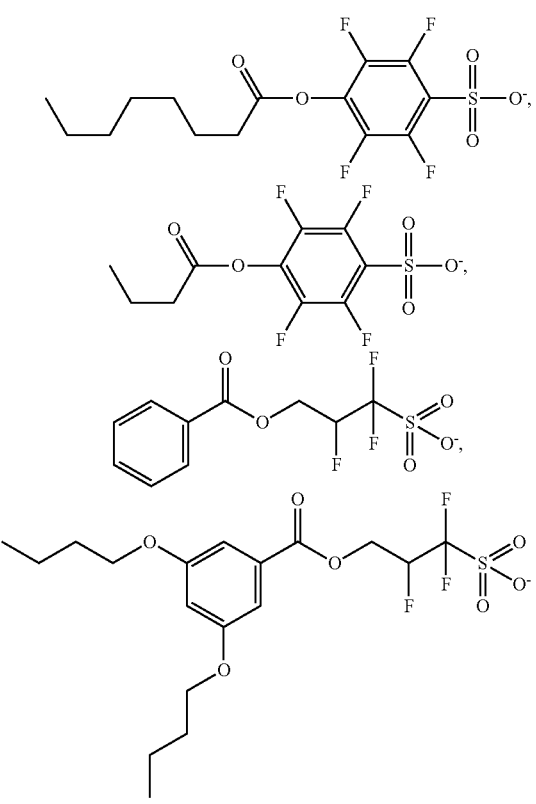

and

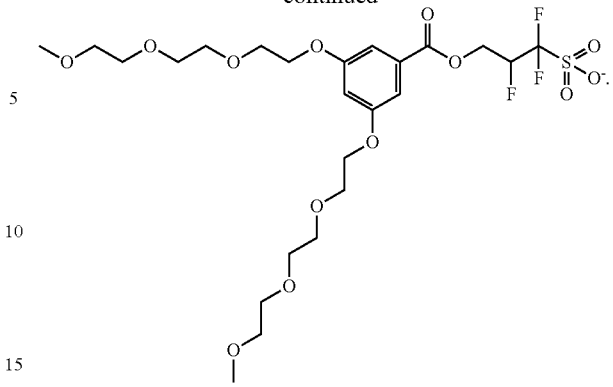

A preferred embodiment of the invention relates to an electrode layer sensitized with a compound of the formula I, photoelectric conversion elements comprising said electrode layer, compounds of the formula I and the use, where in the compound of the formula I A is a radical of the formula A.1a, where $R^{29}$ is $CH_2COOH$, and $Y^-$ is selected from $BF_4^-$, $B(C_6F_5)_4^-$, $PF_6^-$, $SbF_6^-$, Y.1a, Y.1b, Y.3a, Y.4a and Y.6a, where Y.1a, Y.1b, Y.3a, Y.4a and Y.6a are as defined above; or A is a radical of the formula A.1a, where $R^{29}$ is $CH_2COOH$, and $Y^-$ is Y.2a, where Y.2a is as defined above.

A further preferred embodiment of the invention relates to an electrode layer sensitized with a compound of the formula I, photoelectric conversion elements comprising said electrode layer, compounds of the formula I and the use, where in the compound of the formula I, $R^1$ and $R^2$ are independently selected from hydrogen, $C_1$-$C_{20}$-alkyl which is uninterrupted or interrupted by O, S, CO, $NR^{14}$ or combinations thereof, $C_6$-$C_{20}$-aryl, heteroaryl, $C_6$-$C_{20}$-aryl which is substituted by 1, 2 or 3 $C_1$-$C_8$-alkyl and $R^1$ may also be a radical of the formula D, wherein $R^{14}$ is as defined above.

According to a preferred aspect of this embodiment, $R^2$ is hydrogen, $C_1$-$C_{20}$-alkyl or $C_6$-$C_{20}$-aryl. More preferably $R^2$ is hydrogen or $C_1$-$C_{10}$-alkyl or phenyl. $R^1$ has one of the meanings given for $R^2$ or is a radical of the formula D. In particular, $R^1$ and $R^2$ are both hydrogen.

A further preferred embodiment of the invention relates to an electrode layer sensitized with a compound of the formula I, photoelectric conversion elements comprising said electrode layer, compounds of the formula I and the use, where in the compound of the formula I, where n is 1 or 2. According to a preferred aspect of this embodiment, n is 1.

A further preferred embodiment of the invention relates to an electrode layer sensitized with a compound of the formula I, photoelectric conversion elements comprising said electrode layer, compounds of the formula I and the use, where in the compound of the formula I, n is 1;

$R^1$ and $R^2$ are independently of each other selected from hydrogen or $C_1$-$C_{10}$-alkyl;

D is a radical of the formula D.1,
   where $R^{15}$ is hydrogen or $C_1$-$C_{20}$-alkoxy;
   $R^{19}$, $R^{20}$ and $R^{21}$ are each hydrogen;
   $R^{17}$ and $R^{18}$ together with the nitrogen atom to which they are attached are morpholinyl, thiomorpholinyl, piperidinyl, piperazinyl, pyrrolidinyl, pyrrazolidinyl or imidazolidinyl or $R^{17}$ and $R^{18}$ are independently of each other selected from $C_1$-$C_6$-alkyl, 9H-fluoren-2-yl, 9,9-di($C_1$-$C_8$-alkyl)-9H-fluoren-2-yl, pyrenyl, pyrenyl which is substituted by $C_1$-$C_6$-alkyl and phenyl which is substituted by 2-phenylvinyl, 2,2-diphenylvinyl or triphenylvinyl or D is a radical of the formulae D.1-1 or D.1-2

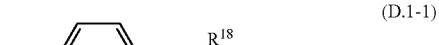
(D.1-1)

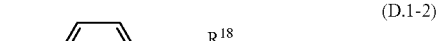
(D.1-2)

wherein
* denotes the point of attachment to the remainder of the molecule and
$R^{18}$ is phenyl which is substituted by 2-phenylvinyl or 2,2-diphenylvinyl, 9H-fluoren-2-yl or 9,9-di($C_1$-$C_8$-alkyl)-9H-fluoren-2-yl;
A is a radical of the formula A.1.1a,

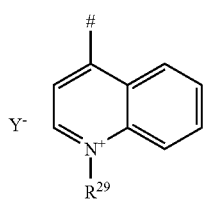
(A.1.1a)

where
$R^{29}$ is —$R^{28}$—COOH or —$R^{28}$—COO⁻Z⁺,
where $R^{28}$ is a direct bond, $C_1$-$C_4$-alkylene, $C_2$-$C_4$-alkenylene or phenylene;
and
$Z^+$ is $N(R^{14})_4^+$, $Li^+$, $Na^+$ or $K^+$; where $R^{14}$ is hydrogen or $C_1$-$C_{20}$-alkyl; and
$Y^-$ is selected from $B(C_6F_5)_4^-$, $PF_6^-$, $[(C_1$-$C_4$-perfluoroalkyl)$SO_2]_2N^-$, $[(C_1$-$C_4$-perfluoroalkyl)$SO_2]_3C^-$, $C_1$-$C_8$-perfluoroalkyl-$SO_3^-$

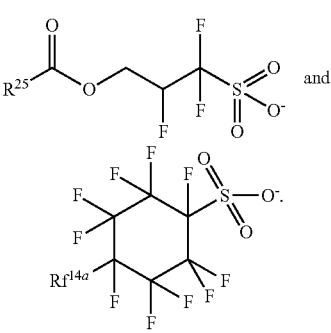

where $R^{25}$ is $C_1$-$C_{20}$-alkyl, phenyl which is unsubstituted or substituted by $C_1$-$C_{20}$-alkoxy, or 6-, 7-, 8- or 9-membered saturated heterocyclyl containing 1 or 2 heteroatoms or heteroatom groups selected from O, C(O), as ring members, where heterocyclyl is unsubstituted or may carry 1, 2, 3, 4, 5 or 6 $C_1$-$C_4$-alkyl groups, where $C_1$-$C_{20}$-alkoxy may be interrupted by one or more, e.g., 2, 3, 4, 5, 6, 7, 8 or more than 8 oxygen atoms, and $Rf^{14a}$ is $C_1$-$C_3$-perfluoroalkyl.

Apart from that, the variables $R^{25}$, $R^{26}$ and $R^{27}$ independently of each other, are preferably selected from hydrogen, $C_1$-$C_{20}$-alkyl and $C_6$-$C_{20}$ aryl.

The compounds of the formula I can be prepared by condensation of the corresponding carbonyl compound and quinolinium or isoquinolinium salt and as described below or in the experimental part.

Scheme 1 illustrates the preparation of compounds of the formula I, where n is zero or 1.

Scheme 1:

In case of n = 0;

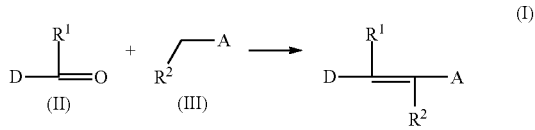
(I)

In case of n = 1;

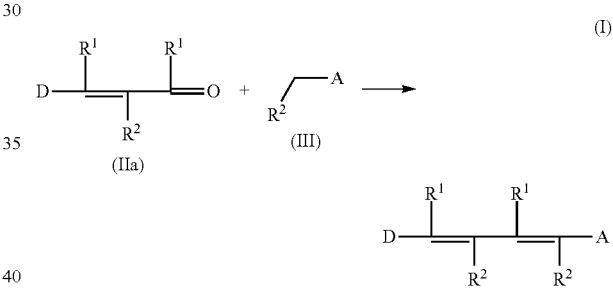
(I)

In scheme 1, D, A, $R^1$, $R^2$ and n are as defined above.

For instance, the reaction conditions of the condensation of the quaternary salts (III) with carbonyl compounds (II) or (IIa) are reflux in ethanol in the presence of piperidine or pyrrolidine (see for instance, J. Chem. Soc. 1961, 5074, Dyes & Pigments 2003, 58, 227), or heating in acetic anhydride (see for instance, Indian J. Chem. 1968, 6, 235.), or heating in acetic acid in a presence of ammonium acetate.

After condensation reactions, fluorinated counter anion can be placed from inorganic anion e.g. bromide via counter anion exchange reaction.

Before condensation, the group G may be protected. Then after the condensation reaction, the protection group can be removed. A group G comprising COOH or COO⁻Z⁺ can be protected by, for example, t-butyl group. Then after condensation reactions, the COO-t-butyl group can be converted into COOH or COO⁻Z⁺.

Or compounds of formula (I) can be prepared by condensation of the corresponding quinoline or isoquinoline derivatives with carbonyl compounds, followed by quaternization to the corresponding pyridinium, quinolinium or isoquinolinium salt.

For instance, the starting materials are partly items of commerce or can be obtained according to methods known in the art.

The oxide semiconductor fine particles are, for instance, made of $TiO_2$, $SnO_2$, $WO_3$, ZnO, $Nb_2O_5$, $Fe_2O_3$, $ZrO_2$, MgO, $WO_3$, ZnO, CdS, ZnS, PbS, $Bi_2S_3$, CdSe, CdTe or combinations thereof. Preferably, the oxide semiconductor fine particles are made of $TiO_2$.

According to a specific aspect of this invention, the electrode layer comprises a dye of formula (I) or a mixture of dyes of formula (I) as the only dye(s).

Preferred is a porous film made of oxide semiconductor fine particles which is sensitized with a dye of formula (I) and one or more further dyes.

Examples of further dyes are metal complex dyes (preferably the metal is Ru, Pt, Ir, Rh, Re, Os, Fe, W, Cr, Mo, Ni, Co, Mn, Zn or Cu, more preferably Ru, Os or Fe, most preferably Ru) and/or organic dyes selected from the group consisting of indoline, courmarin, cyanine, merocyanine, hemicyanine, methin, azo, quinone, quinonimine, diketo-pyrrolo-pyrrole, quinacridone, squaraine, triphenylmethane, perylene, indigo, xanthene, eosin, rhodamine and combinations thereof. As further dyes organic dyes, methine dye are preferred.

The molar ratio of a further dye, if present, to a dye of formula (I) usually is 1:19 to 19:1, preferably 1:9 to 9:1, more preferably 1:5 to 5:1, most preferably 1:3 to 3:1.

For example, the dye is adsorbed together with an additive, preferably a co-adsorbent.

Examples of such additives are co-adsorbents selected from the group consisting of a steroid (preferably deoxycholic acid, dehydrodeoxcholic acid, chenodeoxycholic acid, cholic acid methyl ester, cholic acid sodium salt or combinations thereof), a crown ether, a cyclodextrine, a calixarene, a polyethyleneoxide, hydroxamic acid, hydroxamic acid derivative and combinations thereof, especially hydroxamic acid and hydroxiamic acid derivative The molar ratio of such an additive to a dye of formula (I) usually is 1000:1 to 1:100, preferably 100:1 to 1:10, most preferably 10:1 to 1:2.

For example, such an additive is not a dye.

The present invention also pertains to a photoelectric conversion device comprising an electrode layer as defined herein.

Such photoelectric conversion devices usually comprise
(a) a transparent conductive electrode substrate layer,
(b) an electrode layer comprising a porous film made of oxide semiconductor fine particles sensitized with
(c) a dye of formula (I),
(d) a counter electrode layer, and
(e) an electrolyte layer (e.g. filled between the working electrode layer b and the counter electrode layer d).

The component (c) can also be a combination of a dye of formula (I) and one or more further dyes.

Preferably, the transparent conductive electrode substrate layer (a) contains (e.g. consists of)
(a-1) a transparent insulating layer and
(a-2) a transparent conductive layer.

The transparent conductive layer (a-2) is usually between the transparent insulating layer (a-1) and the electrode layer (b).

Examples of the transparent insulating layer (a-1) include glass substrates of soda glass, fused quartz glass, crystalline quartz glass, synthetic quartz glass; heat resistant resin sheets such as a flexible film; metal sheets, transparent plastic sheets made of polyethylene terephthalate (PET), polyethylene naphthalate (PEN), polycarbonate (PC), polyether sulfone (PES); a polished plate of a ceramic, such as titanium oxide or alumina.

Examples of transparent conductive layer (a-2) are conductive metal oxides such as ITO (indium-tin compounded oxide), IZO (indium-zinc compounded oxide), FTO (fluorine-doped tin oxide), zinc oxide doped with boron, gallium or aluminum, and niobium-doped titanium oxide. The thickness of the transparent conductive layer (a-2) is usually 0.1 to 5 μm. The surface resistance is usually below 40 ohms/sq, preferably below 20 ohms/sq.

To improve the conductivity of the transparent conductive layer (a-2), it is possible to form a metal wiring layer on it, made of for instance silver, platinum, aluminum, nickel or titanium. The area ratio of the metal wiring layer is generally within the range that does not significantly reduce the light transmittance of the transparent conductive electrode substrate layer (a). When such a metal wiring layer is used, the metal wiring layer may be provided as a grid-like, stripe-like, or comb-like pattern.

The electrode layer (b) is usually between the transparent conductive electrode substrate layer (a) and the electrolyte layer (e).

The porous film of oxide semiconductor fine particles of the electrode layer (b) can be prepared by a hydrothermal process, a sol/gel process or high temperature hydrolysis in gas phase. The fine particles usually have an average particle diameter of from 1 nm to 1000 nm. Particles with different size can be blended and can be used as either single or multi-layered porous film. The porous film of the oxide semiconductor layer (b) has usually a thickness of from 0.5 to 50 μm.

If desired, it is possible to form a blocking layer on the electrode layer (b) (usually between the surface of the electrode layer (b) and the dye (c)) and/or between the electrode layer (b) and the transparent conductive electrode substrate layer (a) to improve the performance of the electrode layer (b). An example of forming a blocking layer is immersing the electrode layer (b) into a solution of metal alkoxides such as titanium ethoxide, titanium isopropoxide and titanium butoxide, chlorides such as titanium chloride, tin chloride and zinc chloride, nitrides and sulfides and then drying or sintering the substrate. For instance, the blocking layer is made of a metal oxide (e.g. $TiO_2$, $SiO_2$, $Al_2O_3$, $ZrO_2$, MgO, $SnO_2$, ZnO, $Eu_2O_3$, and $Nb_2O_5$ or combinations thereof) or a polymer (e.g. poly(phenylene oxide-co-2-allylphenylene oxide) or poly(methylsiloxane)). Details of the preparation of such layers are described in, for example, Electrochimica Acta, 1995, 40, 643; J. Phys. Chem. B, 2003, 107, 14394; J. Am. Chem. Soc., 2003, 125, 475; Chem. Lett, 2006, 35, 252; J. Phys. Chem. B, 2006, 110, 19191; J. Phys. Chem. B, 2001, 105, 1422. The blocking layer may be applied to prevent undesired reaction. The blocking is usually dense and compact, and is usually thinner than the electrode layer (b).

Preferably, the counter electrode layer (d) contains (e.g. consists of)
(d-1) a conductive layer and
(d-2) an insulating layer.

The conductive layer (d-1) is usually between the insulating layer (d-2) and the electrolyte layer (e).

For instance, the conductive layer (d-1) contains a conductive carbon (e.g. graphite, single walled carbon nanotubes, multiwalled carbon nanotubes, carbon nanofibers, carbon fibers, grapheme or carbon black), a conductive metal (e.g. gold or platinum), a metal oxide (e.g. ITO (indium-tin compounded oxide), IZO (indium-zinc compounded oxide), FTO (fluorine-doped tinoxide), zinc oxide doped with boron, gallium or aluminum, and niobium-doped titanium oxide) or mixtures thereof.

Furthermore, the conductive layer (d-1) may be one obtained by forming a layer of platinum, carbon or the like (generally with a thickness of from 0.5 to 2,000 nm), on a thin film of a conductive oxide semiconductor, such as ITO, FTO, or the like (generally with a thickness of from 0.1 to 5 µm). The layer of platinum, carbon or the like is usually between the electrolyte layer (e) and the insulating layer (d-2).

Examples of the insulating layer (d-2) includes glass substrates of soda glass, fused quartz glass, crystalline quartz glass, synthetic quartz glass; heat resistant resin sheets such as a flexible film; metal sheets, transparent plastic sheets made of polyethylene terephthalate (PET), polyethylene naphthalate (PEN), polycarbonate (PC), polyether sulfone (PES); a polished plate of a ceramic, such as titanium oxide or alumina. The dye (c) is usually disposed on the electrode layer (b) on that surface of the electrode layer (b) facing the electrolyte layer (e).

For adsorption of the dye (c) to the electrode layer (b), the electrode layer (b) may be immersed into a solution or a dispersion liquid of the dye. A concentration of the dye solution or dye dispersion liquid is not limited to, but preferably from 1 µM to 1 M, and is preferably 10 µM to 0.1 M. The time period for the dye adsorption is preferably from 10 seconds to 1000 hours or less, more preferably from 1 minute to 200 hours or less, most preferably from 1 to 10 hours. The temperature for dye adsorption is preferably from room temperature to the boiling temperature of the solvent or the dispersion liquid. The adsorption may be carried out dipping, immersing or immersing with stirring. As the stirring method, a stirrer, supersonic dispersion, a ball mill, a paint conditioner, a sand mill or the like is employed, while the stirring method shall not be limited thereto.

The solvent for dissolving or dispersing the dye (c) includes water, alcohol solvents such as methanol, ethanol, isopropyl alcohol, t-butyl alcohol, ethylene glycol and propylene glycol, ether solvents such as dioxane, diethyl ether, dimethoxyethane, tetrahydrofuran, dioxolane, t-butyl methyl ether, ethylene glycol dialkyl ether, propylene glycol monomethyl ether acetate and propylene glycol methyl ether, ketone solvents such as acetone, amide solvents such as N,N-dimethylformamide, N,N-dimethylacetamide and N-methylpyrrolidone, nitrile solvents such as acetonitrile, methoxy acetonitrile, methoxy propionitrile, propionitrile and benzonitrile, carbonate solvents such as ethylene carbonate, propylene carbonate and diethyl carbonate, heterocyclic compounds such as 3-methyl-2-oxazolidinone, dimethyl sulfoxide, sulfolane and γ-butyrolactone, halogenated hydrocarbon solvents such as dichloromethane, chloroform, dichloroethane, trichloroethane, trichloroethylene, chlorobenzene, o-dichlorobenzene, 1-chloronaphthalene, bromoform, bromobenzene, methyl iodide, iodobenzene and fluorobenzene and hydrocarbon solvents such as benzene, toluene, o-xylene, m-xylene, p-xylene, ethylbenzene, cumene, n-pentane, n-hexane, n-octane, cyclohexane, methylcyclohexane, 1,5-hexadiene and cyclohexadiene. These may be used solely or in the form of a mixture containing two or more solvents. As a solvent, supercritical solvent such as supercritical carbon dioxide may be used.

As dye (c) a dye of formula (I) may be adsorbed on the electrode layer (b) solely or in combination with one or more further dyes. The dyes adsorbed together are not limited to dyes of formula (I). Two or more dyes may be adsorbed on the electrode layer (b) one by one or all together by dissolving the dyes in a solvent. It is preferable to use the dyes with different absorption peaks in different wavelengths to absorb wide range of light wavelengths and generate higher current. The ratio of two or more dyes adsorbed on the electrode layer (b) is not limited but preferably each dye has molar ratio of more than 10%.

For adsorption of the dye (c), an additive may be used in combination. The additive may be any one of an agent that has a function presumably for controlling dye adsorption. The additive includes a condensation agent such as thiol or a hydroxyl compound and a co-adsorbent. These may be used solely or a mixture of them. The molar ratio of the additive to the dye is preferably 0.01 to 1,000, more preferably 0.1 to 100.

For instance, the dye-adsorbed electrode layer may be treated with amines such as 4-tert-butyl pyridine. As a treatment method, immersing the dye-sensitized electrode layer into amine solution which may be diluted with a solvent such as acetonitrile or ethanol can be employed.

In the above manner, the electrode layer of the present invention can be obtained.

When the electrolyte layer (e) is in the form of solution, quasi-solid or solid, the electrolyte layer (e) usually contains,
(e-1) electrolyte compound,
(e-2) solvent and/or ionic liquid, and
preferably (e-3) other additives.

Examples of the electrolyte compound (e-1) include a combination of a metal iodide such as lithium iodide, sodium iodide, potassium iodide, cesium iodide or calcium iodide with iodine, a combination of a quaternary ammonium iodide such as tetraalkylammonium iodide, pyridium iodide or imidazolium iodide with iodine, a combination of a metal bromide such as lithium bromide, sodium bromide, potassium bromide, cesium bromide or calcium bromide with bromine, a combination of a quaternary ammonium bromide such as tetraalkylammonium bromide or pyridinium bromide with bromine, metal complexes such as ferrocyanic acid salt-ferricyanic acid salt or ferrocene-ferricynium ion, sulfur compounds such as sodium polysulfide and alkylthiolalkyldisulfide, a viologen dye, hydroquinone-quinone and a combination of a nitroxide radical such as 2,2,6,6-tetramethyl-1-piperidinyloxy (TEMPO) and oxoammonium salt. It is possible to prepare electrolyte compounds (e-1) by partially converting nitroxide radical into the oxoammonium salt in situ by adding oxidizing agent (e.g. $NOBF_4$).

The above electrolyte compounds (e-1) may be used solely or in the form of a mixture. As an electrolyte compound (e-1), there may be used a molten salt that is in a molten state at room temperature. When such a molten salt is used, particularly, it is not necessary to use a solvent.

The electrolyte compound (e-1) concentration in the electrolyte solution is preferably 0.05 to 20 M, more preferably 0.1 to 15 M.

For instance, the solvent (e-2) is nitrile solvents such as acetonitrile, methoxy acetonitrile, methoxy propionitrile, propionitrile and benzonitrile, carbonate solvents such as ethylene carbonate, propylene carbonate and diethyl carbonate, alcohol solvents such as methanol, ethanol, isopropyl alcohol, t-butyl alcohol, ethylene glycol and propylene glycol, ether solvents such as dioxane, diethyl ether, dimethoxyethane, tetrahydrofuran, dioxolane, t-butyl methyl ether, ethylene glycol dialkyl ether, propylene glycol monomethyl ether acetate and propylene glycol methyl ether, water, ketone solvents such as acetone, amide solvents such as N,N-dimethylformamide, N,N-dimethylacetamide and N-methylpyrrolidone, heterocyclic compounds such as 3-methyl-2-oxazolidinone, dimethyl sulfoxide, sulfolane and γ-butyrolactone, halogenated hydrocarbon solvents such as dichloromethane, chloroform, dichloroethane, trichloroethane, trichloroethylene, chlorobenzene, o-dichlorobenzene, 1-chloronaphthalene, bromoform, bromobenzene, methyl iodide, iodobenzene and fluorobenzene and hydrocarbon solvents such as benzene, toluene, o-xylene, m-xylene, p-xylene, ethylbenzene, cumene, n-pentane, n-hexane, n-octane, cyclohexane, methylcyclohexane, 1,5-hexadiene and cyclohexadiene or combinations of the above mentioned solvents and the ionic liquid is a quaternary imidazolium salt, a quaternary pyridinium salt, a quarternary ammonium salt or combinations thereof, preferably the anion of the salt is $BF_4^-$, $PF_6^-$, $F(HF)_2^-$, $F(HF)_3^-$, bis(trifluoromethanesulfonyl)imide [$(CF_3SO_2)_2N^-$], $N(CN)_2^-$, $C(CN)_3^-$, $B(CN)_4^-$, $SCN^-$, $SeCN^-$, $I^-$, $IO_3^-$ or combinations thereof.

For example, a photoelectric conversion device comprises a solvent (e.g. without an ionic liquid). For instance, a photoelectric conversion device comprises an ionic liquid (e.g. without a solvent).

Examples of further additives (e-3) are lithium salts (especially 0.05 to 2.0 M, preferably 0.1 to 0.7 M) (e.g. $LiClO_4$, $LiSO_3CF_3$ or $Li(CF_3SO_2)N$); pyridines (especially 0.005 to 2.0 M, preferably 0.02 to 0.7M) (e.g. pyridine, tert-butylpyridine or polyvinylpyridine), gelling agents (especially 0.1 to 50 wt. %, preferably 1.0 to 10 wt. % based on the weight of the component e) (e.g. polyvinylidene fluoride, polyvinylidene fluoride-hexafluoropropylene copolymer, polyethylene oxide derivatives, polyacrylonitrile derivatives or amino acid derivatives), nano particles (especially 0.1 to 50 wt. %, preferably 1.0 to 10 wt. % based on the weight of the component e) (e.g. conductive nano particles, in particular single-wall carbon nanotubes, multi-wall carbon nanotubes or combinations thereof, carbon fibers, carbon black, polyaniline-carbon black composite $TiO_2$, $SiO_2$ or $SnO_2$); and combinations thereof.

In the present invention, an inorganic solid compound such as CuI, CuSCN, $CuInSe_2$, $Cu(In,Ga)Se_2$, $CuGaSe_2$, $Cu_2O$, CuS, $CuGaS_2$, $CuInS_2$, $CuAlSe_2$, GaP, NiO, CoO, FeO, $Bi_2O_3$, $MoO_2$, $Cr_2O_3$ or the like, an organic hole-transporting material or an electron-transporting material can be used in place of the electrolyte layer (e). Examples of organic hole-transporting materials are p-type semiconductors based on polymers such as polythiophene and polyaryl amines, or on amorphous, reversibly oxidizable nonpolymeric organic compounds such as the spirobifluorenes. These solid p-type semiconductors may be used both in the undoped and doped form. These compounds may be used alone or in admixture of two or more.

The instant electrode layer, photoelectric conversion devices and DSC can be prepared as outlined in U.S. Pat. Nos. 4,927,721, 5,084,365, 5,350,644 and 5,525,440 or in analogy thereto.

The present invention also refers to a dye sensitized solar cell comprising a photoelectric conversion device as described herein.

The present invention also refers to the use of a compound of formula (I) as defined herein as a dye in a dye sensitized solar cell.

The present invention further refers to a compound of formula (I) as defined herein.

The present invention is now illustrated in further detail by the following examples. However, the purpose of the following examples is only illustrative and is not intended to limit the present invention to them.

EXAMPLE D-1

D-1 is prepared according to the scheme below.

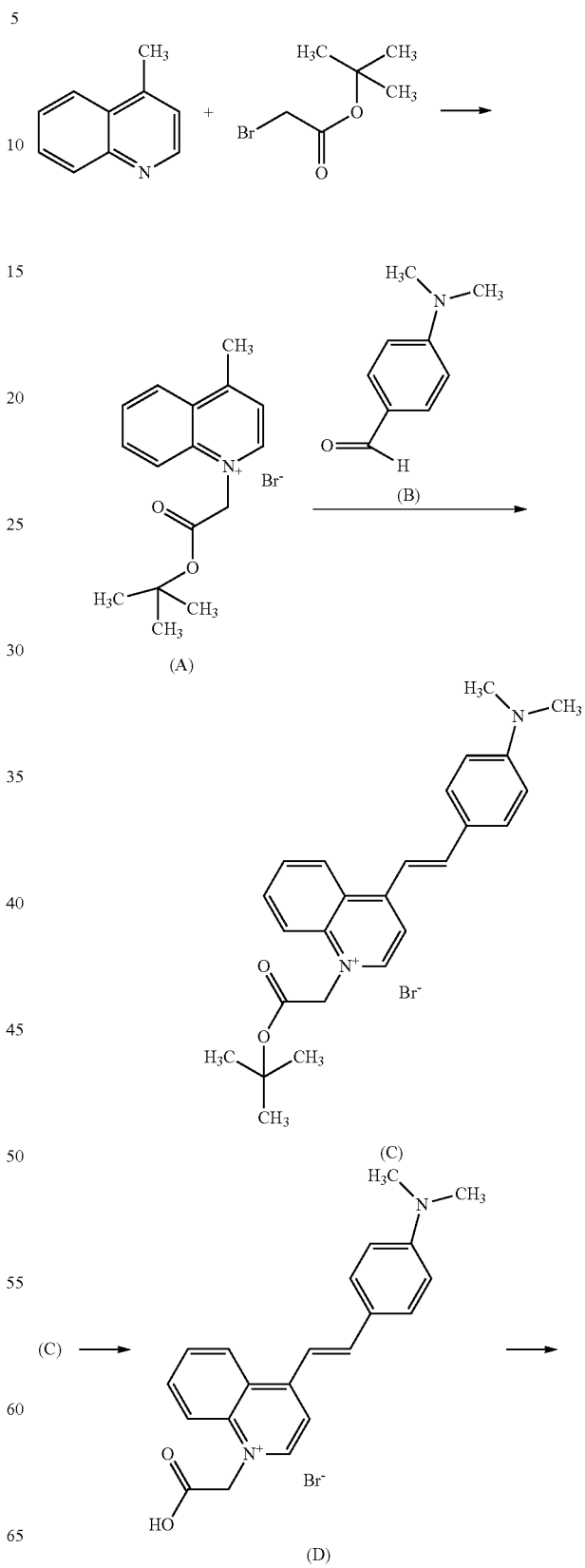

-continued

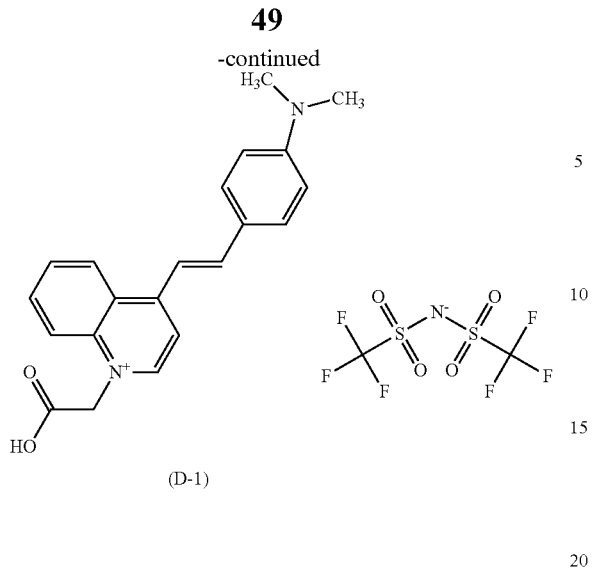

(D-1)

Preparation of the Quinolinium Salt (A):

A mixture of 4-methylquinoline (7.17 g, 50.07 mmol)), t-butyl bromoacetate (10.4 ml, 70.44 mmol)) and 150 ml of toluene were stirred overnight at 80° C. under $N_2$. The precipitate was collected by filtration, washed by toluene and dried, giving beige solid (A) (13.6 g). The crude was used without further purification.

Preparation of the Quinolinium Salt (C):

A mixture of aldehyde (B) (1.0 g, 6.7 mmol), quinolinium salt (A) (1.8 g, 7.0 mmol) and 10 ml of acetic anhydride stirred at 80° C. under $N_2$ for 2 hours. Acetic anhydride was removed by vacuum evaporation and the obtained solid was purified by column chromatography (silica gel, DCM-methanol (10->20%)), giving 1.4 g of (C).

Preparation of the Quinolinium Salt (D):

A mixture of quinolinium salt (C) (1.4 g) and 20 ml of dichloromethane/trifluoroacetic acid (4:3) was stirred at room temperature for 2 hours. Solvents were removed by vacuum evaporation and the obtained solid was purified by column chromatography (silica gel, DCM-methanol (5->20%)), giving 1.1 g of (D).

Preparation of D-1

A mixture of quinolinium salt (D) (150 mg, 0.36 mmol), lithium bis(trifluoromethanesulfonyl)imide (LiTFSI) (206 mg, 0.72 mmol) and dichloromethane (5 ml)/$H_2O$ (5 ml) was stirred at room temperature for 17 hours. Dichloromethane was removed by vacuum evaporation, yielding a water suspension of dye D-1. The dye was collected by filtration and washed by water and was dried in vacuo at room temperature overnight, giving 150 mg of D-1.

The procedures described in the synthesis example above were used to prepare further compounds D-2 to D-21 by appropriate modification of the starting compounds. The compounds thus obtained are listed in table I below, together with physicochemical data.

EXAMPLE D-2 to D-4

Dyes D-2, D-3 and D-4 were prepared in analogy to the above-mentioned procedures except using corresponding salt of counter anion in place of LiTFSI.

EXAMPLE D-5

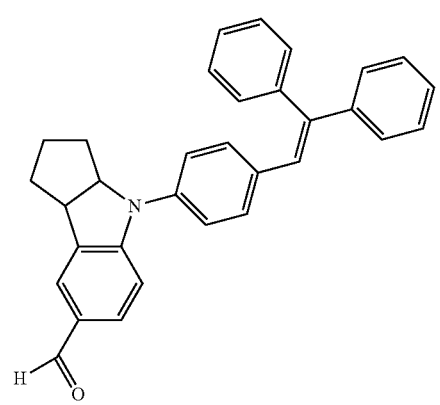

(E)

Dyes D-5 was prepared in analogy to the above-mentioned procedures except using corresponding aldehyde (E) in place of (B).

EXAMPLE D-6 to D-9

Dyes D-6 to D-9 were prepared in analogy to the procedure of D-5 except using corresponding salt of counter anion in place of LiTFSI.

EXAMPLE D-10

Dyes D-10 was prepared in analogy to the procedure of D-1 except using corresponding salt of counter anion in place of LiTFSI.

EXAMPLE D-11 TO D-13

Dyes D-11 to D-13 were prepared in analogy to the procedure of D-5 except using corresponding salt of counter anion in place of LiTFSI.

EXAMPLE D-14 TO D-16

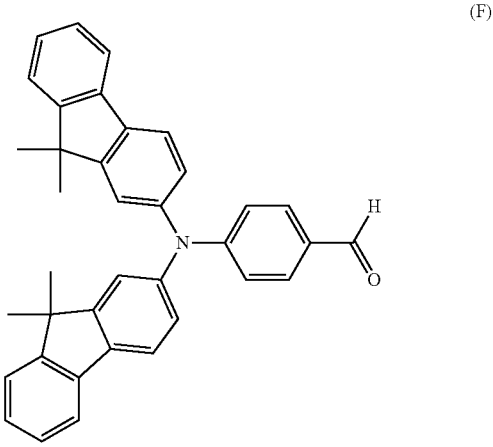

(F)

(G)
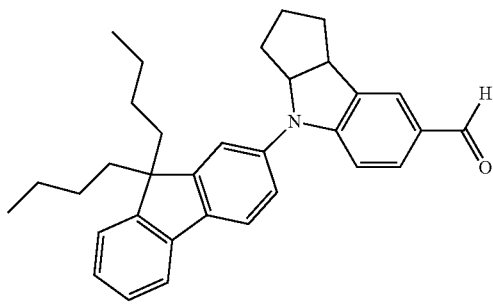
(H)
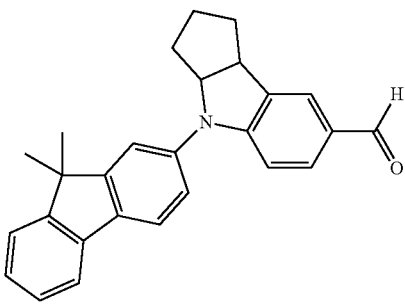
Dyes D-14 to D-16 were prepared in analogy to the above-mentioned procedures except using corresponding aldehyde (F), (G) and (H), respectively.
Dyes D-17 to D-29 are prepared in analogy to the above-mentioned procedures.
TABLE I
| No. | Donor | Chemical Structure Spacer/Acceptor |
|---|---|---|
| D-1 | | |
| D-2 | | |
| D-3 | | |
| D-4 | | |
| D-5 | | |

TABLE I-continued
D-6 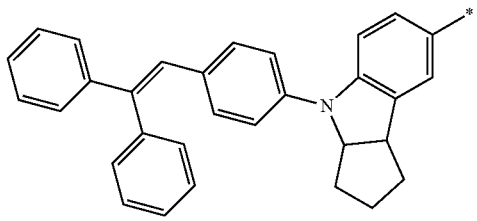 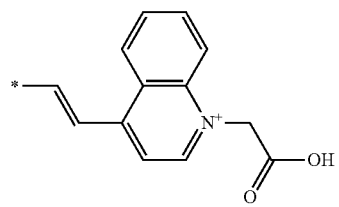
D-7 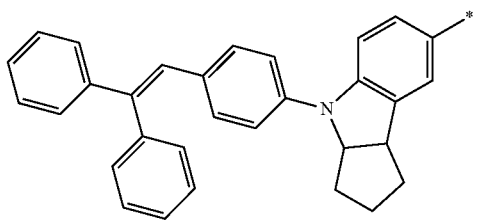 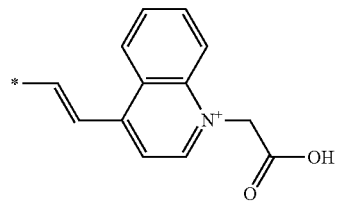
D-8 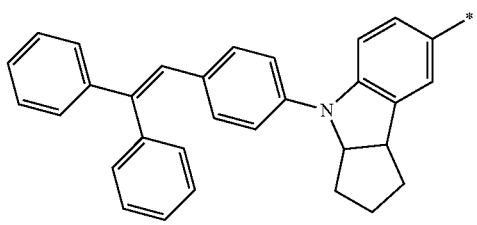 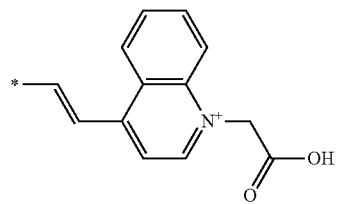
D-9 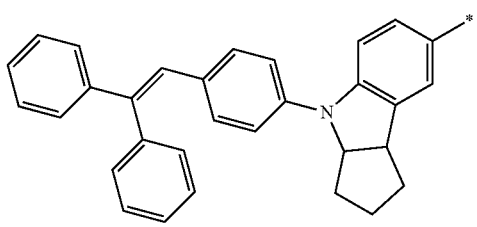 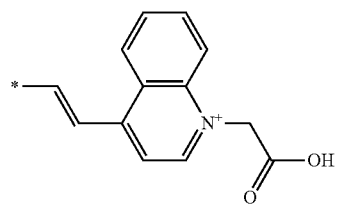
D-10 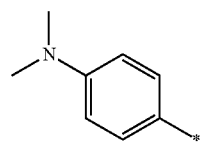 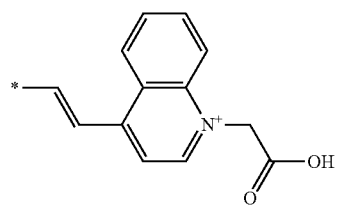
D-11 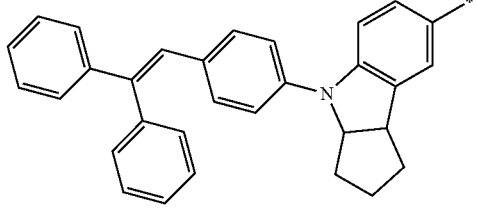 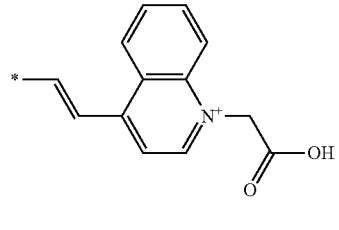
D-12 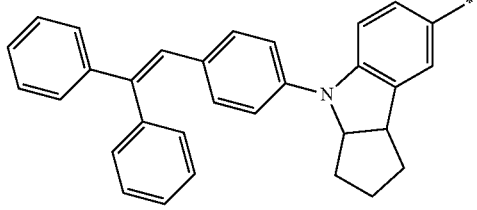 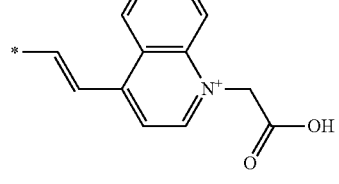

TABLE I-continued
D-13 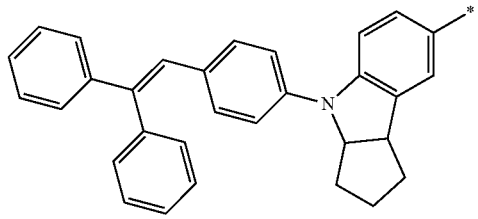 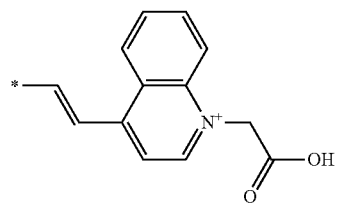
D-14 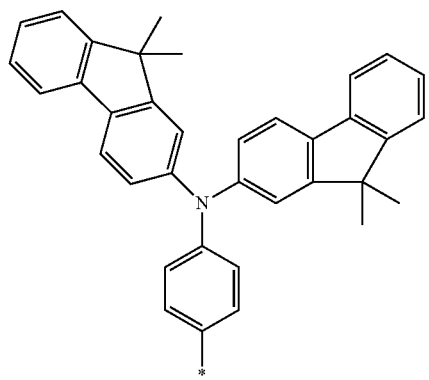 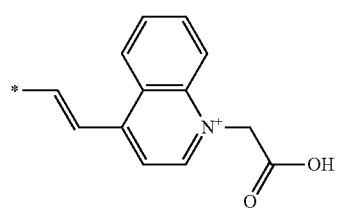
D-15 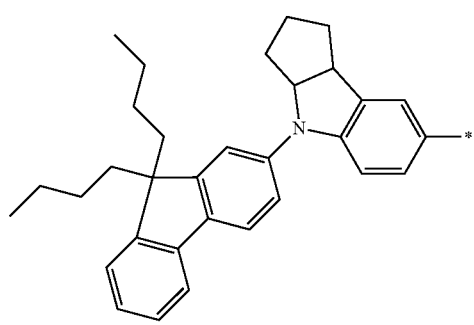 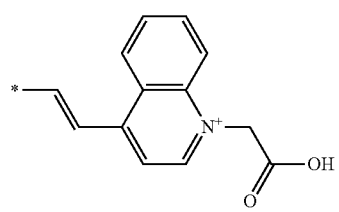
D-16 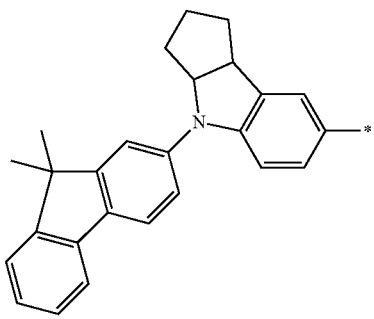 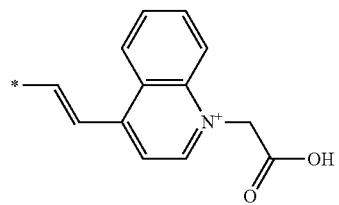
D-17 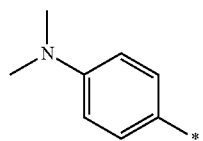 [SMILES: *c1ccc(N(C)C)cc1] 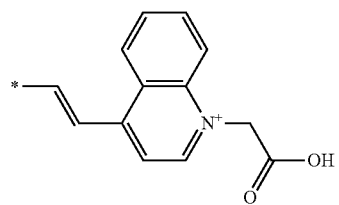

TABLE I-continued
D-18 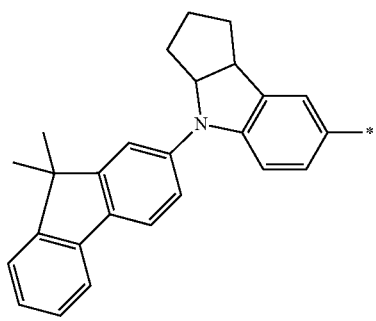 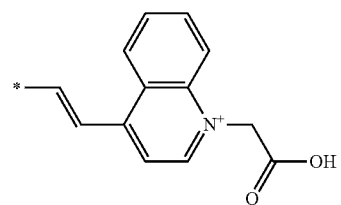
D-19 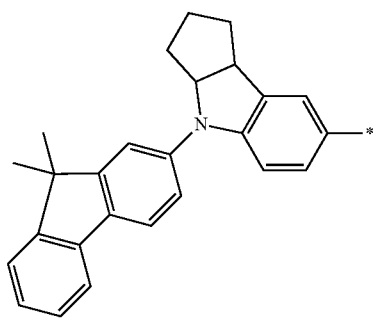 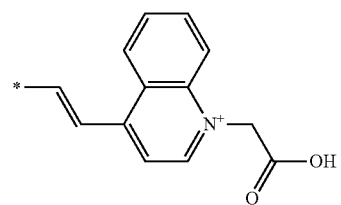
D-20 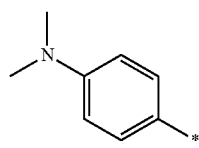 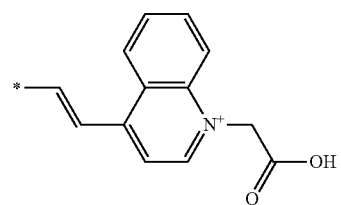
D-21 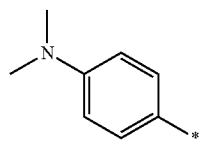 [SMILES: *c1ccc(N(C)C)cc1] 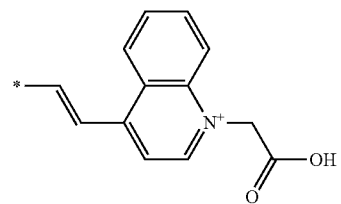
D-22 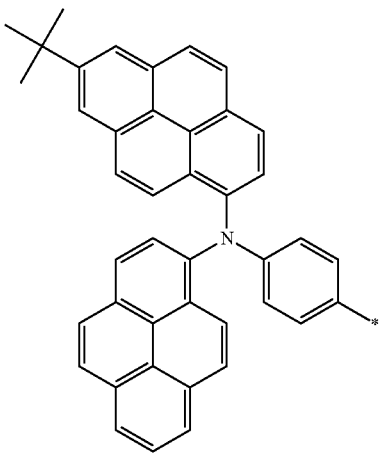 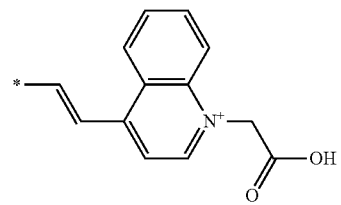

TABLE I-continued
D-23 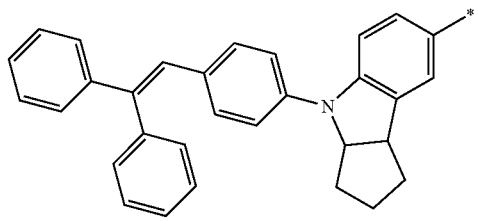 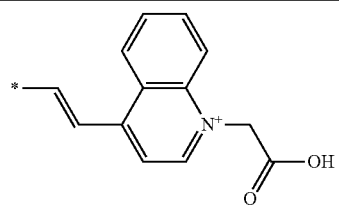
D-24 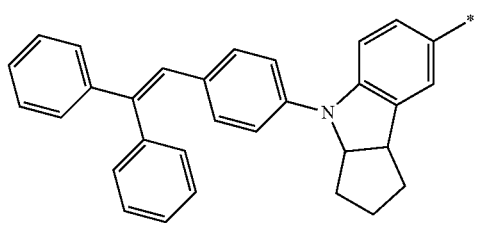 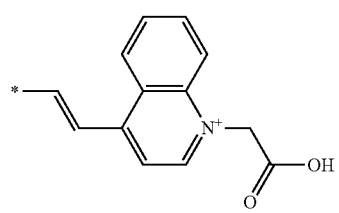
D-25 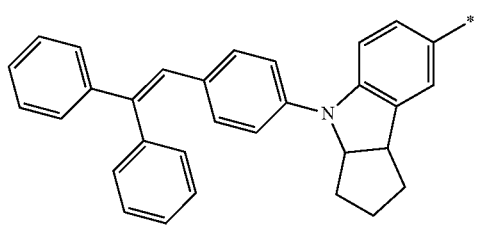 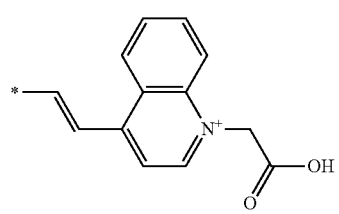
D-26 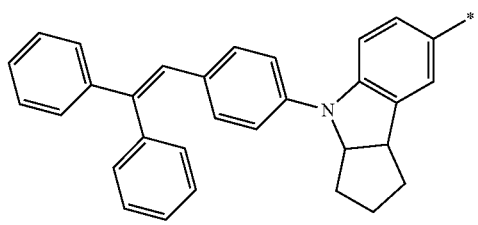 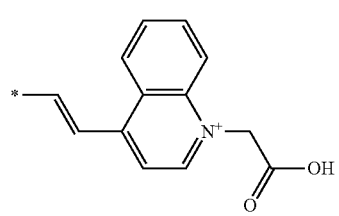
D-27 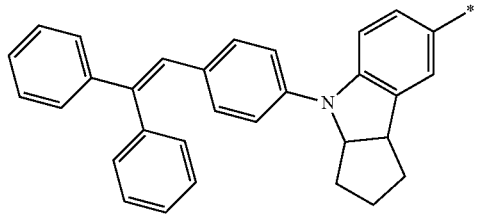 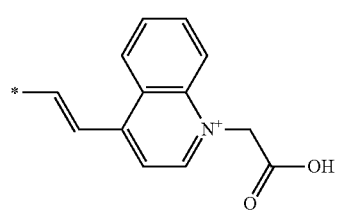
D-28 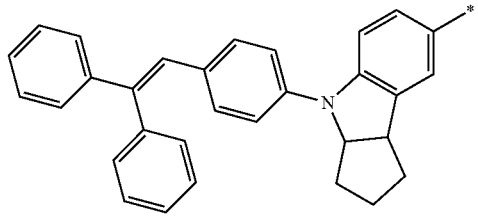 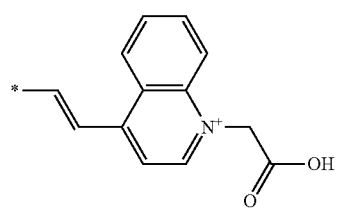
D-29 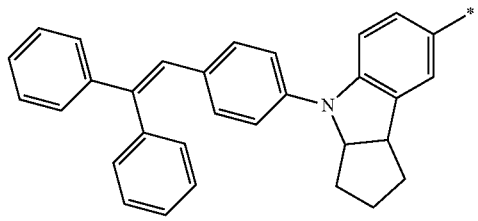 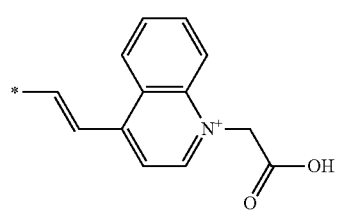

TABLE I-continued

| | Chemical Structure Anion | Absorption spectrum λ$_{max}$ (nm) | ε |
|---|---|---|---|
| D-1 | (CF$_3$SO$_2$)$_2$N$^-$ | 542 | 37500 |
| D-2 | B(C$_6$F$_5$)$_4$$^-$ | 541 | 41500 |
| D-3 | CF$_3$SO$_3$$^-$ | 541 | 46300 |
| D-4 | C$_4$F$_9$SO$_3$$^-$ | 542 | 45500 |
| D-5 | (CF$_3$SO$_2$)$_2$N$^-$ | 584 | 59000 |
| D-6 | C$_4$F$_9$SO$_3$$^-$ | 585 | 63500 |
| D-7 | B(C$_6$F$_5$)$_4$$^-$ | 584 | 57400 |

TABLE I-continued

| | | | |
|---|---|---|---|
| D-8 | (structure: cyclic bis-sulfonylimide with perfluorinated ring) | 583 | 58900 |
| D-9 | $PF_6^-$ | 585 | 51500 |
| D-10 | (structure: perfluoroalkyl sulfonate) | 541 | 40200 |
| D-11 | (structure: perfluorinated cyclohexyl sulfonate with ethyl substituent) | 584 | 54400 |
| D-12 | (structure: bis(pentafluoroethanesulfonyl)imide) | 584 | 69600 |
| D-13 | (structure: perfluoroalkyl sulfonate) | 584 | 64600 |
| D-14 | (structure: perfluorobutanesulfonate) | 553 | 30200 |
| D-15 | (structure: bis(trifluoromethanesulfonyl)imide) | 587 | 64100 |
| D-16 | (structure: perfluoropentanesulfonate) | 585 | 60100 |
| D-17 | (structure: trifluoroacetate) | 542 | 34200 |

TABLE I-continued
| | | | |
|---|---|---|---|
| D-18 | 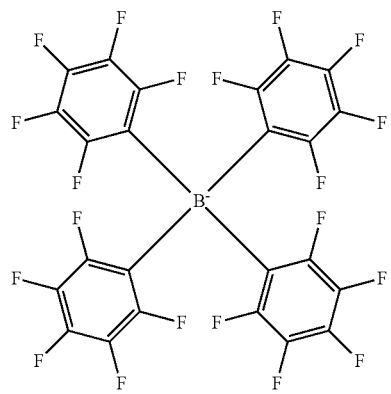 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | 584 | 50200 |
| D-19 | 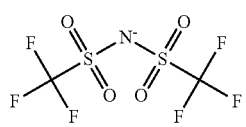 | 585 | 57200 |
| D-20 | 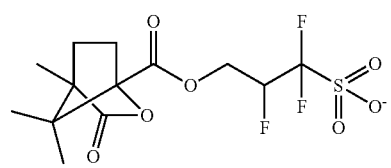 [SMILES: CC12CCC(C(=O)OCC(F)C(F)(F)S(=O)(=O)[O-])(OC1=O)C2(C)C] | 541 | 45800 |
| D-21 | 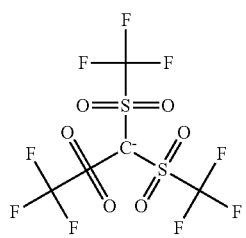 | 542 | 47400 |
| D-22 | 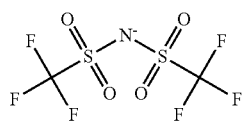 | 543 | 32300 |
| D-23 | 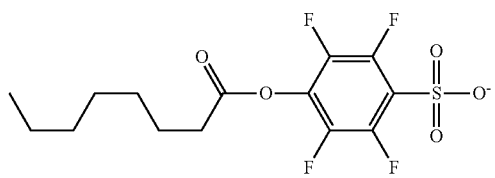 | 585 | 63100 |
| D-24 | 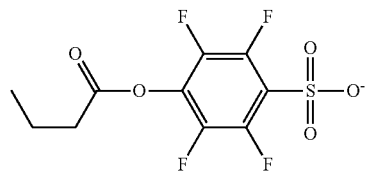 [SMILES: CCCC(=O)Oc1c(F)c(F)c(S(=O)(=O)[O-])c(F)c1F] | 583 | 55800 |
| D-25 | 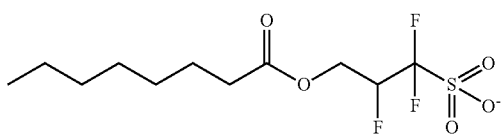 [SMILES: CCCCCCCC(=O)OCC(F)C(F)(F)S(=O)(=O)[O-]] | 584 | 67900 |

TABLE I-continued
| | | | |
|---|---|---|---|
| D-26 | 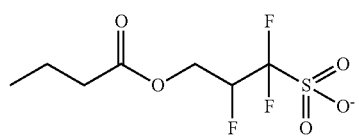 [SMILES: CCCC(=O)OCC(F)C(F)(F)S(=O)(=O)[O-]] | 583 | 56900 |
| D-27 | 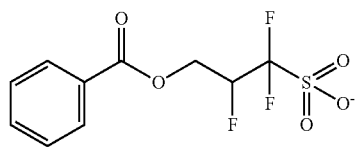 [SMILES: O=C(OCC(F)C(F)(F)S(=O)(=O)[O-])c1ccccc1] | 581 | 37800 |
| D-28 | 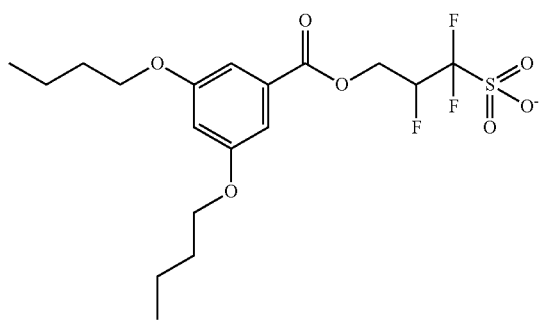 [SMILES: CCCCOc1cc(OCCCC)cc(C(=O)OCC(F)C(F)(F)S(=O)(=O)[O-])c1] | 583 | 40900 |
| D-29 | 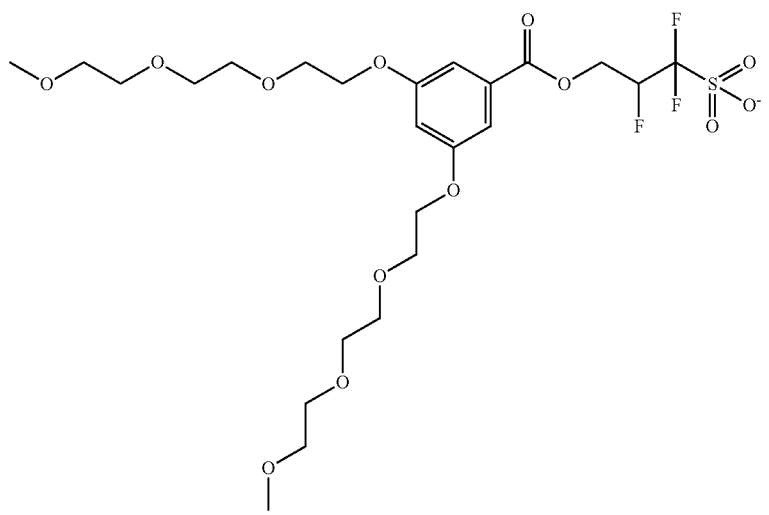 [SMILES: COCCOCCOCCOc1cc(OCCOCCOCCOC)cc(C(=O)OCC(F)C(F)(F)S(=O)(=O)[O-])c1] | 579 | 52600 |

Performance Results

EXAMPLE A-1

Preparation of DSC Device

FTO (tin oxide doped with fluorine) glass substrates (<12 ohms/sq, A11DU80, supplied by AGC Fabritech Co., Ltd.) were used as the base material, which were successively treated with glass cleaner, Semico Clean (Furuuchi Chemical Corporation), fully deionized water and acetone, in each case for 5 min in an ultrasonic bath, then baked for 10 minutes in isopropanol and dried in a nitrogen flow.

A spray pyrolysis method was used to produce the solid TiO2 buffer layer. Titanium oxide paste (PST-18NR, supplied by Catalysts & Chemicals Ind. Co., Ltd.) was applied onto the FTO glass substrate by screen printing method. After being dried for 5 minutes at 120° C., a working electrode layer having a thickness of 1.6 μm was obtained by applying heat treatment in air at 450° C. for 30 minutes and 500° C. for 30 minutes. Obtained working electrode is then treated with TiCl$_4$, as described by M. Grätzel et al., for example, in Grätzel M. et al., Adv. Mater. 2006, 18, 1202. After sintering the sample was cooled to 60 to 80° C. The sample was then treated with additive (E-1) shown below (EP 10167649.2).

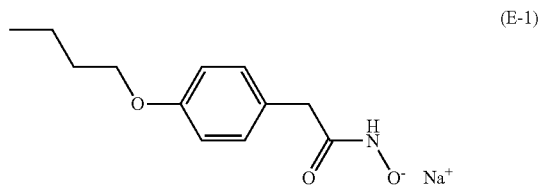 [SMILES: CCCCOc1ccc(CC(=O)N[O-])cc1 ; [Na+]]

(E-1)

5 mM of (E-1) in ethanol was prepared and the intermediate was immersed for 17 hours, washed in a bath of pure ethanol, briefly dried in a nitrogen stream and subsequently immersed in a 0.5 mM solution of dye (D-1) in a mixture solvent of acetonitrile+t-butyl alcohol (1:1) for 2 hours so as to adsorb the dye. After removal from the solution, the specimen was subsequently washed in acetonitrile and dried in a nitrogen flow.

A p-type semiconductor solution was spin-coated on next. To this end a 0.165M 2,2',7,7'-tetrakis(N,N-di-p-methoxy-phenyl-amine)-9,9'-spirobifluorene (spiro-MeOTAD) and 20 mM LiN(SO$_2$CF$_3$)$_2$ (Wako Pure Chemical Industries, Ltd.) solution in chlorobenzene was employed. 20 μll/cm$^2$ of this solution was applied onto the specimen and allowed to act for 60 s. The supernatant solution was then spun off for 30 s at 2000 revolutions per minute. The substrate was stored overnight under ambient conditions. Thus, the HTM was oxidized and for this reason the conductivity increased.

As the metal back electrode, Ag was evaporated by thermal metal evaporation in a vacuum at a rate of 0.5 nm/s in a pressure of 1×10$^{-5}$ mbar, so that an approximately 100 nm thick Ag layer was obtained.

In order to determine the photo-electric power conversion efficiency η of the above photoelectric conversion device, the respective current/voltage characteristic such as short-circuit current density J$_{sc}$, open-circuit voltage V$_{oc}$ and fill factor FF. was obtained with a Source Meter Model 2400 (Keithley Instruments Inc.) under the illumination of an artificial sunlight (AM 1.5, 100 mW/cm$^2$ intensity) generated by a solar simulator (Peccell Technologies, Inc).

EXAMPLES A-2 to A-4

DSC device was prepared and evaluated in the same manner as described in the example A-1 except that the compound (D-1) was replaced with a compound (D-2) to (D-4).

COMPARATIVE EXAMPLE A-5 to A-6

DSC device was prepared and evaluated in the same manner as described in the example A-1 except that the compound (D-1) was replaced with a compound (R-1) to (R-2) shown below. Compounds R-1 and R-2 are not according to the invention and serve as comparison compounds. Compounds R-1 and R-2 only differ in the counter anion from compounds according to the invention.

Table 1 shows the results.

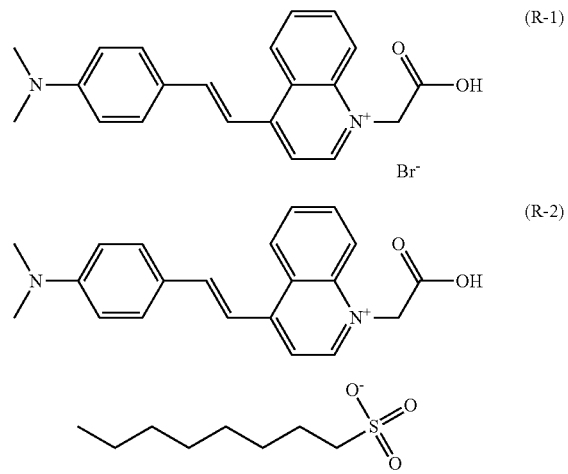

TABLE 1

Solid DSC performance

| Example | Compound | Jsc [mA/cm$^2$] | Voc [mV] | FF. [%] | η [%] |
|---|---|---|---|---|---|
| A-1 | D-1 | 7.1 | 741 | 65 | 3.4 |
| A-2 | D-2 | 8.6 | 655 | 55 | 3.1 |
| A-3 | D-3 | 7.2 | 691 | 57 | 2.9 |
| A-4 | D-4 | 8.4 | 683 | 49 | 2.8 |
| A-5 | R-1** | 7.6 | 587 | 60 | 2.7 |
| A-6 | R-2 | 6.2 | 586 | 51 | 1.8 |

**Included in the claim of CN1534021, but not example

As can be seen from table 1, compounds I with a fluorinated counter anion (A-1 to A-4) show higher Jsc and Voc, giving higher energy conversion efficiency than comparative compounds R-1 and R-2 with Br and C$_8$H$_{17}$SO$_3^-$ as counter anion for the same chromophore.

EXAMPLES A-7 to A-18

DSC device is prepared and evaluated in the same manner as described in the example A-1 except that the compound (D-1) is replaced with a compound (D-5) to (D-9) and (D-23) to (D-29).

COMPARATIVE EXAMPLE A-19

DSC device is prepared and evaluated in the same manner as described in the example A-1 except that the compound (D-1) is replaced with a compound (R-3) shown below. Compound R-3 only differs in the counter anion from compounds according to the invention. Table 2 shows the results.

TABLE 2

Solid DSC performance

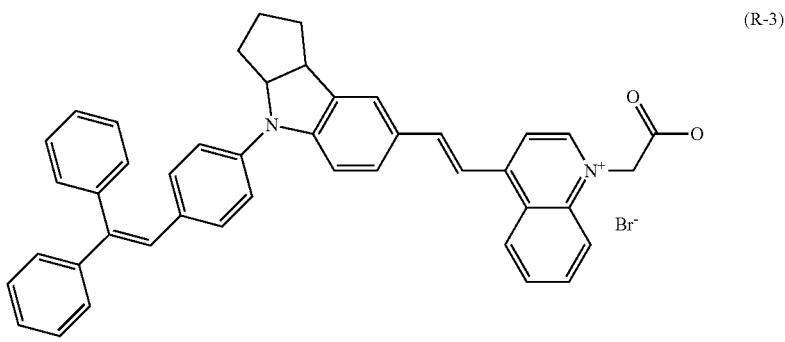
(R-3)

| Example | Compound | Jsc [mA/cm²] | Voc [mV] | FF. [%] | η [%] |
|---|---|---|---|---|---|
| A-7 | D-5 | 10.5 | 721 | 59 | 4.5 |
| A-8 | D-6 | 11.0 | 759 | 58 | 4.8 |
| A-9 | D-7 | 11.0 | 750 | 48 | 4.0 |
| A-10 | D-8 | 11.0 | 712 | 61 | 4.8 |
| A-11 | D-9 | 9.8 | 710 | 66 | 4.6 |
| A-12 | D-23 | 11.3 | 724 | 58 | 4.7 |
| A-13 | D-24 | 12.5 | 685 | 49 | 4.2 |
| A-14 | D-25 | 11.7 | 713 | 58 | 4.8 |
| A-15 | D-26 | 12.4 | 686 | 55 | 4.7 |
| A-16 | D-27 | 11.4 | 736 | 63 | 5.3 |
| A-17 | D-28 | 12.2 | 746 | 55 | 5.0 |
| A-18 | D-29 | 13.3 | 718 | 52 | 5.0 |
| A-19 | R-3 | 11.9 | 663 | 47 | 3.7 |

As can be seen from table 2, compounds I with fluorinated counter anions (A-7 to A-18) show higher Voc, giving higher energy conversion efficiency than the comparison compound R-3 with bromine as counter anion (A-19) for the same chromophore.

What is claimed:

1. An electrode layer comprising a porous film which comprises oxide semiconductor fine particles sensitized with a dye of formula (I),

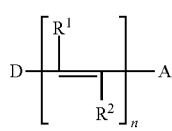
(I)

where n is 1, 2, 3, 4, 5 or 6;

$R^1$ and $R^2$ are independently of each other selected from the group consisting of hydrogen, $C_1$-$C_{20}$-alkyl wherein alkyl is uninterrupted or interrupted by O, S, CO, $NR^{14}$ or combinations thereof, $C_6$-$C_{20}$-aryl, heteroaryl and $C_6$-$C_{20}$-aryl which has 1, 2 or 3 substituents selected from $C_1$-$C_8$-alkyl, and $R^1$ can additionally be a radical of formula D;

D is independently selected from a radical of formulae D.1 and D.2

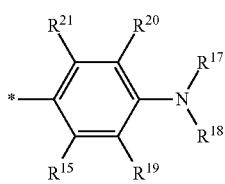
(D.1)

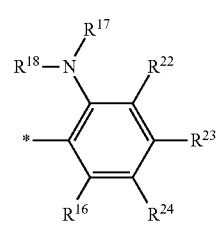
(D.2)

where

* denotes the bond to the remaining compound of formula I, $R^{17}$ and $R^{18}$ are independently of each other selected from unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof, where $R^{14}$ is hydrogen, $C_1$-$C_{20}$-alkyl or $C_6$-$C_{10}$-aryl;

or $R^{17}$ and $R^{18}$ form together with the nitrogen atom to which they are attached an unsubstituted or substituted 5-, 6- or 7-membered ring;

or $R^{17}$ and $R^{20}$ form together with the nitrogen atom to which $R^{17}$ is attached and the carbon atoms of the benzene ring to which $R^{20}$ and N—$R^{17}$ are attached an unsubstituted or substituted 5-, 6- or 7-membered ring;

or $R^{17}$ and $R^{22}$ form together with the nitrogen atom to which $R^{17}$ is attached and the carbon atoms of the benzene ring to which $R^{22}$ and N—$R^{17}$ are attached an unsubstituted or substituted 5-, 6- or 7-membered ring;

and/or $R^{18}$ and $R^{19}$ form with the nitrogen atom to which $R^{18}$ is attached and the carbon atoms of the benzene ring to which $R^{19}$ and N—$R^{18}$ are attached an unsubstituted or substituted 5-, 6- or 7-membered ring;

$R^{15}$, $R^{16}$, $R^{19}$, $R^{20}$, $R^{21}$, $R^{22}$, $R^{23}$ and $R^{24}$ are independently of each other selected from the group consisting of hydrogen, $NR^{25}R^{26}$, $OR^{25}$, $SR^{25}$, $NR^{25}$—$NR^{26}R^{27}$, $NR^{25}$—$OR^{26}$, O—CO—$R^{25}$, O—CO—$OR^{25}$, O—CO—$NR^{25}R^{26}$, $NR^{25}$—CO—$R^{26}$, $NR^{25}$—CO—$OR^{26}$, $NR^{25}$—CO—$NR^{26}R^{27}$, CO—$R^{25}$, CO—$OR^{25}$, CO—$NR^{25}R^{26}$, S—CO—$R^{25}$, CO—$SR^{25}$, CO—$NR^{25}$—$NR^{26}R^{27}$, CO—$NR^{25}$—$OR^{26}$, CO—O—CO—$R^{25}$, CO—O—CO—$OR^{25}$, CO—O—CO—$NR^{25}R^{26}$, CO—$NR^{25}$—CO—$R^{26}$, CO—$NR^{25}$—CO—$OR^{26}$, unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

$R^{25}$, $R^{26}$ and $R^{27}$ are independently of each other selected from hydrogen, unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

A is a radical of formulae A.1, A.2, A.3, A.4 or A.5

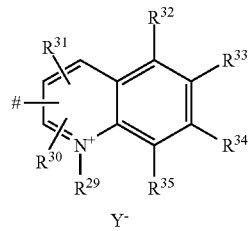

(A.1)

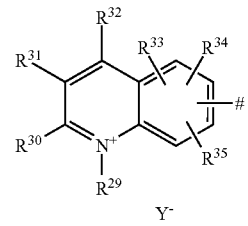

(A.2)

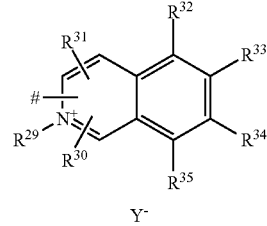

(A.3)

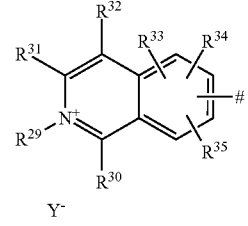

(A.4)

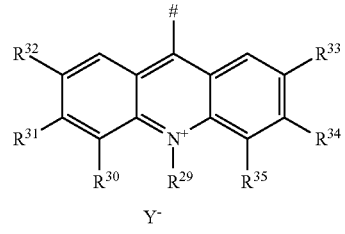

(A.5)

where

\# denotes the bond to the remaining compound of formula I $R^{29}$, $R^{30}$, $R^{31}$, $R^{32}$, $R^{33}$, $R^{34}$ and $R^{35}$ are independently of each other selected from the group consisting of a radical G, hydrogen, halogen, $OR^{36}$, unsubstituted or substituted unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_5$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

with the proviso that at least one of the radicals $R^{29}$, $R^{30}$, $R^{31}$, $R^{32}$, $R^{33}$, $R^{34}$ and $R^{35}$ is a radical G, where $R^{36}$ is unsubstituted or substituted $C_1$-$C_{20}$-alkyl, unsubstituted or substituted $C_6$-$C_{20}$-aryl, unsubstituted or substituted heteroaryl, wherein alkyl is uninterrupted or interrupted by O, S, CO, $NR^{14}$ or combinations thereof;

G is selected from the group consisting of —$R^{28}$—COOH, —$R^{28}$—COO$^-$$Z^+$, —$R^{28}$—CO(C=O)OH, —$R^{28}$—CO(C=O)O$^-$$Z^+$, —$R^{28}$—S(=O)$_2$OH, —$R^{28}$—S(=O)$_2$O$^-$$Z^+$, —$R^2$—O—S(=O)$_2$OH, —$R^{28}$—O—S(=O)$_2$O$^-$$Z^+$, —$R^{28}$—P(=O)(OH)$_2$, —$R^{28}$—P(=O)(O$^-$$Z^+$)$_2$, —$R^{28}$—P(=O)(OH)(O$^-$$Z^+$), —$R^{28}$—O—P(=O)(OH)$_2$, —$R^{28}$—O—P(=O)(O$^-$$Z^+$)$_2$, —$R^{28}$—O—P(=O)(OH)(O$^-$$Z^+$), —$R^{28}$—CO—NH—OH, —$R^{28}$—S(=O)$_2$NH—OH, —$R^{28}$—$NR^{14}$—S(=O)$_2$OH and —$R^{28}$—$NR^{14}$—S(=O)$_2$O$^-$$Z^+$;

where $R^{28}$ is a direct bond, $C_1$-$C_{20}$-alkylene, $C_2$-$C_4$-alkenylene or $C_6$-$C_{10}$-arylene;

$Z^+$ is an organic or inorganic cation equivalent;

$Y^-$ is a fluorinated organic anion selected from Y.1, Y.2, Y.3, Y.4, Y.5 and Y.6;

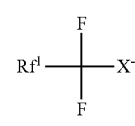
(Y.1)

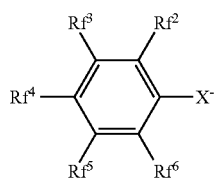
(Y.2)

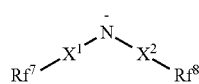
(Y.3)

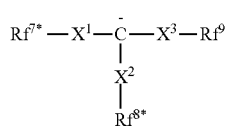
(Y.4)

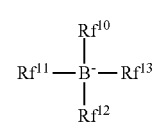
(Y.5)

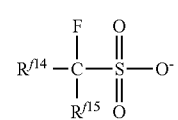
(Y.6)

wherein
$X^-$ is S(=O)$_2$O$^-$, O—S(=O)$_2$O$^-$, COO$^-$,

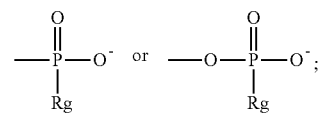

$Rf^1$ is selected from the group consisting of halogen, unsubstituted or substituted $C_1$-$C_{20}$-alkyl, unsubstituted or substituted haloalkyl, unsubstituted or substituted $C_2$-$C_{20}$-alkenyl, unsubstituted or substituted haloalkenyl, unsubstituted or substituted $C_2$-$C_{20}$-alkynyl, unsubstituted or substituted haloalkynyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_6$-$C_{20}$-aryl, unsubstituted or substituted heteroaryl, unsubstituted or substituted heterocyclyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, haloalkyl, alkenyl, haloalkenyl, alkynyl, haloalkynyl or the aliphatic moieties in aralkyl, aralkenyl or aralkynyl are uninterrupted or interrupted by O, S, CO, $NR^{14}$ or combinations thereof, $Rf^2$, $Rf^3$, $Rf^4$, $Rf^5$ and $Rf^6$ are independently selected from the group consisting of halogen, hydrogen, $NR^{25}R^{26}$, $OR^{25}$, $SR^{25}$, $NR^{25}$—$NR^{26}R^{27}$, $NR^{25}$—$OR^{26}$, O—CO—$R^{25}$, O—CO—$OR^{25}$, O—CO—$NR^{25}R^{26}$, $NR^{25}$—CO—$R^{26}$, $NR^{25}$—CO—$OR^{26}$, $NR^{25}$—CO—$NR^{26}R^{27}$, CO—$R^{25}$, CO—$OR^{25}$, CO—$NR^{25}R^{26}$, S—CO—$R^{25}$, CO—$SR^{25}$, CO—$NR^{25}$—$NR^{26}R^{27}$, CO—$NR^{25}$—$OR^{26}$, CO—O—CO—$R^{25}$, CO—O—CO—$OR^{25}$, CO—O—CO—$NR^{25}R^{26}$, CO—$NR^{25}$—CO—$R^{26}$, CO—$NR^{25}$—CO—$OR^{26}$, unsubstituted or substituted $C_1$-$C_{20}$-alkyl, unsubstituted or substituted $C_2$-$C_{20}$-alkenyl, unsubstituted or substituted $C_2$-$C_{20}$-alkynyl, unsubstituted or substituted $C_6$-$C_{20}$ aryl, unsubstituted or substituted heteroaryl, unsubstituted or substituted heterocyclyl, unsubstituted or substituted $C_7$-$C_{20}$-aralkyl, unsubstituted or substituted $C_8$-$C_{20}$-aralkenyl, unsubstituted or substituted $C_8$-$C_{20}$-aralkynyl, unsubstituted or substituted $C_4$-$C_{20}$-cycloalkyl, unsubstituted or substituted $C_5$-$C_{20}$-cycloalkenyl and unsubstituted or substituted $C_6$-$C_{20}$-cycloalkynyl, wherein alkyl, alkenyl, alkynyl or the aliphatic moieties in aralkyl, aralkenyl or aralkynyl are uninterrupted or interrupted by O, S, CO, $NR^{14}$ or combinations thereof;

with the proviso that at least one of the radicals $Rf^2$, $Rf^3$, $Rf^4$, $Rf^5$ and $Rf^6$ is fluorine or $C_1$-$C_{20}$-fluoroalkyl, wherein fluoroalkyl is uninterrupted or interrupted by O, S, $NR^{14}$, CO, or combinations thereof;

$X^1$, $X^2$ and $X^3$ are independently of each other selected from S(=O)$_2$ and CO;

$Rf^7$, $Rf^{7*}$, $Rf^8$, $Rr^{8*}$ and $Rf^9$ are independently of each other selected from the group consisting of unsubstituted or substituted $C_1$-$C_{20}$-fluoroalkyl, $C_6$-$C_{20}$-fluoroaryl, wherein fluoroalkyl is uninterrupted or interrupted by O, S, $NR^{14}$, CO, or combinations thereof; or $Rf^7$ and $Rf^8$ together are $C_3$-$C_6$-fluoroalkyl;

$Rf^{10}$, $Rf^{11}$, $Rf^{12}$ and $Rf^{13}$ are independently of each other selected from fluorine, $C_1$-$C_{20}$-fluoroalkyl and $C_6$-$C_{20}$-fluoroaryl;

$Rf^{14}$ and $Rf^{15}$ together are $C_3$-$C_7$-fluoroalkyl which is unsubstituted or substituted by $C_1$-$C_6$-fluoroalkyl;

Rg is unsubstituted or substituted $C_1$-$C_{20}$-alkyl, unsubstituted or substituted $C_1$-$C_{20}$-alkoxy, unsubstituted or substituted $C_6$-$C_{20}$-aryl or unsubstituted or substituted $C_6$-$C_{20}$aryl-O—, wherein alkyl and the alkyl moiety in alkoxy is uninterrupted or interrupted by O, S, $NR^{14}$, CO, or combinations thereof;

wherein $Y^-$ is not $BF4^-$, with the proviso that if $R^{17}$ and $R^{18}$ are both unsubstituted or substituted fluorene, $Y^-$ is not bistrifluoromethylsulfonimide, $C(SO_2CF_3)_3^-$, and with the proviso that if A is a radical of the formula A.1.1c

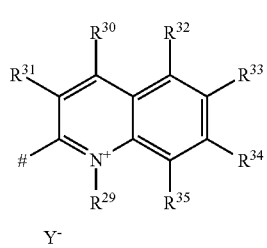

(A.1.1c)

$Y^-$ is not $(C_nF_{2n+1}SO_2)_2N^-$, where n is an integer from 1 to 18.

2. The electrode layer according to claim 1, wherein in the radical of the formulae D.1 and D.2, $R^{17}$ and $R^{18}$ are independently selected from the group consisting of $C_1$-$C_{20}$-alkyl, $C_2$-$C_{20}$-alkenyl, $C_2$-$C_{20}$-alkynyl, $C_6$-$C_{20}$-aryl, heteroaryl, heterocyclyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, and $C_6$-$C_{20}$-cycloalkynyl, wherein alkyl, alkenyl, alkynyl or the aliphatic moieties in aralkyl, aralkenyl or aralkynyl are uninterrupted or interrupted by O, S, $NR^{14}$ or combinations thereof and/or optionally has one or more substituents selected from the group consisting of $C_4$-$C_{20}$-cycloalkyl, $C_5$-$C_{20}$-cycloalkenyl, $C_6$-$C_{20}$-cycloalkynyl, heterocyclyl, halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$ and $S(=O)_2O^-Z^+$ and wherein aryl, the aryl moiety of aralkyl, aralkenyl, or aralkynyl, heteroaryl, heterocyclyl, cycloalkyl, cycloalkenyl or cycloalkynyl are unsubstituted or may carry one or more substituents selected from halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$, $S(=O)_2O^-Z^+$, $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, heterocyclyl, $C_6$-$C_{20}$-aryl, $C_6$-$C_{20}$-aryl which carries one or more substituents selected from $C_1$-$C_{20}$-alkyl and $OR^{25}$, maleic anhydridyl and maleimidyl, wherein the maleic anhydridyl and maleimidyl radicals are unsubstituted or optionally have substituents selectedfrom $C_1$-$C_{20}$-alkyl, $C_6$-$C_{20}$-aryl and phenyl-$NR^{25}R^{26}$;

or $R^{17}$ and $R^{18}$ may form together with the nitrogen atom to which they are attached a 5-, 6- or 7-membered, saturated or unsaturated heterocycle which may have 1 or 2 further heteroatoms selected from O, S and N as ring members and wherein the heterocycle is unsubstituted or optionally has one or more substituents $R^{x1}$, where each $R^{x1}$ is selected from $C_1$-$C_{20}$-alkyl which is unsubstituted or optionally has one or more substituents $R^{x2}$ and phenyl, which is unsubstituted or may carry one or more substituents $R^{x3}$, in addition two radicals $R^{x1}$ bonded to adjacent carbon atoms may form together with the carbon atoms to which they are bonded a 4-, 5-, 6- or 7-membered saturated or unsaturated carbocyclicring or an aromatic ring selected from benzene, naphthalene, anthracene and9H-fluorene, where the carbocyclic and the aromatic ring are unsubstituted or carry one or more substituents $R^{x3}$, and/or two radicals $R^{x1}$ present on the same carbon atom may be $C_1$-$C_{20}$-alkylidene which is unsubstituted or carry one or more substituents $R^{x2}$, where $R^{x2}$ is selected from the group consisting of halogen, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$ and $S(=O)_2O^-Z^+$, $R^{x3}$ is selected from the group consisting of $C_1$-$C_{10}$-alkyl, halogen, fluoren-9-ylidenemethyl, S—$R^{25}$, O—$R^{25}$, CO—$OR^{25}$, O—CO—$R^{25}$, $NR^{25}R^{26}$, $CONR^{25}R^{26}$, $NR^{25}$—CO—$R^{26}$, $S(=O)_2OR^{25}$ and $S(=O)_2O^-Z^+$;

or $R^{17}$ and $R^{22}$ may form together with the nitrogen atom to which $R^{17}$ is attached and the carbon atoms of the benzene ring to which $R^{20}$ and N—$R^{17}$ are attached an unsubstituted or substituted 5-, 6- or 7-membered ring which may have 1 or 2 further heteroatoms selected from O, S and N as ring members and wherein the heterocycle is unsubstituted or may carry one or more substituents $R^{x4}$;

or $R^{17}$ and $R^{22}$ may form together with the nitrogen atom to which $R^{17}$ is attached and the carbon atoms of the benzene ring to which $R^{22}$ and N—$R^{17}$ are attached an unsubstituted or substituted 5-, 6- or 7-membered ring, which may have 1 or 2 further heteroatoms selected from O, S and N as ring members and wherein the heterocycle is unsubstituted or may carry one or more substituents $R^{x4}$;

and/or $R^{18}$ and $R^{19}$ may form with the nitrogen atom to which $R^{18}$ is attached and the carbon atoms of the benzene ring to which $R^{19}$ and N—$R^{18}$ are attached an unsubstituted or substituted 5-, 6- or 7-membered ring which may have 1 or 2 further heteroatoms selected from O, S and N as ring members and wherein the heterocycle is unsubstituted or may carry one or more substituents $R^{x4}$;

where each $R^{x4}$ is selected from $C_1$-$C_{20}$-alkyl which is unsubstituted or may carry one or more substituents $R^{x5}$ and phenyl, which is unsubstituted or carry one or more substituents $R^{x6}$, in addition two radicals $R^{x4}$ bonded to adjacent carbon atoms may form together with the carbon atoms to which they are bonded a 4-, 5-, 6- or 7-membered saturated or unsaturated carbocyclic ring or an aromatic ring selected from benzene, naphthalene, anthracene and 9H-fluorene, where the carbocyclic or the aromatic ring are unsubstituted or may carry one or more substituents $R^{x6}$, and/or two radicals $R^{x4}$ present on the same C atom may be $C_1$-$C_{20}$-alkylidene which is unsubstituted or carry one or more substituents $R^{x5}$;

where each $R^{x5}$ has one of the meanings given for $R^{x2}$, and each $R^{x6}$ has one of the meaning given for $R^{x3}$ and where in addition, two radicals $R^{x6}$ bonded to adjacent carbon atoms may form together with the carbon atoms to which they are bonded a benzene or naphthalene ring;

$R^{15}$, $R^{16}$, $R^{19}$, $R^{20}$, $R^{21}$, $R^{22}$, $R^{23}$ and $R^{24}$ are independently selected from the group consisting of hydrogen, $NR^{25}R^{26}$, $OR^{25}$, $SR^{25}$, $NR^{25}$—$NR^{26}R^{27}$, $NR^{25}$—$OR^{26}$, O—CO—$R^{25}$, O—CO—$OR^{25}$, O—CO—$NR^{25}R^{26}$, $NR^{25}$—CO—$R^{26}$, $NR^{25}$—CO—$OR^{26}$, $NR^{25}$—CO—$NR^{26}R^{27}$, CO—$R^{25}$, CO—$OR^{25}$, CO—$NR^{25}R^{26}$, CO—$SR^{25}$, CO—$NR^{25}$—$NR^{26}R^{27}$, CO—$NR^{25}$—$OR^{26}$, CO—O—CO—$R^{25}$, CO—O—CO—$OR^{25}$, CO—O—CO—$NR^{25}R^{26}$, CO—$NR^{25}$—CO—$R^{26}$, CO—$NR^{25}$—CO—$OR^{26}$, $C_1$-$C_{20}$-alkyl, $C_2$-$C_{20}$-alkenyl, $C_2$-$C_{20}$-alkynyl, $C_6$-$C_{20}$-aryl, heteroaryl, heterocyclyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl and $C_6$-$C_{20}$cycloalkynyl, wherein alkyl is uninterrupted or interrupted by O, S, $NR^{14}$ or combinations thereof, and wherein alkyl, the alkyl moiety of aralkyl, alkenyl, the alkenyl moiety of aralkenyl, alkynyl and the alkynyl moiety of aralkynyl may carry substituents selected from the group consisting of $C_4$-$C_{20}$-cycloalkyl, halogen, S—$R^{14}$, O—$R^{14}$, CO—$OR^{14}$, O—CO—$R^{14}$, $NR^{14}R^{14'}$, $CONR^{14}R^{14'}$, $NR^{14}$—CO—$R^{14'}$, $S(=O)_2OR^{14}$ and $S(=O)_2O^-Z^+$, where aryl, the aryl moiety of aralkyl, aralkenyl and aralkynyl, heteroaryl, heterocyclyl, cycloalkyl, cycloalkenyl and cycloalkynyl may carry substituents selected from the group consisting of $C_1$-$C_{20}$-alkyl, $C_2$-$C_{20}$-alkenyl, $C_2$-$C_{20}$-alkynyl, $C_7$-$C_{20}$-aralkyl, $C_8$-$C_{20}$-aralkenyl, $C_8$-$C_{20}$-aralkynyl, $C_4$-$C_{20}$-cycloalkyl, $C_5$-$C_{20}$-cycloalkenyl, $C_6$-$C_{20}$-cycloalkynyl, halogen, S—$R^{14}$, O—$R^{14}$, CO—$OR^{14}$, O—CO—$R^{14}$, $NR^{14}R^{14'}$, $CONR^{14}R^{14'}$, $NR^{14}$—CO—$R^{14'}$, $S(=O)_2OR^{14}$ and $S(=O)_2O^-Z^+$, where $R^{14'}$ has one of the meanings given for $R^{14}$.

3. The electrode layer according to claim 2, where D is a radical of the formula D.1, where $R^{17}$ and $R^{18}$ are independently of each other selected from the group consisting of $C_1$-$C_8$-alkyl, $C_2$-$C_8$-alkenyl, $C_6$-$C_{20}$-aryl, heteroaryl, $C_7$-$C_{20}$-aralkyl, $C_8$-$C_{20}$-aralkenyl, $C_8$-$C_{10}$-aralkynyl and $C_5$-$C_{12}$-cycloalkyl, where alkyl or alkenyl may be unsubstituted or may carry 1, 2 or 3 substituents selected from the group consisting of tetrahydrofuranyl, halogen, S—$R^{14}$, O—$R^{14}$, CO—$OR^{14}$, O—CO—$R^{14}$, $NR^{14}R^{14'}$, $CONR^{14}R^{14'}$ and $NR^{14}$—CO—$R^{14'}$, where aryl, heteroaryl, the aryl moiety of aralkyl, aralkenyl and aralkynyl and cycloalkyl are unsubstituted or may carry substituents selected from $C_1$-$C_8$-alkyl, $C_2$-$C_8$-alkenyl and $C_8$-$C_{20}$-aralkenyl;

or $R^{17}$ and $R^{20}$ may form together with the nitrogen atom to which $R^{17}$ is attached and the carbon atoms of the benzene ring to which $R^{20}$ and N—$R^{17}$ are attached a 5-, 6- or 7-membered, saturated or unsaturated heterocycle which may have 1 further heteroatom selected from O, S and N as ring member and wherein the heterocycle may be unsubstituted or may carry one or more substituents $R^{x4}$ selected from $C_1$-$C_{20}$-alkyl and phenyl, in addition two radicals $R^{x4}$ bonded to adjacent carbon atoms may form together with the carbon atoms to which they are bonded a 4-, 5-, 6- or 7-membered saturated or unsaturated carbocyclic ring or an aromatic ring selected from benzene and 9H-fluorene where the carbocyclic and the aromatic ring are unsubstituted or carry one or more substituents selected from $C_1$-$C_6$-alkyl and fluoren-9-ylidenemethyl, and/or two radicals $R^{x4}$ present on the same carbon atom may be $C_1$-$C_{20}$-alkylidene;

$R^{15}$ is selected from hydrogen, $NR^{25}R^{26}$, $OR^{25}$, $SR^{25}$, O—CO—$R^{25}$ and $NR^{25}$—CO—$R^{26}$;

and $R^{19}$, $R^{20}$ and $R^{21}$ are hydrogen, wherein $R^{14'}$ has one of the meanings given for $R^{14}$.

4. The electrode layer according to claim 1, where D is a radical of the formula D.1, where $R^{17}$ and $R^{18}$ are independently of each other selected from the group consisting of $C_1$-$C_8$-alkyl, phenyl which is unsubstituted or carries 1 or 2 substituents selected from $C_1$-$C_6$-alkyl, $C_1$-$C_4$-alkoxy, 2-phenylvinyl, 2,2-diphenyl-vinyl and triphenylvinyl, 9H-fluoren-2-yl, which is unsubstituted or carries 1, 2 or 3 substituents selected from $C_1$-$C_6$-alkyl, pyrenyl, which is unsubstituted or carries 1 or 2 substituents selected from $C_1$-$C_6$-alkyl; or $R^{17}$ and $R^{18}$ together with the nitrogen atom to which they are attached are morpholinyl; or $R^{17}$ and $R^{20}$ form together with the nitrogen atom to which $R^{17}$ is attached and the carbon atoms of the benzene ring to which $R^{20}$ and N—$R^{17}$ are attached a 5- or 6-membered, nitrogen heterocycle which is unsubstituted or carries 2 radicals $R^x$, where two radicals $R^X$ on two adjacent carbon atoms form together with the carbon atoms they are bonded to a 4-, 5-, 6-, or 7-membered saturated ring or a benzene ring, $R^{15}$ is hydrogen, $C_1$-$C_{20}$-alkyl or $OR^{25}$; and $R^{19}$, $R^{20}$ and $R^{21}$ are hydrogen.

5. The electrode layer according to claim 4, where D is a radical of the formula D.1, where $R^{15}$, $R^{19}$, $R^{20}$ and $R^{21}$ are each hydrogen and $R^{17}$ and $R^{18}$ are independently of each other selected from the group consisting of $C_1$-$C_6$-alkyl, 9H-fluoren-2-yl and 9,9-di($C_1$-$C_8$-alkyl)-9H-fluoren-2-yl or D is a radical of the formula D.1 selected from radicals of the formulae D.1-1 and D.1-2

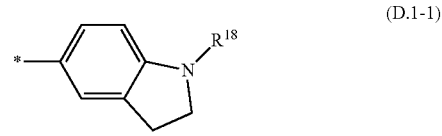

(D.1-1)

-continued

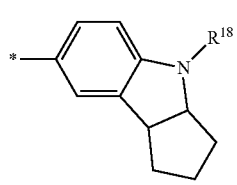
(D.1-2)

wherein
* denotes the point of attachment to the remainder of the molecule and
$R^{18}$ is phenyl which is substituted by 2-phenylvinyl or 2,2-diphenylvinyl, 9H-fluoren-2-yl or 9,9-di($C_1$-$C_8$-alkyl)-9H-fluoren-2-yl.

6. The electrode layer according to claim 1, where A is selected from the group of radicals consisting of the formulae A.1.1a, A.1.1b, A.2, A.3, A.4 and A.5

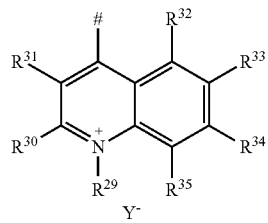
(A.1.1a)

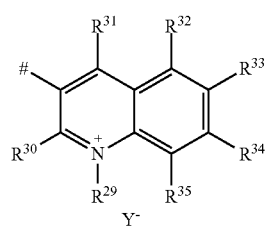
(A.1.1b)

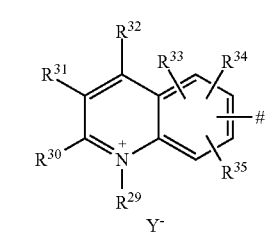
(A.2)

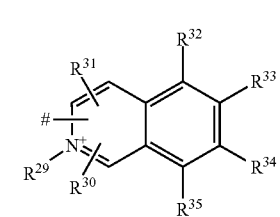
(A.3)

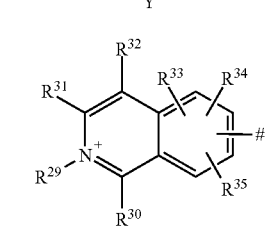
(A.4)

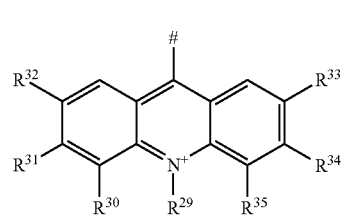
(A.5)

where
# denotes the bond to the remaining compound of formula I.

7. The electrode layer according to claim 1, where
A is selected from the group of radicals consisting of the formulae A.1.1a, A.1.1b, A.2, A.3 and A.4
where
$R^{29}$ is selected from the group consisting of a radical G, $C_1$-$C_{20}$-alkyl which is uninterrupted or interrupted by O, S, CO, $NR^{14}$ or combinations thereof, $C_6$-$C_{20}$-aryl, heteroaryl, $C_7$-$C_{20}$-aralkyl, $C_6$-$C_{20}$-aryl substituted by 1, 2 or 3 $C_1$-$C_8$-alkyl, and $C_7$-$C_{20}$-aralkyl wherein the aryl moiety of aralkyl is substituted by 1, 2 or 3 $C_1$-$C_8$-alkyl;
$R^{30}$ is selected from the group consisting of a radical G, hydrogen, $C_1$-$C_{20}$-alkyl wherein alkyl is uninterrupted or interrupted by O, S, CO, $NR^{14}$ or combinations thereof, $C_6$-$C_{20}$-aryl, heteroaryl, and $C_6$-$C_{20}$-aryl wherein the aryl moiety of aralkyl is substituted by 1, 2 or 3 $C_1$-$C_8$-alkyl;
$R^{31}$ is selected from hydrogen and a radical of the formula D*

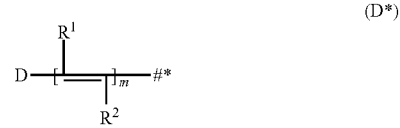
(D*)

where #* denotes the point of attachment to the remainder of the molecule, m is 1, 2, 3, 4, 5 or 6;
$R^{32}$, $R^{33}$, $R^{34}$ and $R^{35}$ are independently selected from the group consisting of hydrogen, $C_1$-$C_{20}$-alkyl wherein alkyl is uninterrupted or interrupted by O, S, $NR^{14}$ or combinations thereof, $C_6$-$C_{20}$-aryl, heteroaryl, and $C_6$-$C_{20}$-aryl wherein the aryl moiety of aralkyl is substituted by 1, 2 or 3 $C_1$-$C_8$-alkyl; and
G is selected from the group consisting of —$R^{28}$—COOH, —$R^{28}$—COO$^-$$Z^+$; —$R^{28}$—$SO_3H$, —$R^{28}$—$SO_3^-Z^+$; —$R^{28}$—OP(O)(O$^-$$Z^+$)$_2$, —$R^{28}$—OP(O)(OH)$_2$ and —$R^{28}$—OP(O)(OH)O$^-$$Z^+$, where $R^{28}$ is a direct bond, $C_1$-$C_{20}$-alkylene, $C_2$-$C_4$-alkenylene or $C_6$-$C_{10}$-arylene and $Z^+$ is $N(R^{14})_4^+$, or an alkali metal cation.

8. The electrode layer according to claim 7, wherein A is a radical of the formula A.1.1a,

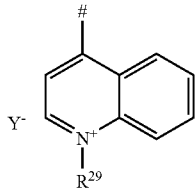
(A.1.1a)

where
R$^{29}$ is —R$^{28}$—COOH or —R$^{28}$—COO$^-$Z$^+$,
where R$^{28}$ is a direct bond, C$_1$-C$_4$-alkylene, C$_2$-C$_4$-alkenylene or phenylene;
and Z$^+$ is N(R$^{14}$)$_4{}^+$, Li$^+$, Na$^+$ or K$^+$; R$^{14}$ is hydrogen or C$_1$-C$_{20}$-alkyl.

9. The electrode layer according to claim 7, where Y$^-$ is a fluorinated organic anion selected from the group consisting of Y.1, Y.2, Y.3, Y.4, Y.5 and Y.6,
where
X$^-$ is S(=O)$_2$O$^-$, O—S(=O)$_2$O$^-$, or COO$^-$;
Rf$^1$ is fluorine, C$_1$-C$_{20}$-alkyl, C$_1$-C$_{20}$-haloalkyl, where the C$_1$-C$_{20}$-alky and C$_1$-C$_{20}$-haloalkyl are uninterrupted or interrupted by O, S, NR$^{14}$, CO or combinations thereof and/or are unsubstituted or substituted by one or more radicals selected from the group consisting of halogen, OR$^{25}$, O—CO—R$^{25}$, O—CO—OR$^{25}$, O—CO—NR$^{25}$R$^{26}$, CO—OR$^{25}$ and CO—NR$^{25}$R$^{26}$,
Rf$^2$, Rf$^3$, Rf$^4$, Rf$^5$ and Rf$^6$ are independently selected from the group consisting of fluorine, hydrogen, OR$^{25}$, O—CO—R$^{25}$, O—CO—OR$^{25}$, O—CO—NR$^{25}$R$^{26}$, C$_1$-C$_{20}$-fluoroalkyl;
X$^1$, X$^2$ and X$^3$ are independently selected from S(=O)$_2$ and CO;
Rf$^7$, Rf$^{7*}$, Rf$^8$, Rf$^{8*}$ and Rf$^9$ are independently selected from the group consisting of C$_6$-C$_{20}$-fluoroaryl, C$_1$-C$_{20}$-fluoroalkyl and C$_1$-C$_{20}$-fluoroalkyl which is interrupted by O, S, NR$^{14}$, CO or combinations thereof, wherein C$_1$-C$_{20}$-fluoroalkyl and interrupted C$_1$-C$_{20}$-fluoroalkyl are unsubstituted or substituted by one or more radicals selected from OR$^{25}$, O—CO—R$^{25}$, O—CO—OR$^{25}$, O—CO—NR$^{25}$R$^{26}$, CO—OR$^{25}$ and CO—NR$^{25}$R$^{26}$, or Rf$^7$ and Rf$^8$ together are C$_3$-C$_6$-fluoroalkyl,
Rf$^{10}$, Rf$^{11}$, Rf$^{12}$ and Rf$^{13}$ are independently selected from fluorine, C$_1$-C$_{20}$-fluoroalkyl and C$_6$-C$_{20}$-fluoroaryl,
R$^{\prime 14}$ and R$^{\prime 15}$ are together C$_3$-C$_5$-perfluoroalkyl where the fluorine atoms of the last mentioned group may be replaced by C$_1$-C$_{10}$-fluoroalkyl.

10. The electrode layer according to claim 9, where Y$^{31}$ is selected from the group consisting of a radical Y.1a, Y.1b, Y.2a, Y.3a, Y.4a, Y.5a and Y.6a

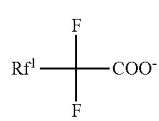
(Y.1a)

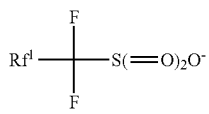
(Y.1b)

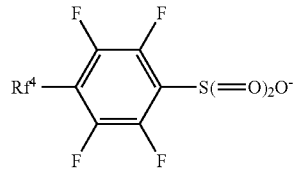
(Y.2a)

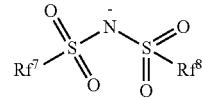
(Y.3a)

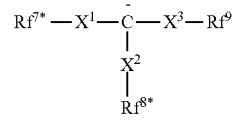
(Y.4a)

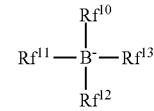
(Y.5a)

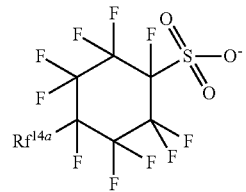
(Y.6a)

where
Rf$^1$ is fluorine, C$_1$-C$_{10}$-fluoroalkyl or C$_1$-C$_{10}$-fluoroalkyl which is substituted by OC(=O)—R$^{25}$, where
R$^{25}$ is C$_1$-C$_{20}$-alkyl, phenyl which is unsubstituted or substituted by one or more C$_1$-C$_{20}$-alkoxy, where the alkyl moiety of alkoxy is interrupted by one or more oxygen atoms, or 6-, 7-, 8- or 9-membered saturated heterocyclyl with 1 or 2 heteroatoms or heteroatom groups selected from N, O, C(O), S, SO and SO$_2$, as ring members, where heterocyclyl is unsubstituted or maycarry 1, 2, 3 , 4, 5 or 6 C$_1$-C$_4$-alkyl groups;
Rf$^4$ is OC(O)—C$_1$-C$_{10}$-alkyl;
Rf$^7$ and Rf$^8$ are independently of each other selected from C$_1$-C$_6$-fluroroalkyl or R$^{\prime 7}$ and R$^{\prime 8}$ taken together are C$_3$-C$_6$-fluoroalkyl,
X$^1$, X$^2$ and X$^3$ are each SO$_2$,
Rf$^{7*}$, Rf$^{8*}$, and R$^{f9}$ are independently of each other selected from C$_1$-C$_6$-fluoroalkyl;
Rf$^{10}$, Rf$^{11}$, Rf$^{12}$ and Rf$^{13}$ are each pentafluorophenyl; and
Rf$^{14a}$ is C$_1$-C$_6$-fluoroalkyl.

11. The electrode layer according to claim 10, where A is a radical of the formula A.1a, where R$^{29}$ is CH$_2$COOH, and Y$^-$ is selected from the group consisting of B(C$_6$F$_5$)$_4{}^-$, Y.1a, Y.1b, Y.2a, Y.3a, Y.4a and Y.6a.

12. The electrode layer according to claim 1, where R$^1$ and R$^2$ are independently selected from the group consisting of hydrogen, C$_1$-C$_{20}$-alkyl which is uninterrupted or interrupted by O, S, CO, NR$^{14}$ or combinations thereof, C$_6$-C$_{20}$-aryl, heteroaryl, and C$_6$-C$_{20}$-aryl which is substituted by 1, 2 or 3 C$_1$-C$_8$-alkyl;
and R$^1$ may also be a radical of the formula D.

13. The electrode layer according to claim 11, where
R² is hydrogen, $C_1$-$C_{20}$-alkyl or $C_6$-$C_{20}$-aryl; and
R¹ is hydrogen, $C_1$-$C_{20}$-alkyl, $C_6$-$C_{20}$-aryl or a radical of the formula D.

14. The electrode layer according to claim 1, wherein R¹ and R² are hydrogen.

15. The electrode layer according to claim 1, wherein n is 1 or 2.

16. The electrode layer according to claim 1, wherein
n is 1;
R¹ and R² are independently of each other selected from hydrogen or $C_1$-$C_{10}$-alkyl;
D is a radical of the formula D.1, where
  $R^{15}$ is hydrogen or $C_1$-$C_{20}$-alkoxy;
  $R^{19}$, $R^{20}$ and $R^{21}$ are each hydrogen,
  $R^{17}$ and $R^{18}$ together with the nitrogen atom to which they are attached are morpholinyl, thiomorpholinyl, piperidinyl, piperazinyl, pyrrolidinyl, pyrrazolidinyl or imidazolidinyl, or
  $R^{17}$ and $R^{18}$ are independently of each other selected from the group consisting of $C_1$-$C_6$-alkyl, 9H-fluoren-2-yl, 9,9-di($C_1$-$C_8$-alkyl)-9H-fluoren-2-yl, pyrenyl, pyrenyl which is substituted by $C_1$-$C_6$-alkyl, and phenyl which is substituted by 2-phenylvinyl, 2,2-diphenylvinyl or triphenylvinyl or
D is a radical of the formulae D.1-1 or D.1-2

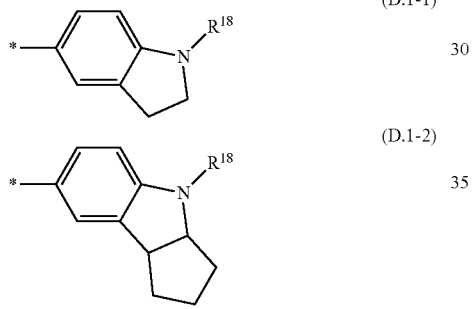

(D.1-1)

(D.1-2)

wherein
* denotes the point of attachment to the remainder of the molecule and
$R^{18}$ is phenyl which is substituted by 2-phenylvinyl, 2,2-diphenylvinyl, 9H-fluoren-2-yl or 9,9-di($C_1$-$C_8$-alkyl)-9H-fluoren-2-yl;
A is a radical of the formula A.1.1a,

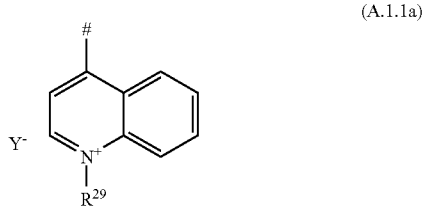

(A.1.1a)

where
$R^{29}$ is —$R^{28}$—COOH or —$R^{28}$—COO⁻Z⁺,
  where $R^{28}$ is a direct bond, $C_1$-$C_4$-alkylene, $C_2$-$C_4$-alkenylene or phenylene;
and
$Z^+$ is $N(R^{14})_4^+$, Li⁺, Na⁺ or K⁺; where $R^{14}$ is hydrogen or $C_1$-$C_{20}$-alkyl; and
Y⁻ is selected from the group consisting of $B(C_6F_5)_4^-$, $[(C_1$-$C_4$-perfluoroalkyl)SO_2]_2N^-$, $[(C_1$-$C_4$-perfluoroalkyl)SO_2]_3C^-$, $C_1$-$C_8$-perfluoroalkyl-$SO_3^-$

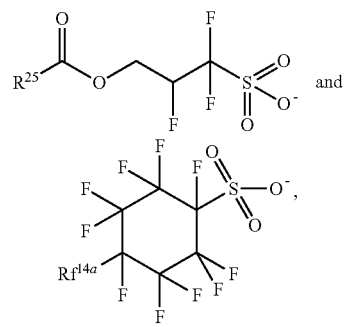

and where $R^{25}$ is $C_1$-$C_{20}$-alkyl, phenyl which is unsubstituted or substituted by $C_1$-$C_{20}$-alkoxy, or 6-, 7-, 8- or 9-membered saturated heterocyclyl containing 1 or 2 heteroatoms or heteroatom groups selected from O, C(O), as ring members, where heterocyclyl is unsubstituted or may carry 1, 2, 3, 4, 5 or 6 $C_1$-$C_4$-alkyl groups, where $C_1$-$C_{20}$-alkoxy may be interrupted by one or more oxygen atoms, and $Rf^{14a}$ is $C_1$-$C_3$-perfluoroalkyl.

17. The electrode layer according to claim 1, wherein the oxide semiconductor fine particles comprise $TiO_2$, $SnO_2$, $WO_3$, ZnO, $Nb_2O_5$, $Fe_2O_3$, $ZrO_2$, MgO, $WO_3$, ZnO, CdS, ZnS, PbS, $Bi_2S_3$, CdSe, CdTe or combinations thereof.

18. The electrode layer according to claim 1, wherein the porous film which comprises oxide semiconductor fine particles is sensitized with a dye of formula (I) and one or more further dyes.

19. The electrode layer according to claim 18, wherein the further dye is a metal complex dye and/or an organic dye selected from the group consisting of indoline, courmarin, cyanine, merocyanine, hemicyanine, methin, azo, quinone, quinonimine, diketo-pyrrolo-pyrrole, quinacridone, squaraine, triphenylmethane,perylene, indigo, xanthene, eosin, rhodamine and combinations thereof.

20. The electrode layer according to claim 1, wherein the dye is adsorbed together with an additive.

21. The electrode layer according to claim 20, wherein the additive is an adsorbent, a steroid, a crown ether, a cyclodextrine,a calixarene, a polyethyleneoxide, a hydroxamic acid, a hydroxamic acid derivative or combinations thereof.

22. A photoelectric conversion device comprising the electrode layer as defined in claim 1.

23. A dye sensitized solar cell comprising a photoelectric conversion device as defined in claim 22.

* * * * *